United States Patent
Kojima et al.

(10) Patent No.: US 6,858,278 B2
(45) Date of Patent: *Feb. 22, 2005

(54) INFORMATION RECORDING MEDIUM AND METHOD FOR PRODUCING THE SAME

(75) Inventors: Rie Kojima, Kadoma (JP); Takashi Nishihara, Hirakata (JP); Haruhiko Habuta, Osaka (JP); Noboru Yamada, Hirakata (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/400,432

(22) Filed: Mar. 28, 2003

(65) Prior Publication Data

US 2004/0023069 A1 Feb. 5, 2004

Related U.S. Application Data

(63) Continuation-in-part of application No. 10/320,603, filed on Dec. 17, 2002, now abandoned.

(30) Foreign Application Priority Data

| Dec. 18, 2001 | (JP) | 2001-384306 |
| Feb. 22, 2002 | (JP) | 2002-045661 |
| Mar. 1, 2002 | (JP) | 2002-055872 |
| Dec. 2, 2002 | (JP) | 2002-350034 |
| Jan. 10, 2003 | (JP) | 2003-004053 |

(51) Int. Cl.$^7$ ................................. B32B 3/02

(52) U.S. Cl. .................... 428/64.1; 428/64.4; 428/64.5; 428/64.6; 430/270.13

(58) Field of Search .................. 428/64.1, 64.4, 428/64.5, 64.6, 913; 430/270.13, 495.1, 945

(56) References Cited

U.S. PATENT DOCUMENTS

| 4,763,139 A | 8/1988 | Itoh et al. ............... 346/135.1 |
| 4,916,048 A | 4/1990 | Yamada et al. ............ 430/523 |
| 2003/0138669 A1 * | 7/2003 | Kojima et al. ......... 428/694 ST |
| 2003/0180473 A1 * | 9/2003 | Nishihara et al. ........... 427/457 |

FOREIGN PATENT DOCUMENTS

| EP | 0 825 595 | 2/1998 |
| JP | 5-109115 | 4/1993 |
| JP | 5-159373 | 6/1993 |
| JP | 7-25209 | 3/1995 |
| JP | 8-77604 | 3/1996 |
| JP | 10-275360 | 10/1998 |
| JP | 2001-67722 | 3/2001 |
| JP | 2001-322357 | 11/2001 |
| WO | 97/34298 | 9/1997 |

OTHER PUBLICATIONS

Database WPI, Section Ch, Week 199112, Derwent Publications Ltd., London, GB; AN 1991–083936 XP002235835 & JP 03 030133 A, Feb. 8, 1991, *abstract*.

(List continued on next page.)

*Primary Examiner*—Elizabeth Mulvaney
(74) *Attorney, Agent, or Firm*—Wenderoth, Lind & Ponack, L.L.P.

(57) ABSTRACT

An information recording medium which ensures high reliability and favorable overwrite cycle-ability is provided, even when an interface layer is not provided between a recording layer and a dielectric layer. The recording layer 4 and the dielectric layers 2 and 6 are formed on the surface of the substrate 1. In the recording layer 4, a phase change is generated between a crystal phase and an amorphous phase by irradiation of light or application of an electric energy. The dielectric layers 2 and 6 are Zr/Hf—Cr—O-based material layers comprising at least one of Zr and Hf, Cr and O, preferably consisting essentially of material expressed, for example, with the formula $(MO_2)_N(Cr_2O_3)_{100-N}$ (mol %) wherein M is either or both of Zr and Hf, and $20 \leq N \leq 80$.

28 Claims, 10 Drawing Sheets

OTHER PUBLICATIONS

Database WPI, Section Ch, Week 1198745, Derwent Publications Ltd., London, GB; AN 1987–316032 XP002235836 & JP 62 222454 A, Sep. 30, 1987, *abstract*.

N. Yamada et al., "Phase–Change Optical Disk Having a Nitride Interface Layer", Jpn. J. Appl. Phys, vol. 37, pp. 2104–2110, Apr. 1998.

E. Ohno et al., "Disk Technologies for 4.7 GB DVD–Ram,", Matsushita Technical Journal, vol. 45, No. 6, pp. 60–66, Dec. 1999.

H. Kitaura et al., Designing and Properties of 4.7GB DVD–Ram Media, Proceedings of PCOS, pp. 89–94, Nov. 1999.

H. Kubota, "Wave Optics", pp. 199–236, (Iwanami Shoten, 1971).

Database WPI, Section Ch, Week 198745, Derwent Publications Ltd., London GB; AN 1987–316032 XP002235836 & JP 62 222454 A, Sep. 30, 1987, *abstract*.

* cited by examiner

INFORMATION RECORDING MEDIUM AND METHOD FOR PRODUCING THE SAME

CROSS-REFERENCE TO RELATED APPLICATIONS

This is a continuation-in-part of application Ser. No. 10/320,603, filed on Dec. 17, 2002, now abandoned, entitled "Information recording medium and method for producing the same".

The present application claims a priority under 35 U.S.C. §119 to Japanese Patent Applications No. 2001-384306 filed on Dec. 18, 2001, entitled "Information recording medium and method for producing the same", No. 2002-45661 filed on Feb. 22, 2002, entitled "Information recording medium and method for producing the same", No. 2002-55872 filed on Mar. 1, 2002, entitled "Information recording medium and method for producing the same", No. 2002-350034 filed on Dec. 2, 2002 entitled "Information recording medium and method for producing the same", and No. 2003-4053 filed on Jan. 10, 2003 entitled "Information recording medium and method for producing the same." The contents of those applications are incorporated herein by the reference thereto in their entirety.

BACKGROUND OF THE INVENTION

1. Field of the Invention

This invention relates to an information recording medium which is used for optically or electrically recording, erasing, overwriting and reproducing information, and a method for producing the same.

2. Description of Related Art

The inventors developed 4.7 GB DVD-RAM which is a large capacity rewritable phase-change type information recording medium and can be used as a datafile and an image file. This has been already commercialized.

This 4.7 GB DVD-RAM is disclosed, for example, in Japanese Patent Kokai (Laid-Open) Publication No. 2001-322357. The constitution of DVD-RAM disclosed in this publication is shown in FIG. 10. The information recording medium 31 shown in FIG. 10 has a seven-layer structure where a first dielectric layer 102, a first interface layer 103, a recording layer 4, a second interface layer 105, a second dielectric layer 106, an optical compensation layer 7, and a reflective layer 8 are formed on one surface of a substrate 1 in this order. In this information recording medium, the first dielectric layer exists in a position closer to an incident laser beam than the second dielectric layer. The same relationship exists between the first interface layer and the second interface layer. Thus, in this specification, when the information recording medium contains two or more layers having the same function, "first" "second" "third" . . . is given to the beginning of the name of each layer in the order of the layer which is closer to the incident laser beam.

The first dielectric layer 102 and the second dielectric layer 106 have the function which adjusts an optical path length so as to enhance the optical absorption efficiency of the recording layer 4, and enlarges the difference between the reflectance of crystal phase and the reflectance of amorphous phase so as to enlarge a signal amplitude. ZnS-20 mol % $SiO_2$ (i.e. $(SiO_2)_{80}(ZnS)_{20}$) conventionally used as a material for the dielectric layer is amorphous material. It has low thermal conductivity, is transparent, and has a high refractive index. Moreover, ZnS-20 mol % $SiO_2$ exhibits a high film-forming speed at the time of the film formation, and good mechanical characteristic and moisture resistance. Thus, ZnS-20 mol % $SiO_2$ is an excellent material suitable for forming the dielectric layer.

If the thermal conductivity of the first dielectric layer 102 and the second dielectric layer 106 is low, the heat can diffuse from the recording layer 4 to the reflective layer 8 quickly in the thickness direction when a laser beam enters the recording layer 4, and therefore, the heat is difficult to diffuse in the in-plane direction in the dielectric layers 102 or 106. That is, the recording layer 4 is cooled by the dielectric layer for a shorter time, and therefore, an amorphous mark (record mark) can be easily formed. When a record mark is hard to form, a high peak power is necessary for recording. When a record mark is easy to form, recording can be conducted with a low peak power. When the thermal conductivity of the dielectric layer is low, recording can be conducted with a low peak power, and therefore, the recording sensitivity of the information recording medium becomes higher. On the other hand, when the thermal conductivity of the dielectric layer is high, recording is conducted with a high peak power, and therefore the recording sensitivity of the information recording medium becomes lower. The dielectric layer in the information recording medium exists in a form of such thin film that thermal conductivity cannot be measured accurately. For this reason, the inventors employ the recording sensitivity of the information recording medium as a relative judgment reference for learning the degree of the thermal conductivity of the dielectric layer.

The recording layer 4 is formed using a material containing Ge—Sn—Sb—Te which crystallizes at a high speed. The information recording medium which contains such material as the recording layer 4, not only has excellent initial recording characteristic, but also has excellent archival characteristic and an excellent archival overwrite characteristic. In a phase-change type information recording medium, information is recorded, erased and overwritten by utilizing reversible phase change between crystal phase and amorphous phase of the recording layer 4. When the recording layer 4 is irradiated with a high power (i.e. peak power) laser beam, and then cooled rapidly, the irradiated part turns into an amorphous phase and a record mark is formed. When the recording layer is irradiated with a low power (i.e. bias power) laser beam to raise its temperature and then cooled gradually, the irradiated part turns into a crystal phase and recorded information is erased. By irradiating the recording layer with the laser beam of which power is modulated between the peak power level and the bias power level, it is possible to overwrite new information while erasing information already recorded. Overwrite cycle-ability is expressed with the maximum number which corresponds to repeatable overwrite number on the condition that the jitter value does not cause a problem in a practical use. It can be said that the better overwrite cycle-ability is, the larger this number is. Particularly, an information recording medium for datafiles is expected to have excellent overwrite cycle-ability.

The first interface layer 103 and the second interface layer 105 have the function which prevents a material transfer caused between the first dielectric layer 102 and the recording layer 4, and between the second dielectric layer 106 and the recording layer 4, respectively. The material transfer here means the phenomenon that S of ZnS-20 mol % $SiO_2$ contained in the first and second dielectric layers diffuses into the recording layer while the recording layer is irradiated with a laser beam and information is repeatedly overwritten. If a lot of S diffuses into the recording layer, a reduction of the reflectance of the recording layer is caused, and overwrite cycle-ability deteriorates. This phenomenon has already been known (See N. Yamada et al. Japanese Journal of Applied Physics Vol.37 (1998) pp.2104–2110). Moreover, Japanese Patent Kokai (Laid-Open) Publication No. 10-275360 and International Publication No. WO 97/34298 disclose that the interface layer which prevents this phenomenon is formed using a nitride containing Ge.

The optical compensation layer 107 adjusts the ratio Ac/Aa where Ac is optical absorptance of the recording layer 4 in a crystalline state, and Aa is optical absorptance Aa of the recording layer 4 in an amorphous state, and serves to suppress distortion of overwritten marks. The reflective layer 8 optically serves to increase the light quantity absorbed by the recording layer 4, and thermally serves to diffuse the heat generated in the recording layer 4 to cool the recording layer quickly and to facilitate amorphization of the recording layer. The reflective layer 8 also serves to protect a multilayered film from the operation environment.

Thus, the information recording medium shown in FIG. 10 ensures excellent overwrite cycle-ability and high reliability with a large capacity of 4.7 GB by using the structure including the seven layers each of which functions as mentioned above, and thereby has been commercialized.

As material suitable for the dielectric layer of the information recording medium, various materials have already been proposed. For example, in Japanese Patent Kokai (Laid-Open) Publication No. 5-109115, it is disclosed that a heat-resistance protective layer is formed from a mixture of a high melting point element with a melting point above 1600K and low alkali glass in an optical information recording medium. In this publication, Nb, Mo, Ta, Ti, Cr, Zr, and Si are mentioned as the element with a high melting point. Further, in this publication, it is disclosed that the low alkali glass essentially consists Of $SiO_2$, BaO, $B_2O_3$, or $Al_2O_3$.

In Japanese Patent Kokai (Laid-Open) Publication No. 5-159373, it is disclosed that the heat-resistance protective layer is formed from a mixture of at least one compound selected from nitride, carbide, oxide and sulfide with a melting point higher than that of Si, and low alkali glass in an optical information recording medium. In this publication, the carbide, oxide, and sulfide of Nb, Zr, Mo, Ta, Ti, Cr, Si, Zn, and Al, are illustrated as the high melting point compound. Moreover, in the publication, it is disclosed that the low alkali glass essentially consists of $SiO_2$, BaO, $B_2O_3$, and $Al_2O_3$.

In Japanese Patent Kokai (Laid-Open) Publication No. 8-77604, it is disclosed that a dielectric layer of a read-only information recording medium is formed from the oxide of at least one element selected from the group which consists of Ce, La, Si, In, Al, Ge, Pb, Sn, Bi, Te, Ta, Sc, Y, Ti, Zr, V, Nb, Cr, and W, the sulfide of at least one element selected from the group which consists of Cd, Zn, Ga, In, Sb, Ge, Sn, Pb, and Bi, or selenide and so on.

In Japanese Patent Kokai (Laid-Open) Publication No. 2001-67722, it is disclosed that the first interface control layer and the second interface control layer of an optical recording medium are selected from the nitride, oxide, carbide, and sulfide which contain at least one element selected from the element group consisting of Al, Si, Ti, Co, Ni, Ga, Ge, Sb, Te, In, Au, Ag, Zr, Bi, Pt, Pd, Cd, P, Ca, Sr, Cr, Y, Se, La, and Li.

SUMMARY OF THE INVENTION

As mentioned above, when forming the first and the second dielectric layers by using ZnS-20 mol % $SiO_2$, the interface layer is inevitably needed between the recording layer and the dielectric layer for preventing the diffusion of S. However, when considering price of the medium, it is desirable that the number of the layers which compose the medium is as small as possible. If the number of layers is small, reduction of the cost of materials, miniaturization of manufacturing apparatus, and the increase in the throughput due to reduction in manufacture time can be realized, which results in the reduction of the price of the medium.

The inventors examined a possibility of eliminating at least one of the first interface layer and second interface layer as one method of reducing the number of layers. The inventors considered that in this case, a dielectric layer needs to be made from material other than ZnS-20 mol % $SiO_2$ so that the diffusion of S from the dielectric layer into the recording layer due to overwriting may not be caused. Further, the followings are desired as to the material for the dielectric layer:

The adhesiveness of the material to the recording layer which is of chalcogenide material is good;

The material realizes recording sensitivity which is equivalent to or higher than that of the above seven-layer structure;

The material is transparent; and

The material has a high melting point so that it may not melt when recording.

It is an object of the present invention to provide an information recording medium which is provided with a dielectric layer having favorable adhesiveness to a recording layer, in which medium a substance does not transfer from the dielectric layer to the recording layer even when the dielectric layer is formed in direct contact with the recording layer without forming the interface layer, and excellent overwrite cycle-ability is ensured.

The above-mentioned publications do not refer to the problem that a substance transfers from the dielectric layer to the recording layer. Therefore, it should be noted that these publications do not teach the problem which this invention solves, and means to solve the problem, i.e. a specific composition of the material for the dielectric layer.

The inventors formed the dielectric layer by using various compounds and evaluated the adhesiveness of the dielectric layer to the recording layer and overwrite cycle-ability of the information recording medium, as explained in the below-mentioned Example. As a result, it was found that, when providing a dielectric on both sides of the recording layer directly, without an interface layer, the adhesiveness of the dielectric layer to the recording layer is good in the case where the dielectric layer is formed from a material which is easy to diffuse in the recording layer, for example, the conventional ZnS-20 mol % $SiO_2$, although, overwrite cycle-ability of the medium is inferior. Moreover, for example, each of $ZrO_2$ and $HfO_2$ has low thermal conductivity and a high melting point. Therefore, if $ZrO_2$ or $HfO_2$ is used for a dielectric layer, the recording sensitivity of the information recording medium can be high and excellent overwrite cycle-ability can be ensured. However, when forming a dielectric layer using $ZrO_2$ or $HfO_2$, the result was that the adhesiveness of the dielectric layer to the recording layer is inferior. With respect to the information recording medium in which the dielectric layer is formed in contact with the recording layer using other various oxides, nitrides, sulfides and selenides, the adhesiveness of the dielectric layer to the recording layer and overwrite cycle-ability were evaluated. However, when forming the dielectric layer using one kind of oxide, nitride, sulfide or selenide, favorable adhesiveness and favorable overwrite cycle-ability could not be obtained together.

The inventors examined forming a dielectric layer with a combination of two or more kinds of compounds not containing S. As a result, it was found that the combination of $Cr_2O_3$ and at least one oxide of $ZrO_2$ and $HfO_2$ is suitable as a constitutive material for the dielectric layer which contacts with the recording layer. Further, it was found that the interface layer does not need to be formed when the total content of Zr and Hf is within a specific range, while the content of Cr is within a specific range, which led to this invention.

That is, the present invention provides an information recording medium which includes a substrate and a recording layer wherein a phase change between a crystal phase and an amorphous phase is generated by irradiation of light or application of an electric energy, and which further includes a Zr/Hf—Cr—O-based material layer comprising at least one of Zr and Hf, Cr, and O wherein the total content of Zr and Hf is 30 atomic % or less in total and the content of Cr is in the range of 7 atomic % to 37 atomic %.

The information recording medium of the present invention is a medium on or from which information is recorded or reproduced by irradiation of light or by application of an electric energy. Generally, irradiation of light is carried out by irradiation of a laser light (that is, laser beam), and application of an electric energy is carried out by applying a voltage to a recording layer. Hereafter, the Zr/Hf—Cr—O-based material layer which constitutes the information recording medium of this invention is described in detail. In addition, it should be noted that, in the following description, when the term "Zr/Hf—Cr—O-based material layer" is used, it refers to the layer in which Cr and either or both of Zr and Hf are contained at the above-mentioned ratio, respectively. If the Zr/Hf—Cr—O-based material layer contains Zr and not Hf, Zr should be contained at the above-mentioned ratio. If the Zr/Hf—Cr—O-based material layer contains Hf and not Zr, Hf should be contained at the above-mentioned ratio. If the Zr/Hf—Cr—O-based material layer contains both of Zr and Hf, they should be contained in total at the above-mentioned ratio Further, in this specification, "Zr/Hf" means at least one element selected from Zr and Hf, that is, "Zr and/or Hf." It should be noted that in this specification, "/" between two elements or two compounds is used for simplicity.

More specifically, the information recording medium of this invention includes the Zr/Hf—Cr—O-based material layer which consists essentially of the material expressed with the formula (1):

$$M_Q Cr_R O_{100-Q-R} (\text{atomic } \%) \qquad (1)$$

wherein M represents at least one element selected from Zr and Hf, Q and R are respectively within the range of $0 < Q \leq 30$, and $7 \leq R \leq 37$, and satisfy $20 \leq Q+R \leq 60$, as a constituent element. The "atomic %" here shows that the formula (1) is a compositional formula of which basis (i.e. 100%) is the sum of the numbers of "M", Cr and O atoms. Also in the following formulae, the indication of "atomic %" is used for showing the same meaning. When this material contains both of Zr and Hf, Q corresponds to the sum of the content of Zr and the content of Hf.

It should be noted that "M" represents either or both of Zr and Hf. In other words, in this specification including the following description, when "M" is used for representing a component of Zr/Hf—Cr—O-based material, it refers to "Zr and/or Hf". Therefore, the material expressed with this formula includes an embodiment wherein only Zr is contained as "M" in the material, an embodiment wherein only Hf is contained as "M" in the material, and an embodiment wherein Zr and Hf are contained as "M" in the material. The reason why "M" is used, the physical and chemical characteristics of Zr and those of Hf are very similar to each other so that Zr and Hf are interchangeable.

In the formula (1), it does not matter what compound each atom of Zr and/or Hf, Cr, and O forms. The reason why the material is specified by this formula is that it is difficult to determine the composition represented with ratio of each compound when analyzing the composition of a layer formed into a thin film, and actually only an elementary composition (that is, ratio of each atom) is often determined. In the material expressed with the formula (1), it is considered that most Zr exists as $ZrO_2$ with O if the material contains Zr, most Hf exists as $HfO_2$ with O if the material contains Hf, and most Cr exists as $Cr_2O_3$ with O.

Preferably, the Zr/Hf—Cr—O-based material layer which consists essentially of the material expressed with above-mentioned formula (1) exists as either dielectric layer of the two dielectric layers adjacent to the recording layer in the information recording medium. More preferably, it exists as both of the two dielectric layers. The dielectric layer which contains either or both of Zr and Hf, Cr, and O in the above-mentioned range has a high melting point, and is transparent. Moreover, in this layer, $ZrO_2$ and/or $HfO_2$ ensures excellent overwrite cycle-ability and $Cr_2O_3$ ensures adhesiveness to the recording layer which is of chalcogenide material. Therefore, even when this information recording medium does not have an interface layer, exfoliation does not occur between the recording layer and the dielectric layer, and excellent overwrite cycle-ability is exhibited. Alternatively, the layer of the material expressed with the formula (1) may be an interface layer which is located between the recording layer and a dielectric layer in an information recording medium.

In the information recording medium of this invention, the Zr/Hf—Cr—O-based material layer may be the layer which substantially consists of the material expressed with the formula (11):

$$(MO_2)_N (Cr_2O_3)_{100-N} (\text{mol } \%) \qquad (11)$$

wherein M represents at least one element selected from Zr and Hf, N is in the range of $20 \leq N \leq 80$. The formula (11) expresses the preferable ratio of $MO_2$ and $Cr_2O_3$ when the Zr/Hf—Cr—O-based material layer consists of a mixture of $MO_2$, i.e. $ZrO_2$ and/or $HfO_2$, and $Cr_2O_3$. The term "mol %" here shows that the formula (11) is a compositional formula of which basis (i.e. 100%) is the total of each compound. Also in the following formulae, the indication of "mol %" is used for showing the same meaning. When this material contains both of $ZrO_2$ and $HfO_2$, N corresponds to the sum of the content of $ZrO_2$ and the content of $HfO_2$.

In this specification, "$MO_2$" refers to either or both of $ZrO_2$ and $HfO_2$. The reason why "$MO_2$" is used is, as described in the above, that physical and chemical properties of $ZrO_2$ and those of $HfO_2$ are similar to each other. Therefore, the material in which "$MO_2$" is contained as a component includes an embodiment wherein only $ZrO_2$ is contained as $MO_2$, an embodiment only $HfO_2$ is contained as $MO_2$, and an embodiment wherein $ZrO_2$ and $HfO_2$ are contained as $MO_2$. Further, in this specification the indication "$ZrO_2/HfO_2$" is used instead of "$MO_2$", which means of $ZrO_2$ and/or $HfO_2$. Furthermore, in this specification, the indication such as "$ZrO_2$—$Cr_2O_3$-based material" or "$HfO_2$—$Cr_2O_3$-based material" are used in order to refer to a material containing only $ZrO_2$ or $HfO_2$ as $MO_2$. The indication "$ZrO_2$—$HfO_2$—$Cr_2O_3$-based material" is used in order to refer to a material containing both of $ZrO_2$ and $HfO_2$.

Preferably, the layer which substantially consists of the material expressed with the formula (11) also exists as either dielectric layer of the two dielectric layers adjacent to the recording layer. More preferably, it exists as both of the two dielectric layers. The effect by using the layer which substantially consists of the material expressed with the formula (11) as a dielectric layer is the same as described in relation to the material expressed with the formula (1).

In the information recording medium of this invention, the Zr/Hf—Cr—O-based material layer may further contains Si, and substantially consist of the material expressed with the formula (2):

$$M_U Cr_V Si_T O_{100-U-V-T} \text{(atomic \%)} \qquad (2)$$

wherein M represents at least one element selected from Zr and Hf, U, V, and T are respectively in the range of $0<U\leq30$, $7\leq V\leq37$, and $0<T\leq14$, and satisfy $20\leq U+V+T\leq60$. When this material contains both of Zr and Hf, U corresponds to the sum of the content of Zr and the content of Hf.

Also in the formula (2), it does not matter what compound each atom of Zr and/or Hf, Cr, Si, and O forms. The reason why the material is specified by this formula is the same as the reason for employing the formula (1). In the material expressed with the formula (2), it is considered that most Si exists as $SiO_2$ with O.

Preferably, the layer which substantially consists of the material expressed with the formula (2) exists as either dielectric layer of the two dielectric layers adjacent to the recording layer. More preferably, it exists as both of the two dielectric layers. In the information recording medium in which the Zr/Hf—Cr—O-based material layer containing Si is employed as the dielectric layer, favorable adhesiveness of the dielectric layer to the recording layer and excellent overwrite cycle-ability are ensured, and higher recording sensitivity is realized. It is considered that the higher recording sensitivity is realized because the thermal conductivity of the layer becomes low due to Si being contained in the layer. Alternatively, the layer substantially consisting of the material expressed with the formula (2) may be an interface layer which is located between the recording layer and a dielectric layer in an information recording medium.

The Zr/Hf—Cr—O-based material layer containing Si may be the layer which substantially consists of the material expressed with the formula (21):

$$(MO_2)_X (Cr_2O_3)_Y (SiO_2)_{100-X-Y} \text{(mol \%)} \qquad (21)$$

wherein M represents at least one element selected from Zr and Hf, X and Y are respectively within the range of $20\leq X\leq70$, and $20\leq Y\leq60$, and satisfy $60\leq X+Y\leq90$. The formula (21) shows the preferable ratio of $MO_2$, $Cr_2O_3$, and $SiO_2$ when the Zr/Hf—Cr—O-based material layer containing Si consists of a mixture of $MO_2$, i.e. either or both of $ZrO_2$ and $HfO_2$, $Cr_2O_3$, and $SiO_2$. When this material contains both of $ZrO_2$ and $HfO_2$, X corresponds to the sum of the content of $ZrO_2$ and the content of $HfO_2$. Preferably, the layer which consists essentially of the material expressed with the formula (21) exists as either dielectric layer of the two dielectric layers adjacent to the recording layer. More preferably, it exists as both of the two dielectric layers. Alternatively, the layer of the material expressed with the formula (21) may be an interface layer which is located between the recording layer and a dielectric layer in an information recording medium.

When using the layer which substantially consists of the material expressed with the formula (21) as a dielectric layer, $SiO_2$ serves to enhance the recording sensitivity of the information recording medium. When using this material, favorable adhesiveness of the layer to the recording layer is ensured by setting X+Y at between 60 and 90 in the formula (21). The ratio of $SiO_2$ is adjusted by varying X+Y in this range. Therefore, by selecting the ratio of $SiO_2$ appropriately, the recording sensitivity can be adjusted. Further, $MO_2$ (i.e. $ZrO_2$ and/or $HfO_2$) and $Cr_2O_3$ can exist in the layer at a suitable ratio by setting X at between 20 and 70, and setting Y at between 20 and 60 in the formula (21). Therefore, the dielectric layer which substantially consists of the material expressed with the formula (21) is transparent, and is excellent in adhesiveness to the recording layer, and further ensures that the information recording medium has favorable recording sensitivity and favorable overwrite cycle-ability.

The material expressed with the formula (21) may contain $MO_2$ and $SiO_2$ at a substantially equal ratio. In this case, this material is expressed with the following formula (22):

$$(MSiO_4)_Z (Cr_2O_3)_{100-Z} \text{(mol \%)} \qquad (22)$$

wherein M represents at least one element selected from Zr and Hf, Z is within the range of $25\leq Z\leq67$. When $MO_2$ and $SiO_2$ are contained at a substantially equal ratio, $MSiO_4$ with stable structure is formed. When $ZrO_2$ and $SiO_2$ are contained at a substantially equal ratio, $ZrSiO_4$ with stable structure is formed. When $HfO_2$ and $SiO_2$ are contained at a substantially equal ratio, $HfSiO_4$ with stable structure is formed. When the total ratio $ZrO_2$ and $HfO_2$ and the ratio of $SiO_2$ are substantially equal, a mixture of $ZrSiO_4$ and $HfSiO_4$ is formed. When this material contains both of $ZrSiO_4$ and $HfSiO_4$, Z corresponds to the sum of the content of $ZrSiO_4$ and the content of $HfSiO_4$. Preferably, the layer which substantially consists of the material expressed with the formula (22) exists as either dielectric layer of the two dielectric layers adjacent to the recording layer. More preferably, it exists as both of the two dielectric layers. In the formula (22), $MSiO_4$ (i.e. $ZrSiO_4$ and/or $HfSiO_4$), and $Cr_2O_3$ exist in the layer at a suitable ratio by setting Z into the range of $25\leq Z\leq67$. Therefore, the dielectric layer which substantially consists of the material expressed with the formula (22) is transparent, and is excellent in adhesiveness to the recording layer, and further ensures that the information recording medium has a favorable recording sensitivity and favorable overwrite cycle-ability. Alternatively, the layer which substantially consists of the material expressed with the formula (22) may be an interface layer which is located between the recording layer and a dielectric layer in an information recording medium.

This invention also provides an information recording medium which includes a substrate and a recording layer wherein a phase change between a crystal phase and an amorphous phase is generated by irradiation of light or application of an electric energy, and which further includes a layer which consists essentially of a Zr/Hf—Cr—Zn—O-based material expressed with the formula (3):

$$(MO_2)_C (Cr_2O_3)_E (D)_F (SiO_2)_{100-C-E-F} \text{(mol \%)} \qquad (3)$$

wherein M represents at least one element selected from Zr and Hf, D is ZnS, ZnSe or ZnO, C, E and F are respectively in the range of $20\leq C\leq60$, $20\leq E\leq60$, and $10\leq F\leq40$, and satisfy $60\leq C+E+F\leq90$. In the following description, the layer which substantially consists of the material expressed with the formula (3) may be referred to merely as a "Zr/Hf—Cr—Zn—O-based material layer." When this material contains both of $ZrO_2$ and $HfO_2$, C corresponds to the sum of the content of $ZrO_2$ and the content of $HfO_2$.

Preferably, the layer which substantially consists of the material expressed with the formula (3) exists as either dielectric layer of the two dielectric layers adjacent to the recording layer. More preferably, it exists as both of the two dielectric layers. The material expressed with the formula (3) contains $MO_2$ (i.e. $ZrO_2$ and/or $HfO_2$), $Cr_2O_3$ and $SiO_2$ like the material expressed with the formula (21). Therefore, this material makes the dielectric layer excellent in transparency and adhesiveness to the recording layer. Moreover, the information recording medium including this dielectric layer has favorable recording sensitivity and favorable overwrite cycle-ability. Since the material expressed with the formula (3) contains ZnS, ZnSe, or ZnO as the component D, the dielectric layer formed from this material has further improved adhesiveness to the recording layer consisting of chalcogenide material. Further, the recording sensitivity can be further improved by adding ZnS or ZnSe which tends to be in a crystalline state into the $MO_2$—$Cr_2O_3$—$SiO_2$-based material (i.e. $ZrO_2$—$Cr_2O_3$—$SiO_2$-based material, $HfO_2$—$Cr_2O_3$—$SiO_2$-based material or $ZrO_2$—$HfO_2$—$Cr_2O_3$—$SiO_2$-based material) which tends to be in an amorphous state in the form of a thin film. Alternatively, the layer which substantially consists of the material expressed with the formula (3) may be used as an interface layer which is located between the recording layer and a dielectric layer in an information recording medium.

$MO_2$ and $Cr_2O_3$ can exist in the layer at a suitable ratio by setting C at between 20 and 60, and setting E at between 20 and 60 in the formula (3). The effects of the component D (for example, improvement in adhesiveness etc.) are accomplished without deteriorating the overwrite cycle-ability of the information recording medium by setting F at between 10 and 40 in the formula (3). Moreover, in formula (3), by varying C+E+F in the range of 60 to 90, the ratio of $SiO_2$ can be adjusted appropriately and therefore, recording sensitivity can be adjusted.

The material expressed with the formula (3) may contain $MO_2$ and $SiO_2$ at a substantially equal ratio. In this case, this material is expressed with the following formula (31):

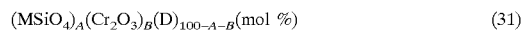

$$(MSiO_4)_A(Cr_2O_3)_B(D)_{100-A-B}(\text{mol \%}) \tag{31}$$

wherein M represents at least one element selected from Zr and Hf, D is ZnS, ZnSe or ZnO, and A and B are respectively in the range of $25 \leq A \leq 54$, and $25 \leq B \leq 63$, and satisfy $50 \leq A+B \leq 88$. $MSiO_4$ of a stable structure is formed when $MO_2$ and $SiO_2$ are contained at a substantially equal ratio as mentioned above. When this material contains both of $ZrSiO_4$ and $HfSiO_4$, A corresponds to the sum of the content of $ZrSiO_4$ and the content of $HfSiO_4$. Preferably, the layer which substantially consists of the material expressed with the formula (31) exists as either dielectric layer of the two dielectric layers adjacent to the recording layer. More preferably, it exists as both of the two dielectric layers. $MSiO_4$ and $Cr_2O_3$ exist in the layer at a suitable ratio by setting A at between 25 and 54, and setting B at between 25 and 63 in the formula (31). Therefore, the dielectric layer which substantially consists of the material expressed with the formula (31) is transparent, and is excellent in adhesiveness to the recording layer, and ensures that the information recording medium has favorable recording sensitivity and favorable overwrite cycle-ability. Moreover, when the material expressed with the formula (31) is contained in the dielectric layer, $SiO_2$ and the component D make the recording sensitivity of the information recording medium high, and the component D enhances the adhesiveness of the dielectric layer to the recording layer. Alternatively, the layer which substantially consists of the material expressed with the formula (31) may be an interface layer which is located between the recording layer and a dielectric layer in an information recording medium.

In the materials expressed with the above formulae, Zr and Hf are bracketed by using "M." As described above, this is because they have physical and chemical properties in common and they are interchangeable. Therefore, in the case where the Zr/Hf—Cr—O-based material contains both of Zr and Hf, in the formulae (1) and (2), each of the contents of Zr and Hf may be any one as long as the total content of them is 30 atomic % or less. For example, in the formula (1) or (2), the content of Zr may be 29 atomic %, while the content of Hf may be 1 atomic %, or the content of Zr may be 3 atomic %, while the content of Hf may be 20 atomic %. Similarly, in the formulas (11), (21) and (3), each of the contents of $ZrO_2$ and $HfO_2$ may be any one. Further, in the formulae (22) and (31), each of the contents of $ZrSiO_4$ and $HfSiO_4$ may be any one. Further, the materials which contains both of Zr and Hf can be regarded as a material wherein Hf substitutes for part of Zr in a Zr—Cr—O-based material or a Zr—Cr—Zn—O-based material, or a material wherein Zr substitutes for part of Hf in a Hf—Cr—O-based material or a Hf—Cr—Zn—O-based material, The information recording medium of the present invention preferably has a recording layer in which a phase change is generated reversibly. That is, the information recording medium of this invention is preferably provided as a rewritable information recording medium.

Specifically, the recording layer where a phase change occurs reversibly preferably contains any one material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te. Each of these is a rapid crystallization material. Therefore, when a recording layer is formed from these materials, it is possible to record information at a high density and a high transfer rate, and to obtain the information recording medium excellent in reliability (specifically archival characteristic or archival overwrite characteristic).

The information recording medium of this invention may have two or more recording layers. For example, such an information recording medium has a single-sided dual-layer structure, in which two recording layers are formed on one surface of a substrate with a dielectric layer and an intermediate layer therebetween. As to the information recording medium of the single-sided dual-layer structure, information is recorded in two recording layers by irradiation of light from one side. By employing this structure, the recording capacity can be made large. Alternatively, an information recording medium of this invention may include a recording layer on both surfaces of a substrate.

When the information recording medium of this invention has the recording layer where a phase change occurs reversibly, it is desirable that the film thickness of the recording layer is 15 nm or less. If it exceeds 15 nm, the heat applied to the recording layer will diffuse in the planar direction, and will be difficult to diffuse in the thickness direction.

The information recording medium of this invention may have a constitution in which a first dielectric layer, a recording layer, a second dielectric layer, and a reflective layer are formed in this order on one surface of a substrate. The information recording medium of this constitution is a medium on which information is recorded by irradiation of light. In this specification, the "first dielectric layer" means the dielectric layer which is in the position closer to the incident light, and the "second dielectric layer" means the dielectric layer which is in the position farther from the incident light. That is, the incident light passes through the first dielectric layer and the recording layer in this order, and then reaches the second dielectric layer. The information recording medium of this constitution is used, for example, when recording and reproducing by the laser beam of which wavelength is about 660 nm.

When the information recording medium of this invention has this constitution, at least one of the first dielectric layer and the second dielectric layer is the above Zr/Hf—Cr—O-based material layer (specifically, the layer which consists essentially of any one of the materials expressed with the above formulae (1), (11), (2), (21), and (22)), or the above Zr/Hf—Cr—Zn—O-based material layer (specifically, the layer which consists essentially of the material expressed with the above formula (3) or (31)). Preferably, both of the dielectric layers are the above Zr/Hf—Cr—O-based material layer or the above Zr/Hf—Cr—Zn—O-based material layer. In this case, the compositions of both dielectric layers may be the same or different from each other.

The information recording medium of this invention may have a constitution in which a reflective layer, a second dielectric layer, a recording layer, and a first dielectric layer are formed in this order on one surface of a substrate. This constitution is employed when the thickness of the substrate to which a light is applied needs to be thin. Specifically, the information recording medium of this constitution is used, when information is recorded and reproduced by a short-wavelength laser beam of which wavelength is about 405 nm, and the numerical aperture NA of an objective lens is made as large as, for example, 0.85 in order to set a focal position shallow. In order to use such a wavelength and numerical aperture NA, the thickness of the substrate to which light is applied needs to be set at between about 60 and 120 μm, for example. It is difficult to form a layer on the surface of such thin substrate. Therefore, the information recording medium of this constitution is identified as an medium formed by using a substrate to which a light is not applied as a support substrate, and stacking a reflective layer and so on in the order on one surface of the substrate.

When the information recording medium of this invention has this constitution, at least one of the first dielectric layer and the second dielectric layer is the above Zr/Hf—Cr—O-based material layer or the above Zr/Hf—Cr—Zn—O-based material layer. Preferably, both of the dielectric layers are the above Zr/Hf—Cr—O-based material layer or the above Zr/Hf—Cr—Zn—O-based material layer. In this case, the compositions of both dielectric layers may be the same or different from each other.

This invention also provides a method for producing the information recording medium of this invention which includes the process of forming the above-mentioned Zr/Hf—Cr—O-based material layer by a sputtering method. According to the sputtering method, the Zr/Hf—Cr—O-based material layer of which composition is substantially the same as that of a sputtering target, can be formed. Therefore, according to this producing method, the Zr/Hf—Cr—O-based material layer of a desired composition can be easily formed by selecting a sputtering target appropriately.

Specifically, a sputtering target which substantially consists of the material expressed with the following formula (10):

$$M_J Cr_K O_{100-J-K} \text{(atomic \%)} \quad (10)$$

wherein, M represents at least one element selected from Zr and Hf, J and K are respectively within the range of $3 \leq J \leq 24$, and $11 \leq K \leq 36$, and satisfy $34 \leq J+K \leq 40$ can be used. The formula (10) is equivalent to an elementary composition formula of the material expressed with the formula (110) mentioned below. Therefore, by using this target, the layer which substantially consists of the material expressed with the above-mentioned formula (10) can be formed.

The elementary composition of the layer formed by sputtering may differ from the elementary composition of a sputtering target depending on a sputtering device, sputtering conditions, and the size of the sputtering target and so on. Even when such difference occurs upon using the sputtering target consisting of the material expressed with the above-mentioned formula (10), the elementary composition of the layer to be formed is expressed at least with the above-mentioned formula (1).

In the producing method of the information recording medium of this invention, a sputtering target which substantially consists of the material expressed with the formula (110):

$$(MO_2)_n (Cr_2O_3)_{100-n} \text{(mol \%)} \quad (110)$$

wherein, M represents at least one element selected from Zr and Hf, n is within the range of $20 \leq n \leq 80$, may be used. This is equivalent to the formula which expresses the composition of a sputtering target with the ratio of $MO_2$ and $Cr_2O_3$. The reason why the sputtering target is thus specified is that the sputtering target consisting of the material which contains Zr and/or Hf, Cr and O is usually provided with the indication of the composition based on $ZrO_2$ and/or $HfO_2$, and $Cr_2O_3$. Further, the inventors have confirmed that, according to analysis with an X-ray microanalyser, the elementary composition of a sputtering target with such an indication of composition becomes substantially equal to the elementary composition calculated from the indicated composition (that is, the indicated composition (i.e. nominal composition) is correct). Therefore, this sputtering target makes it possible to form the layer which substantially consists of the material expressed with the formula (11).

In the producing method of the information recording medium of this invention, in order to form the Zr/Hf—Cr—O-based material layer containing Si, a sputtering target which substantially consists of the material expressed with the formula (20):

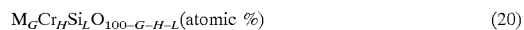

$$M_G Cr_H Si_L O_{100-G-H-L} \text{(atomic \%)} \quad (20)$$

wherein M represents at least one element selected from Zr and Hf, G, H, and L are within the range of $4 \leq G \leq 21$, $11 \leq H \leq 30$, and $2 \leq L \leq 12$, and satisfy $34 \leq G+H+L \leq 40$, may be used. When this sputtering target is used, the layer which substantially consists of the material expressed with the formula (21) or the formula (2) is formed.

In the producing method of the information recording medium of this invention, a sputtering target which substantially consists of the material expressed with the formula (210):

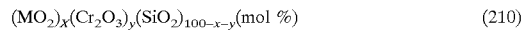

$$(MO_2)_x (Cr_2O_3)_y (SiO_2)_{100-x-y} \text{(mol \%)} \quad (210)$$

wherein M represents at least one element selected from Zr and Hf, x and y are respectively within the range of $20 \leq x \leq 70$, and $20 \leq y \leq 60$, and satisfy $60 \leq x+y \leq 90$, may be used. The reason why the sputtering target is thus specified is that the sputtering target consisting of the material containing Zr and/or Hf, Cr, Si and O is usually provided with the indication of the composition based on $ZrO_2$ and/or $HfO_2$, $Cr_2O_3$ and $SiO_2$. The inventors have confirmed that also the indicated composition (i.e. nominal composition) of the target whose composition is indicated with the formula (210) is correct. Therefore, this sputtering target makes it possible to form the layer which substantially consists of the material expressed with the formula (21).

The sputtering target expressed with the above-mentioned formula (210) may contain $MO_2$ and $SiO_2$ at a substantially equal ratio. In that case, the sputtering target which substantially consists of the material expressed with the formula (220):

$$(MSiO_4)_z(Cr_2O_3)_{100-z} (\text{mol \%}) \qquad (220)$$

wherein M represents at least one element selected from Zr and Hf, z is within the range of $25 \leq z \leq 67$, may be used. This sputtering target makes it possible to form the layer which consists of the material shown by the formula (22).

This invention also provides a method for producing the information recording medium of this invention which includes the process of forming the above-mentioned Zr/Hf—Cr—Zn—O-based material layer by sputtering. According to the sputtering method, the Zr/Hf—Cr—Zn—O-based material layer which has substantially the same composition as the sputtering target can be formed. Specifically, a sputtering target which substantially consists of the material expressed with the following formula (30):

$$(MO_2)_c(Cr_2O_3)_e(D)_f(SiO_2)_{100-c-e-f} (\text{mol \%}) \qquad (30)$$

wherein, M represents at least one element selected from Zr and Hf, D is ZnS, ZnSe, or ZnO, c, e, and f are respectively within the range of $20 \leq c \leq 60$, $20 \leq e \leq 60$, and $10 \leq f \leq 40$, and satisfy $60 \leq c+e+f \leq 90$, may be used. The reason why the sputtering target is thus specified is that the target which contains component D in addition to Zr and/or Hf, Cr, Si, and O is provided with the composition based on $MO_2$ (i.e. $ZrO_2$ and/or $HfO_2$), $Cr_2O_3$, $SiO_2$ and component D indicated. The sputtering target makes it possible to form the layer which substantially consists of the material shown by the formula (3).

The sputtering target shown by the above formula (30) may contain $MO_2$ and $SiO_2$ at a substantially equal ratio. In this case, the sputtering target which substantially consists of the material expressed with the formula (310):

$$(MSiO_4)_a(Cr_2O_3)_b(D)_{100-a-b} (\text{mol \%}) \qquad (310)$$

wherein M represents at least one element selected from Zr and Hf, D is ZnS, ZnSe, or ZnO, a and b are respectively within the range of $25 \leq a \leq 54$ and $25 \leq b \leq 63$, and satisfy $50 \leq a+b \leq 88$, may be used. This sputtering target makes it possible to form the layer which substantially consists of the material shown by the formula (31).

Preferably, this invention is characterized in that the dielectric layer is formed from $ZrO_2/HfO_2$—$Cr_2O_3$-based material, $ZrO_2/HfO_2$—$Cr_2O_3$—$SiO_2$-based material, or the material which is a mixture of $ZrO_2/HfO_2$—$Cr_2O_3$—$SiO_2$ and one of ZnS, ZnSe and ZnO, in direct contact with the recording layer. According to this characteristic, by eliminating the interface layer which is provided between the recording layer and the dielectric layer in the prior art optical information recording medium, the number of layers can be reduced, while the optical information recording medium which has high reliability, and ensures excellent overwrite cycle-ability and high recording sensitivity, can be realized. When the layer of any one of these materials is used as a dielectric layer for insulating a recording layer in the information recording medium to which an electric energy is applied, the phase change of the recording layer can be generated with a small electric energy.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Hereafter, the embodiments of the present invention are described with reference to the accompanying drawings. The following embodiments are illustrative, and the present invention is not limited to the following embodiments.

(Embodiment 1)

Figure 1:
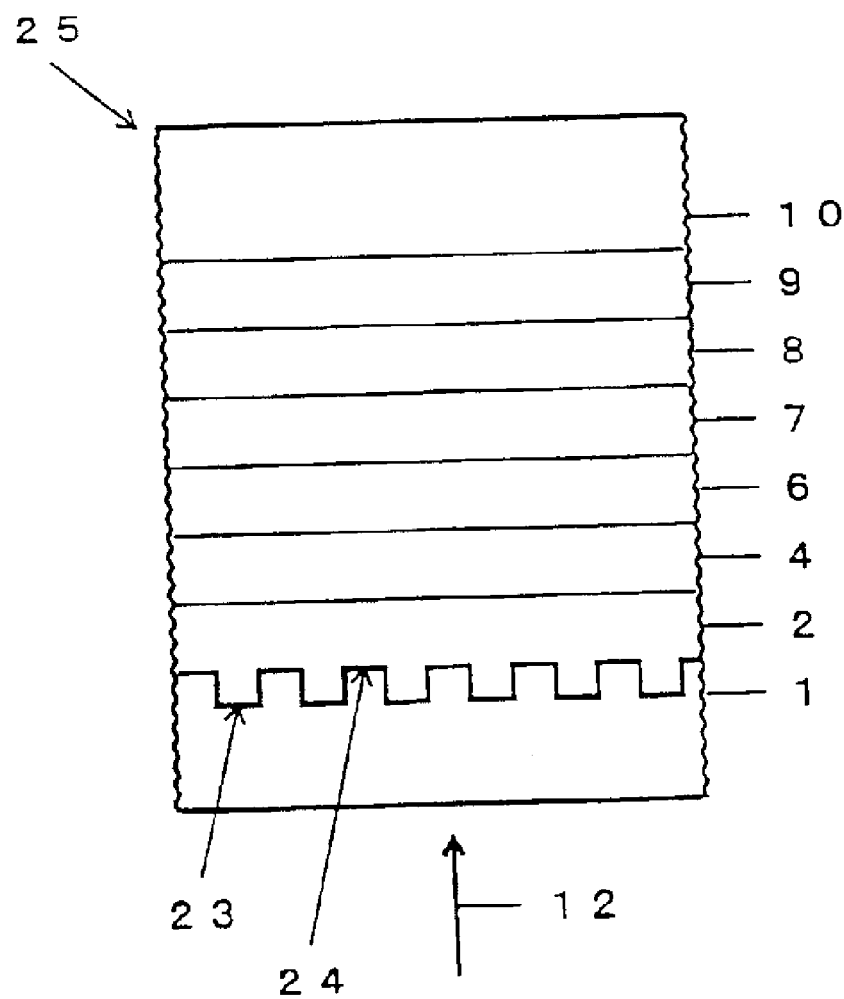
FIG. 1 is a fragmentary sectional view which shows an example of the optical information recording medium of the invention.

As Embodiment 1 of this invention, an example of the optical information recording medium on or from which information is recorded or reproduced by a laser beam, is described. FIG. 1 shows the partial cross section of the optical information recording medium.

The information recording medium 25 shown in FIG. 1 has a construction in which a first dielectric layer 2, a recording layer 4, a second dielectric layer 6, an optical compensation layer 7, and a reflective layer 8 are formed on one surface of a substrate 1 in this order (i.e. the layer 8 is formed on the layer 7, which is formed on the layer 6, which is formed on the layer 4, which is formed on the layer 2), and a dummy substrate 10 is bonded to the reflective layer 8 with an adhesive layer 9. The information recording medium of this constitution can be used as a 4.7 GB DVD-RAM on or from which information is recorded or reproduced by a laser beam with a wavelength of about 660 nm in a red wavelength region. A laser beam 12 is applied to the information recording medium of this constitution from the substrate 1 side, and thereby, information is recorded and reproduced. The information recording medium 25 is different from the prior art information recording medium 31 shown in FIG. 10 in that it does not have the first interface layer 103 and the second interface layer 105.

In Embodiment 1, both of the first dielectric layer 2 and the second dielectric layer 6 are a Zr/Hf—Cr—O-based material layer or a Zr/Hf—Cr—Zn—O-based material layer.

Generally, it is required that the material for a dielectric layer 1) is transparent; 2) has a high melting point and does not melt at the time of recording; and 3) has good adhesiveness to the recording layer which is of chalcogenide material. Transparency is a characteristic necessary for allowing the laser beam 12 applied from the substrate 1 side to pass through the dielectric layer and to reach the recording layer 4. Particularly, this characteristic is required for the first dielectric layer on the laser incident side. The high melting point is a characteristic necessary for ensuring that the material of the dielectric layer is not immixed in the recording layer when applying the laser beam of a peak power level. If the material of the dielectric layer is immixed in the recording layer, overwrite cycle-ability deteriorates remarkably. Good adhesiveness to the recording layer which is of chalcogenide material is a characteristic necessary for ensuring reliability of the information recording medium. Further, it is necessary to select the material for the dielectric layer so that the information recording medium has recording sensitivity equivalent to or higher than the conventional information recording medium (that is, a medium wherein an interface layer is located between the dielectric layer consisting of ZnS-20 mol % $SiO_2$ and the recording layer).

It is preferable that the Zr/Hf—Cr—O-based material layer is a layer which substantially consists of a mixture of $Cr_2O_3$ and either or both of $ZrO_2$ and $HfO_2$. Of oxides, each of $ZrO_2$ and $HfO_2$ is transparent and has a high melting point (about 2700 to 2800° C.), and low thermal conductivity. $Cr_2O_3$ has good adhesiveness to the recording layer which is of chalcogenide material. Therefore, the information recording medium 25 which is excellent in overwrite cycle-ability with favorable adhesiveness between the recording layer and the dielectric layer can be realized by forming the first and the second dielectric layers 2 and 6 from the mixture of $ZrO_2$ and/or $HfO_2$ and $Cr_2O_3$ in contact with the recording layer 4 as illustrated. The mixture of $Cr_2O_3$ and $ZrO_2$ and/or $HfO_2$ is expressed with the above-mentioned formula (11), i.e. $(MO_2)_N(Cr_2O_3)_{100-N}$ (mol %). It is preferable that the $Cr_2O_3$ content (that is, 100–N) is 20 mol % or more in this mixture. When $Cr_2O_3$ content is too much, the recording sensitivity of the information recording medium becomes low. Therefore, the $Cr_2O_3$ content is preferably 80 mol % or less, and more preferably in the range of 30 mol % to 50 mol %.

The Zr/Hf—Cr—O-based material may be a $ZrO_2$—$HfO_2$—$Cr_2O_3$ mixture. Such a mixture is, for example, a material expressed with $(ZrO_2)_{10}(HfO_2)_{25}(Cr_2O_3)_{65}$ (mol %) or $(ZrO_2)_{60}(HfO_2)_3(Cr_2O_3)_{37}$ (mol %).

The first and the second dielectric layers 2 and 6 may be a Zr/Hf—Cr—O-based material layer containing Si. Preferably, the Zr/Hf—Cr—O-based material layer containing Si substantially consists of a mixture of either or both of $ZrO_2$ and/or $HfO_2$, $Cr_2O_3$ and $SiO_2$. This mixture is expressed with the above-mentioned formula (21), i.e. $(MO_2)_X(Cr_2O_3)_Y(SiO_2)_{100-X-Y}$ (mol %). In this formula, M represents at least one element selected from Zr and Hf, X and Y are respectively within the range of $20 \leq X \leq 70$, and $20 \leq Y \leq 60$, and satisfy $60 \leq X+Y \leq 90$.

Figure 7:
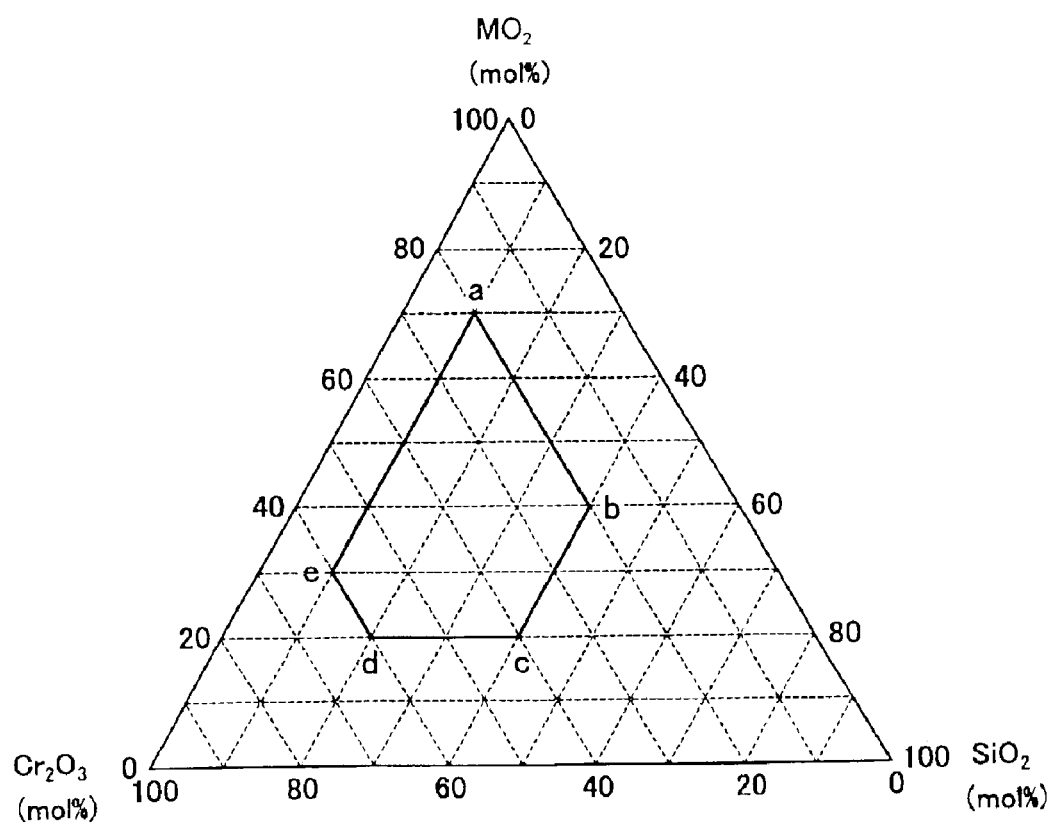
FIG. 7 is a triangular diagram which shows the composition range of the material expressed with the formula (21)

The composition range of material expressed with the formula (21) is shown in FIG. 7. The coordinate is ($MO_2$, $Cr_2O_3$, $SiO_2$) in FIG. 7. In this figure, the material expressed with the formula (21) is within the range (including the place on the line) surrounded by a(70, 20, 10), b(40, 20, 40), c(20, 40, 40), d(20, 60, 20), and e(30, 60, 10).

The Zr/Hf—Cr—O-based material layer containing $SiO_2$ enhances the recording sensitivity of the information recording medium. Moreover, the recording sensitivity can be adjusted by adjusting the ratio of $SiO_2$. In order to make the recording sensitivity higher by using $SiO_2$, the $SiO_2$ content in the mixture is preferably 10 mol % or more. On the other hand, since the adhesiveness to the recording layer is reduced in the case where the $SiO_2$ content is high, the $SiO_2$ content is preferably 40 mol % or less. The function of $MO_2$ (i.e. $ZrO_2$ and/or $HfO_2$) and $Cr_2O_3$ is as described above. By mixing $MO_2$ and $Cr_2O_3$ at a suitable ratio, the performance of the information recording medium is made suitable. In the case of the $MO_2$—$Cr_2O_3$—$SiO_2$ mixture, the $Cr_2O_3$ content is preferably in the range of 20 mol % to 60 mol %, and the $MO_2$ content is preferably in the range of 20 mol % to 70 mol %. The first dielectric layer 2 and the second dielectric layer 6 may be layers consisting of different mixtures whose $SiO_2$ contents are different from each other. For example, the first dielectric layer 2 may be $(MO_2)_{50}(Cr_2O_3)_{30}(SiO_2)_{20}$ (mol %), and the second dielectric layer 6 may be $(MO_2)_{40}(Cr_2O_3)_{20}(SiO_2)_{40}$ (mol %).

In the $MO_2$—$Cr_2O_3$—$SiO_2$ mixture, when $MO_2$ content and $SiO_2$ content are substantially equal, $MSiO_4$ (i.e. $ZrSiO_4$ and/or $HfSiO_4$) is preferably contained. The mixture in which $MSiO_4$ is formed is expressed with above-mentioned formula (22), i.e. $(MSiO_4)_Z(Cr_2O_3)_{100-Z}$ (mol %). In this formula, Z is within the range of $25 \leq Z \leq 67$. When $MO_2$ and $SiO_2$ are contained in the mixture at a substantially equal ratio, $MSiO_4$ (i.e. $ZrSiO_4$ and/or $HfSiO_4$) is formed, and thereby a $MO_2$—$SiO_2$-system with a stronger bond is obtained. In order to make adhesiveness of the layer to the recording layer better, and to ensure overwrite cycle-ability and high recording sensitivity of the information recording medium, Z is more preferably within the range of $33 \leq Z \leq 50$.

A Zr/Hf—Cr—Zn—O-based material layer is a layer which substantially consists of a mixture which further contains ZnS, ZnSe or ZnO in addition to the mixture of $MO_2$ (i.e. $ZrO_2$ and/or $HfO_2$), $Cr_2O_3$ and $SiO_2$. This mixture is expressed with the above-mentioned formula (3), i.e. $(MO_2)_C(Cr_2O_3)_E(D)_F(SiO_2)_{100-C-E-F}$ (mol %). In this formula, M represents at least one element selected from Zr and Hf, C, E, and F are respectively within the range of $20 \leq C \leq 60$, $20 \leq E \leq 60$, and $10 \leq F \leq 40$, and satisfy $60 \leq C+E+F \leq 90$. When the mixture contains component D, the layer consisting of this mixture exhibits better adhesiveness to the recording layer 4. Moreover, ZnS and ZnSe have a strong crystallinity even in the form of a thin film. Therefore, when ZnS or ZnSe is added into the amorphous $ZrO_2$/$HfO_2$—$Cr_2O_3$—$SiO_2$ mixture, the thermal conductivity of the mixture is further reduced. Therefore, if the first and the second dielectric layers 2 and 6 are formed from the mixture containing ZnS or ZnSe, the recording sensitivity of the information recording medium can be made higher. In this manner, by mixing four kinds of material, it is possible to realize the information recording medium which has recording sensitivity suitable for recording and erasing conditions (for example, the linear velocity of the medium and the wavelength of the laser beam), and which is excellent in overwrite cycle-ability and in adhesiveness of the dielectric layer to the recording layer.

The mixture shown by the above-mentioned formula (3) may also contain $MO_2$ and $SiO_2$ at a substantially equal ratio. Such mixture is expressed with the above-mentioned formula (31), i.e. $(MSiO_4)_A(Cr_2O_3)_B(D)_{100-A-B}$ (mol %). In this formula, M represents at least one element selected from Zr and Hf, A and B are respectively within the range of $25 \leq A \leq 54$ and $25 \leq B \leq 63$, and satisfy $50 \leq A+B \leq 88$. When $MO_2$ and $SiO_2$ are contained in the mixture at a substantially equal ratio, $MSiO_4$ is formed, and thereby a $MO_2$—$SiO_2$-system with a stronger bond is obtained. Thereby, it is possible to realize the information recording medium which has the recording sensitivity more suitable for the conditions of recording and erasing of information, and which is excellent in overwrite cycle-ability and in adhesiveness of the dielectric layer to the recording layer.

By changing each optical path length (that is, the product "nd" of refractive index n of a dielectric layer and the film thickness d of a dielectric layer), the first dielectric layer 2 and the second dielectric layer 6 serve to adjust optical absorptance Ac (%) of the recording layer 4 in a crystalline state and optical absorptance Aa (%) of the recording layer 4 in an amorphous state, adjust the optical reflectance Rc (%) of the information recording medium 25 when the recording layer 4 is in a crystalline state and the optical reflectance Ra (%) of the information recording medium 25 when the recording layer 4 is in an amorphous state, and adjust the phase difference $\Delta\phi$ of the light of the information recording medium 25 between the portions where the recording layer 4 is in a crystalline state and an amorphous state. In order to improve signal quality by increasing the reproduced-signal amplitude of a record mark, it is desirable that a reflectance difference (|Rc-Ra|) or a reflectance ratio (Rc/Ra) is large. Further, it is desirable that Ac and Aa are also large so that the recording layer 4 may absorb a laser beam. The optical path length of each of the first dielectric layer 2 and the second dielectric layer 6 is determined so as to satisfy these conditions simultaneously. The optical path length which satisfies those conditions can be determined accurately, for example, by calculation based on a matrix method (for example, see "Wave Optics" by Hiroshi Kubota et al., Section 3, Iwanami Shinsho, 1971).

The Zr/Hf—Cr—O-based material and the Zr/Hf—Cr—Zn—O-based material described above have the refractive index which differs depending on the composition. In general, these materials have a refractive index within the range of 1.8 to 2.5. When setting the refractive index of a dielectric layer at n, the film thickness at d (nm), and the wavelength of the laser beam 12 at $\lambda$(nm), the optical path length "nd" is expressed with nd=a$\lambda$, wherein "a" is a positive number. In order to improve the signal quality by increasing the reproduced-signal amplitude of the record mark of the information recording medium 25, for example, it is preferable that Rc, and Ra satisfy 15%$\leq$Rc and Ra$\leq$2%, respectively. Moreover, in order to eliminate the mark distortion by overwriting, or to make it small, it is preferable that Ac and Aa satisfy 1.1$\leq$Ac/Aa. The optical path length (a$\lambda$) of each of the first dielectric layer 2 and the second dielectric layer 6 was accurately calculated based on the matrix method so that these preferable conditions might be satisfied simultaneously. From the obtained optical path length (a$\lambda$), $\lambda$ and n, the thickness d of each dielectric layer was calculated. As a result, it was found that the thickness of the first dielectric layer 2 is preferably in the range of 100 nm to 200 nm, and more preferably from 130 nm to 170 nm. Further, it was found that the thickness of the second dielectric layer 6 is preferably in the range of 20 nm to 70 nm, and more preferably from 30 nm to 60 nm.

The substrate 1 is usually a transparent disc-shaped plate. A guide groove for guiding a laser beam may be formed in the surface where the dielectric layer, the recording layer and so on may be formed. In the case where the guide groove is formed on the substrate, groove portions and land portions are formed, when the substrate is viewed in cross section. It can be said that a groove portion is located between two adjacent land portions. Therefore, the surface wherein the guide groove is formed has a top surface and a bottom surface which are connected by side walls. In this specification, when viewed from the direction of the laser beam 12, the surface which is located closer to the laser beam 12 is referred to as a "groove surface" for convenience, whereas the surface which is located away from the laser beam 12 is referred to as a "land surface" for convenience. In FIG. 1, the bottom surface 23 corresponds to the groove surface, whereas the top surface 24 corresponds to the land surface. This is applicable to FIGS. 2, 3 and 6 mentioned below. On the contrary, in FIGS. 4 and 5, the surface 24 which is the bottom surface corresponds to the "land surface", whereas the surface 23 which is the top surface corresponds to the "groove surface." This is because, in the information recording medium illustrated in FIGS. 4 and 5, the order of forming the reflective layer and the recording layer is reverse to that in the information recording medium illustrated in FIG. 1. Record marks are formed in the recording layer on the surface of the recording layer corresponding to the groove surface of the guide groove (groove recording), or on the surface of the recording layer corresponding to the land surface of the guide groove (land recording), or on both surfaces of the recording layer (land-groove recording). In the embodiment shown in FIG. 1, the distance in the thickness direction between the groove surface 23 and the land surface 24 (i.e. the depth of groove) is preferably in the range of 40 nm to 60 nm. The below-mentioned embodiments shown in FIGS. 2, 3 and 6, the distance in the thickness direction between the groove surface 23 and the land surface 24 is preferably in this range. Moreover, it is desirable that the surface where a layer is not formed is flat. As material for the substrate 1, a resin like a polycarbonate, amorphous polyolefin, or PMMA, or glass can be employed. Considering moldability, price and mechanical strength, a polycarbonate resin is preferably used. In the embodiment shown in FIG. 1, the thickness of the substrate 1 is in the range of about 0.5 to 0.7 mm.

The recording layer 4 is a layer where a phase change between a crystal phase and an amorphous phase is generated by irradiation of light or application of an electric energy, and record marks are formed. The erasure and overwrite can be carried out if the phase change is reversible. It is preferable to use Ge—Sb—Te or Ge—Sn—Sb—Te which is a rapid crystallization material, as a reversible phase change material. Specifically, GeTe—Sb$_2$Te$_3$ pseudo-binary composition is preferably used as Ge—Sb—Te. In this case, the composition preferably satisfy 4Sb$_2$Te$_3$$\leq$GeTe$\leq$50Sb$_2$Te$_3$. In case of GeTe<4Sb$_2$Te$_3$, the variation in the amount of reflected light before and after recording is small, resulting in deterioration of the quality of a read-out signal. In case of 50Sb$_2$Te$_3$<GeTe, the volume variation between a crystal phase and an amorphous phase is large, resulting in deterioration of overwrite cycle-ability. Ge—Sn—Sb—Te has a crystallization speed higher than Ge—Sb—Te. Ge—Sn—Sb—Te is, for example, a material in which Sn is substituted for part of Ge of GeTe—Sb$_2$Te$_3$ pseudo-binary composition. It is preferable that the content of Sn is 20 atomic % or less in the recording layer 4. If it exceeds 20 atomic %, the crystallization speed is too high and therefore, the stability of an amorphous phase is impaired, which results in deterioration of reliability of record marks. The content of Sn can be adjusted depending on the recording conditions.

The recording layer 4 may be formed from a material containing Bi such as Ge—Bi—Te, Ge—Sn—Bi—Te, Ge—Sb—Bi—Te, or Ge—Sn—Sb—Bi—Te. Bi more easily crystallizes than Sb. Therefore, the crystallization speed of the recording layer can be increased by substituting Bi for part of Sb.

Ge—Bi—Te is a mixture of GeTe and $Bi_2Te_3$. In this mixture, it is preferable that $8Bi_2Te_3 \leq GeTe \leq 25Bi_2Te_3$. In case of $GeTe<8Bi_2Te_3$, the crystallization temperature is reduced, resulting in deterioration of archival characteristic. In case of $25Bi_2Te_3<GeTe$, the volume variation between a crystal phase and an amorphous phase is large, resulting in deterioration of overwrite cycle-ability.

Ge—Sn—Bi—Te is obtained by substituting Sn for part of Ge of Ge—Bi—Te. The crystallization speed can be controlled depending on the recording conditions by adjusting the content of Sn introduced by substitution. Substitution by Sn is suitable for fine adjustment of the crystallization speed compared with substitution by Bi. In the recording layer, the content of Sn is preferably 10 atomic % or less. If the content of Sn is more than 10 atomic %, the crystallization speed becomes too high, which reduces the stability of an amorphous phase, and therefore, the archival characteristic of record marks is deteriorated.

Ge—Sn—Sb—Bi—Te is obtained by substituting Sn for part of Ge of Ge—Sb—Te, and Bi for part of Sb of Ge—Sb—Te. This corresponds to a mixture of GeTe, SnTe, $Sb_2Te_3$ and $Bi_2Te_3$. As to this mixture, the crystallization speed can be controlled depending on the recording conditions, by adjusting the content of Sn and Bi introduced by substitution. In Ge—Sn—Sb—Bi—Te, it is preferable that $4(Sb—Bi)_2Te_3 \leq (Ge—Sn)Te \leq 25(Sb—Bi)_2Te_3$. In case of $(Ge—Sn)Te<4(Sb—Bi)_2Te_3$, the variation in the amount of reflected light before and after recording is small, resulting in deterioration of the quality of a read-out signal. In case of $25(Sb—Bi)_2Te_3<(Ge—Sn)Te$, the volume variation between a crystal phase and an amorphous phase is large, resulting in deterioration of overwrite cycle-ability. In the recording layer, the content of Bi is preferably 10 atomic % or less and the content of Si is preferably 20 atomic % or less. These Bi content and Si content make the archival characteristic of record marks good.

As the material in which a phase change is generated reversibly, Ag—In—Sb—Te, Ag—In—Sb—Te—Ge, and Sb—Te containing Sb in an amount of 70 atomic % or more may be employed.

As an irreversible phase change material, it is preferable to use $TeO_x+\alpha$ ($\alpha$ is Pd, Ge, or the like) as disclosed in Japanese Patent Publication No. 7-025209 B2. The information recording medium whose recording layer is of an irreversible phase change material is a so-called write-once type in which recording can be conducted only once. Also in such an information recording medium, there are problems that the atom in the dielectric layer diffuses into the recording layer with heat at the time of recording, which results in the deterioration of the signal quality. Therefore, this invention is preferably applied to the write-once type information recording medium as well as the rewritable information recording medium.

As mentioned above, when the recording layer 4 is formed from the reversible phase change material (that is, the information recording medium is the rewritable one), the recording layer 4 preferably has a thickness of 15 nm or less, and more preferably 12 nm or less.

The optical compensation layer 7 adjusts the ratio Ac/Aa of the optical absorptance Ac when the recording layer 4 is in a crystalline state, and the optical absorptance Aa when the recording layer 4 is in an amorphous state, and serves to suppress the distortion of the mark shape at the time of overwriting. It is preferable to form the optical compensation layer 7 from the material which has a high refractive index and absorbs a light moderately. For example, the optical compensation layer 7 may be formed using a material whose refractive index n is in the range of 3 to 6, and whose extinction coefficient k is in the range of 1 to 4. Specifically, it is preferable to use material selected from amorphous Ge alloys, such as Ge—Cr and Ge—Mo, amorphous Si alloys, such as Si—Cr, Si—Mo and Si—W, telluride, and crystalline metal, such as Ti, Zr, Nb, Ta, Cr, Mo, W, SnTe, PbTe and so on, semimetals, and semiconductor material. The film thickness of the optical compensation layer 7 is preferably in the range of 20 nm to 80 nm, and more preferably from 30 nm to 50 nm.

The reflective layer 8 has an optical function of increasing the quantity of light absorbed by the recording layer 4, and a thermal function of diffusing the heat generated in the recording layer 4 quickly to quench the recording layer 4, and thereby facilitate the amorphization of the recording layer 4. Further, the reflective layer 8 protects the multilayered film including the recording layer 4 and the dielectric layers 2 and 6 from the operation environment. As the material for the reflective layer 8, for example, the single-metal material with high thermal conductivity, such as Al, Au, Ag and Cu, is used. The reflective layer 8 may be formed from the material which contains another one or more elements in addition to one or more elements selected from the above-mentioned metallic material for the purpose of improving the moisture resistance and/or the purpose of adjusting thermal conductivity or an optical characteristic (for example, an optical reflectance, an optical absorptance or transmissivity). Specifically, an alloy material, such as Al—Cr, Al—Ti, Ag—Pd, and Ag—Pd—Cu, Ag—Pd—Ti, or Au—Cr, may be used. Each of these materials is excellent in corrosion resistance and has a quenching function. The similar purpose may be accomplished also by forming the reflective layer 8 in two or more layers. The thickness of the reflective layer 8 is preferably in the range of 50 to 180 nm, and more preferably from 60 nm to 100 nm.

In the illustrated information recording medium 25, the adhesive layer 9 is provided in order to adhere the dummy substrate 10 to the reflective layer 8. The adhesive layer 9 may be formed using a highly heat-resistant and highly adhesive material, for example, a bonding resin such as an ultraviolet-curing resin. Specifically, the adhesive layer 9 may be formed from an acrylic resin based material, or an epoxy resin based material. Moreover, if necessary, before forming the adhesive layer 9, a protective layer which consists of an ultraviolet-curing resin and has a thickness of 5 to 20 $\mu$m may be provided on the surface of the reflective layer 8. The thickness of the adhesive layer 9 is preferably in the range of 15 to 40 $\mu$m, and more preferably in the range of 20 to 35 $\mu$m.

The dummy substrate 10 enhances the mechanical strength of the information recording medium 25 and protects the multilayered body consisting of the layers from the first dielectric layer 2 to the reflective layer 8. The preferable material for the dummy substrate 10 is the same as that for the substrate 1. In the information recording medium 25 which includes the dummy substrate 10, it is preferable that the dummy substrate 10 and the substrate 1 are formed from substantially the same material and have the same thickness so as not to cause mechanical curvature and distortion.

The information recording medium of Embodiment 1 is a single-sided structure disc which has one recording layer. The information recording medium of this invention may have two recording layers. For example, an information recording medium of the double-sided structure is obtained by bonding two laminated pieces in which the layers up to the reflective layer 8 are stacked. The two pieces are bonded through an adhesive layer with the reflective layers 8 facing each other. In this case, the bonding of two pieces are carried out by forming the adhesive layer from a slow-acting resin and applying heat and pressure. In the case where the protective layer is provided on the reflective layer 8, an information recording medium of the double-sided structure is obtained by bonding two layered pieces in which the layers up to the protective layer are formed, with the protective layers facing each other.

Next, the method for producing the information recording medium 25 of Embodiment 1 is described. The information recording medium 25 is produced by carrying out the process in which the substrate 1 where the guide groove (the groove surface 23 and the land surface 24) is formed is set in a film-forming device, and then the first dielectric layer 2 is formed on the surface of the substrate 1 where the guide groove is formed (Process a), the process in which the recording layer 4 is formed (Process b), the process in which the second dielectric layer 6 is formed (Process c), the process in which the optical compensation layer 7 is formed (Process d), and the process in which the reflective layer 8 is formed (Process e) in this order, and further carrying out the process in which the adhesive layer 9 is formed on the surface of the reflective layer 8, and the process in which the dummy substrate 10 is bonded. In this specification including the following description, unless otherwise indicated, the "surface" of each layer means the surface (vertical to the thickness direction) which is exposed when each layer is formed.

First, Process a in which the first dielectric layer 2 is formed on the surface of the substrate 1 in which the guide groove is formed is carried out. Process a is carried out by sputtering. The sputtering is conducted in Ar gas atmosphere or in a mixed-gas atmosphere of Ar gas and oxygen using a high frequency electric power unit.

As the sputtering target used in Process a, the target which substantially consists of the material which is expressed with the above formula (110), i.e. $(MO_2)_n(Cr_2O_3)_{100-n}$ (mol %) wherein M is either or both of Zr and Hf, n is within the range of $20 \leq n \leq 80$, may be used. By using this target, the layer which substantially consists of the material expressed with the above-mentioned formula (11) is formed.

The sputtering target may substantially consist of material which is expressed with the formula (210), i.e. $(MO_2)_x(Cr_2O_3)_y(SiO_2)_{100-x-y}$ (mol %) wherein M is either or both of Zr and Hf, x and y are respectively within the range of $20 \leq x \leq 70$ and $20 \leq y \leq 60$, and satisfy $60 \leq x+y \leq 90$. By using this target, the layer which substantially consists of the material expressed with the above-mentioned formula (21) is formed.

The sputtering target may substantially consist of material which is expressed with the above-mentioned formula (220) i.e. $(MSiO_4)_z(Cr_2O_3)_{100-z}$ (mol %) wherein M is either or both of Zr and Hf, z is within the range of $25 \leq z \leq 67$. By using this target, the layer which substantially consists of the material expressed with the formula (22) is formed.

The sputtering target may substantially consist of material which is expressed with the above-mentioned formula (30), i.e. $(MO_2)_c(Cr_2O_3)_e(D)_f(SiO_2)_{100-c-e-f}$ (mol %) wherein M is either or both of Zr and Hf, D is ZnS, ZnSe or ZnO, c, e, and f are respectively within the range of $20 \leq c \leq 60$, $20 \leq e \leq 60$, and $10 \leq f \leq 40$, and satisfy $60 \leq c+e+f \leq 90$. By using this target, the layer which substantially consists of the material expressed with the formula (3) is formed.

The sputtering target may substantially consist of material which is expressed with the above-mentioned formula (310), i.e. $(MSiO_4)_a(Cr_2O_3)_b(D)_{100-a-b}$ (mol %) wherein M is either of both of Zr and Hf, D is ZnS, ZnSe or ZnO, a and b are respectively within the range of $25 \leq a \leq 54$, and $25 \leq b \leq 63$, and satisfy $50 \leq a+b \leq 88$. By using this target, the layer which substantially consists of the material expressed with the formula (31) is formed.

Next, Process b is carried out for forming the recording layer 4 on the surface of the first dielectric layer 2. Process b is also carried out by sputtering. The sputtering is conducted in an Ar gas atmosphere or in a mixed-gas atmosphere of Ar gas and $N_2$ gas using a direct-current power source. A sputtering target which contains any one material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te, and Sb—Te is used. The recording layer 4 after film formation is in an amorphous state.

Next, Process c is conducted for forming the second dielectric layer 6 on the surface of the recording layer 4. Process c is carried out in the same manner as Process a. The second dielectric layer 6 may be formed using a sputtering target consisting of a material which differs from that of the first dielectric layer 2.

Next, Process d is carried out for forming the optical compensation layer 7 on the surface of the second dielectric layer 6. In Process d, the sputtering is carried out using a direct-current power source or a high frequency electric power unit. A sputtering target which consists of a material selected from amorphous Ge alloys, such as Ge—Cr and Ge—Mo, amorphous Si alloys, such as Si—Cr and Si—Mo, telluride, and crystalline metal, such as Ti, Zr, Nb, Ta, Cr, Mo, W, SnTe and PbTe, semimetal, semiconductor material and so on, is used. Generally, the sputtering is conducted in an Ar gas atmosphere.

Next, Process e is conducted for forming the reflective layer 8 on the surface of the optical compensation layer 7. Process e is carried out by sputtering. The sputtering is conducted in Ar gas atmosphere using a direct current power source or a high frequency electric power unit. A sputtering target which consists of alloy material, such as Al—Cr, Al—Ti, Ag—Pd, Ag—Pd—Cu, Ag—Pd—Ti, or Au—Cr, may be used.

As mentioned above, Processes a–e are all sputtering processes. Therefore, Processes a–e may be conducted successively by changing the target in order in one sputtering device. Alternatively, each of Processes a–e may be conducted using an independent sputtering device.

After forming the reflective layer 8, the substrate 1 on which the layers from the first dielectric layer 2 to the reflective layer 8 are formed in order is picked out from the sputtering device. Then, an ultraviolet-curing resin is applied to the surface of the reflective layer 8, for example, by a spin coat method. The dummy substrate 10 is stuck to the applied ultraviolet-curing resin. An ultraviolet ray is applied from the dummy substrate 10 side to cure the resin, whereby the bonding process is finished.

After finishing the bonding process, an initialization process is carried out if necessary. The initialization process is a process in which the temperature of the recording layer 4 which is in an amorphous state is raised to a temperature more than the crystallization temperature so as to crystallize the layer, for example, by irradiation of a semiconductor laser. The initialization process may be carried out before the bonding process. In this manner, the information recording medium 25 of Embodiment 1 can be produced by implementing Processes a–e, the process of forming the adhesive layer, and the bonding process of the dummy substrate in order.

(Embodiment 2)

Figure 2:
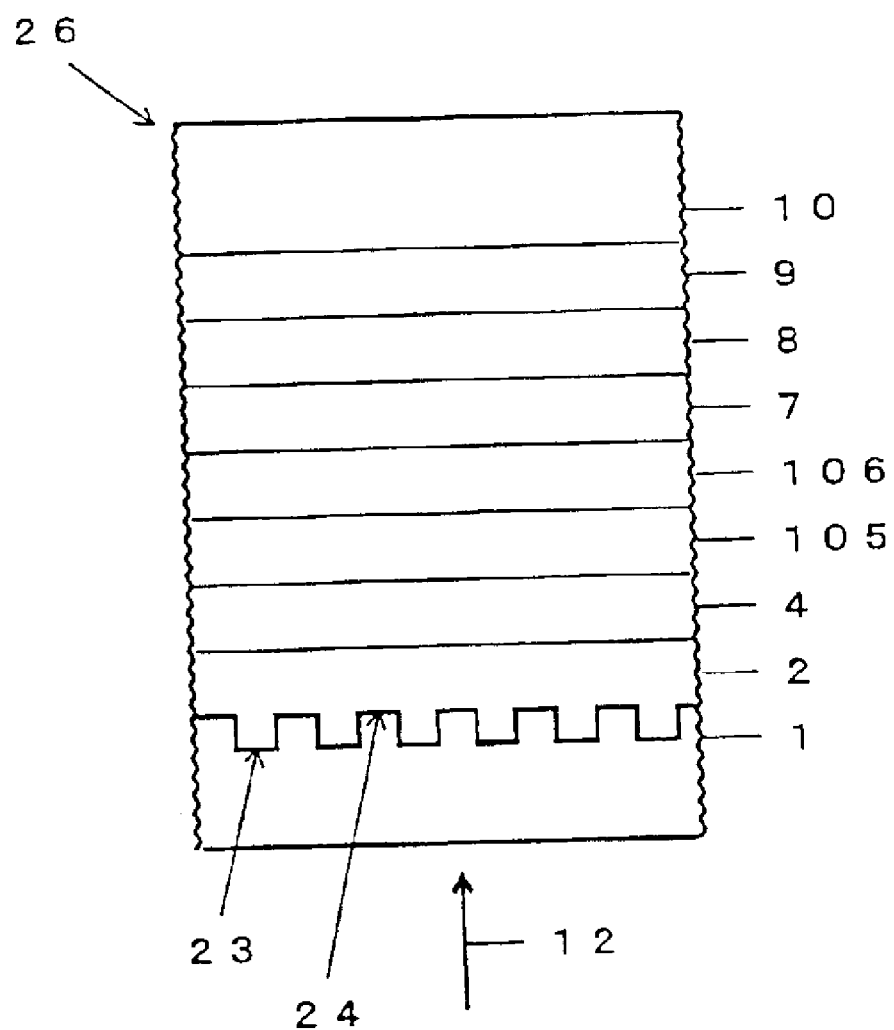
FIG. 2 is a fragmentary sectional view which shows another example of the optical information recording medium of the invention.

As Embodiment 2 of the present invention, another example of the optical information recording medium on or from which information is recorded or reproduced by using a laser beam, is described. FIG. 2 shows the partial cross section of the optical information recording medium.

The information recording medium 26 shown in FIG. 2 has a constitution in which a first dielectric layer 2, a recording layer 4, a second interface layer 105, a second dielectric layer 106, an optical compensation layer 7, and a reflective layer 8 are formed on one surface of a substrate 1 in this order, and furthermore a dummy substrate 10 is adhered to the reflective layer 8 with an adhesive layer 9. The information recording medium 26 shown in FIG. 2 is different from the prior art information recording medium 31 shown in FIG. 10 in that it does not have the first interface layer 103. Moreover, the information recording medium 26 is different from the information recording medium 25 of Embodiment 1 shown in FIG. 1 in that the second dielectric layer 106 is formed on the recording layer 4 with the second interface layer 105 therebetween. In the information recording medium 26, the first dielectric layer 2 is a Zr/Hf—Cr—O-based material layer or a Zr/Hf—Cr—Zn—O-based material layer like Embodiment 1. In addition, in FIG. 2, the reference numerals which are identical to those used in FIG. 1 denote identical components which are formed from the material and by the method described with reference to FIG. 1. Therefore, as to the components already described in connection with FIG. 1, the detailed description is omitted. It should be noted that although only one interface layer is provided in this embodiment, it is referred to as a "second interface layer" for convenience, since it is located between the second dielectric layer 106 and the recording layer 4.

The information recording medium 26 of this embodiment has a constitution in which the second dielectric layer 106 is formed from ZnS-20 mol % SiO$_2$ used for the prior art information recording medium. Therefore, the second interface layer 105 is provided in order to prevent the material transfer caused between the second dielectric layer 106 and the recording layer 4 due to repeated recording. The second interface layer 105 is formed from nitride such as Si—N, Al—N, Zr—N, Ti—N, Ge—N, or Ta—N, the nitride oxide containing one or more compounds of these, or carbide such as SiC. Alternatively, the second interface layer 105 may be a Zr/Hf—Cr—O-based material layer or a Zr/Hf—Cr—Zn—O-based material. The thickness of the interface layer is preferably in the range of 1 to 10 nm, and more preferably from 2 to 7 nm. If the thickness of the interface layer is large, the recording and erasing performance is affected because of the change of the optical reflectance and the optical absorptance of the multilayered body which consists of the layers from the first dielectric layer 2 to the reflective layer 8 and is formed on the surface of the substrate 1.

Next, the method for producing the information recording medium 26 of Embodiment 2 is described. The information recording medium 26 is produced by carrying out the process in which the first dielectric layer 2 is formed on the surface of the substrate 1 on which the guide groove is formed (Process a), the process in which the recording layer 4 is formed (Process b), the process in which the second interface layer 105 is formed (Process f), the process in which the second dielectric layer 106 is formed (Process g), the process in which the optical compensation layer 7 is formed (Process d) and the process in which the reflective layer 8 is formed (Process e) in this order, and further carrying out the process in which the adhesive layer 9 is formed on the surface of the reflective layer 8, and the process in which the dummy substrate 10 is bonded. Since Processes a, b, d, and e are as described in relation to Embodiment 1, the description of these processes is omitted here. Hereafter, only the processes not carried out in the production of the information recording medium of Embodiment 1 are described.

Process f is a process which is carried out after forming the recording layer 4, in order to form the second interface layer 105 on the surface of the recording layer 4. In Process f, the sputtering is conducted using a high frequency electric power unit. The sputtering may be a reactive sputtering which is conducted, for example, in a mixed-gas atmosphere of Ar gas and N$_2$ gas, using a sputtering target containing Ge. According to this reactive sputtering, the interface layer containing Ge—N is formed on the surface of the recording layer 4.

Next, Process g is carried out in order to form the second dielectric layer 106 on the surface of the second interface layer 105. In Process g, the sputtering is conducted, for example, in Ar gas atmosphere or a mixed-gas atmosphere of Ar gas and O$_2$ gas, using a high frequency electric power unit and a sputtering target consisting of ZnS-20 mol % SiO$_2$. Thereby, the layer consisting of ZnS-20 mol % SiO$_2$ is formed. After finishing the process in which the dummy substrate 10 is bonded, the initialization process is carried out if necessary as described in relation to Embodiment 1. The information recording medium 26 is thus obtained.

(Embodiment 3)

Figure 3:
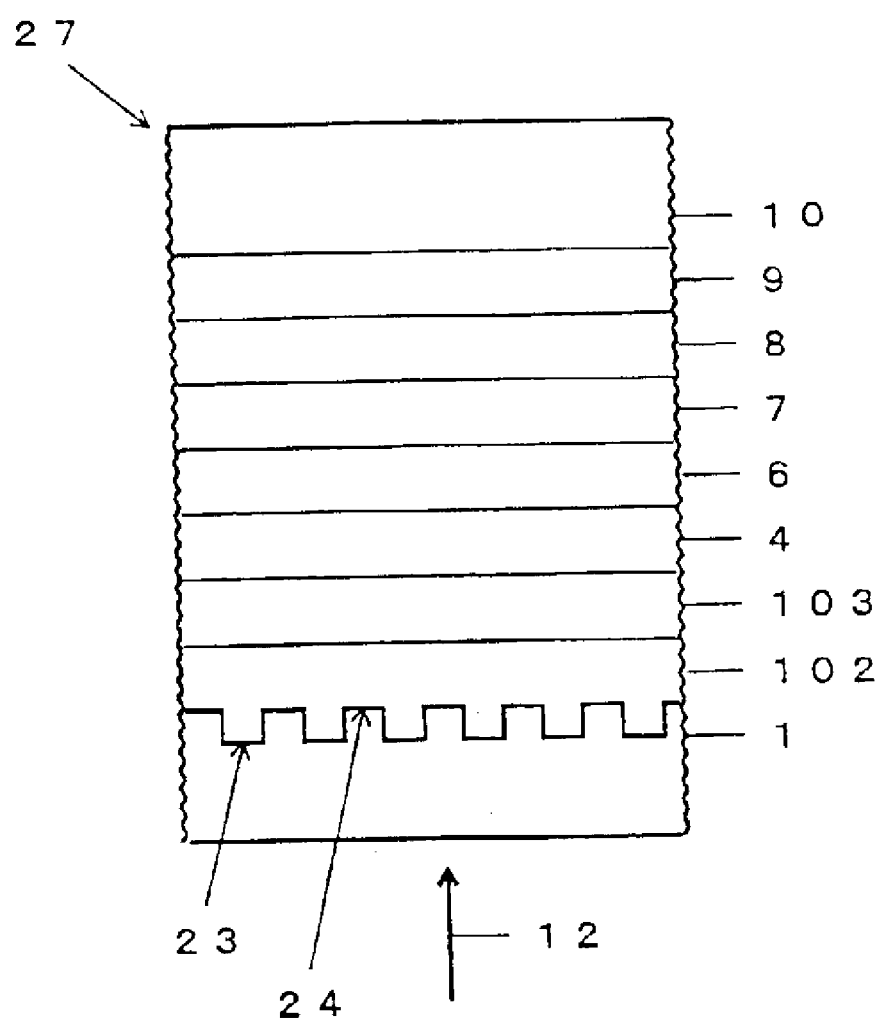
FIG. 3 is a fragmentary sectional view which shows further another example of the optical information recording medium of the invention.

As Embodiment 3 of the present invention, another example of the optical information recording medium on or from which information is recorded or reproduced by using a laser beam, is described. FIG. 3 shows the partial cross section of the optical information recording medium.

The information recording medium 27 shown in FIG. 3 has a constitution in which a first dielectric layer 102, a first interface layer 103, a recording layer 4, a second dielectric layer 6, an optical compensation layer 7, and a reflective layer 8 are formed on one surface of a substrate 1 in this order, and furthermore a dummy substrate 10 is bonded to the reflective layer 8 with an adhesive layer 9. The information recording medium 27 shown in FIG. 3 is different from the prior art information recording medium 31 shown in FIG. 10 in that it does not have the second interface layer 105. Moreover, the information recording medium 27 is different from the information recording medium 25 of Embodiment 1 shown in FIG. 1 in that the first dielectric layer 102 and the first interface layer 103 are formed between the substrate 1 and the recording layer 4 in this order. In the information recording medium 27, the second dielectric layer 6 is a Zr/Hf—Cr—O-based material layer or a Zr/Hf—Cr—Zn—O-based material layer like Embodiment 1. In addition, in FIG. 3, the reference numerals which are identical to those used in FIG. 1 denote identical components which are formed from the material and by the method described with reference to FIG. 1. Therefore, the detailed description as to the components already described in connection with FIG. 1, is omitted.

The information recording medium 27 of this embodiment has a constitution in which the first dielectric layer 102 is formed from ZnS-20 mol % SiO$_2$ used for the prior art information recording medium. Therefore, the first interface layer 103 is provided in order to prevent the material transfer caused between the first dielectric layer 102 and the recording layer 4 due to repeated recording. The preferable material and thickness of the first interface layer 103 are the same as those of the second interface layer 105 of the information recording medium 26 of Embodiment 2 described with reference to FIG. 2. Therefore, detailed description about it is omitted.

Next, the method for producing the information recording medium 27 of Embodiment 3 is described. The information recording medium 27 is produced by carrying out the process in which the first dielectric layer 102 is formed on the surface of the substrate 1 where the guide groove is formed (Process h), the process in which the first interface layer 103 is formed (Process i), the process in which the recording layer 4 is formed (Process b), the process in which the second dielectric layer 6 is formed (Process c), the process in which the optical compensation layer 7 is formed (Process d), and the process in which the reflective layer 8 is formed (Process e) in this order, and further carrying out the process in which the adhesive layer 9 is formed on the surface of the reflective layer 8, and the process in which the dummy substrate 10 is bonded. Since Processes b, c, d and e are as described in relation to Embodiment 1, the description of these processes is omitted here. Hereafter, only the processes not carried out in the production of the information recording medium of Embodiment 1 are described.

Process h is a process in which the first dielectric layer 102 is formed on the surface of the substrate 1. The method is the same as that of Process g which is described in relation to the producing method of Embodiment 2. Process i is a process in which the first interface layer 103 is formed on the surface of the first dielectric layer 102. The method is the same as that of Process f described in relation to the producing method of Embodiment 2. After finishing the process in which the dummy substrate 10 is bonded, the initialization process is carried out if necessary as described in relation to Embodiment 1. The information recording medium 27 is thus obtained.

(Embodiment 4)

Figure 4:
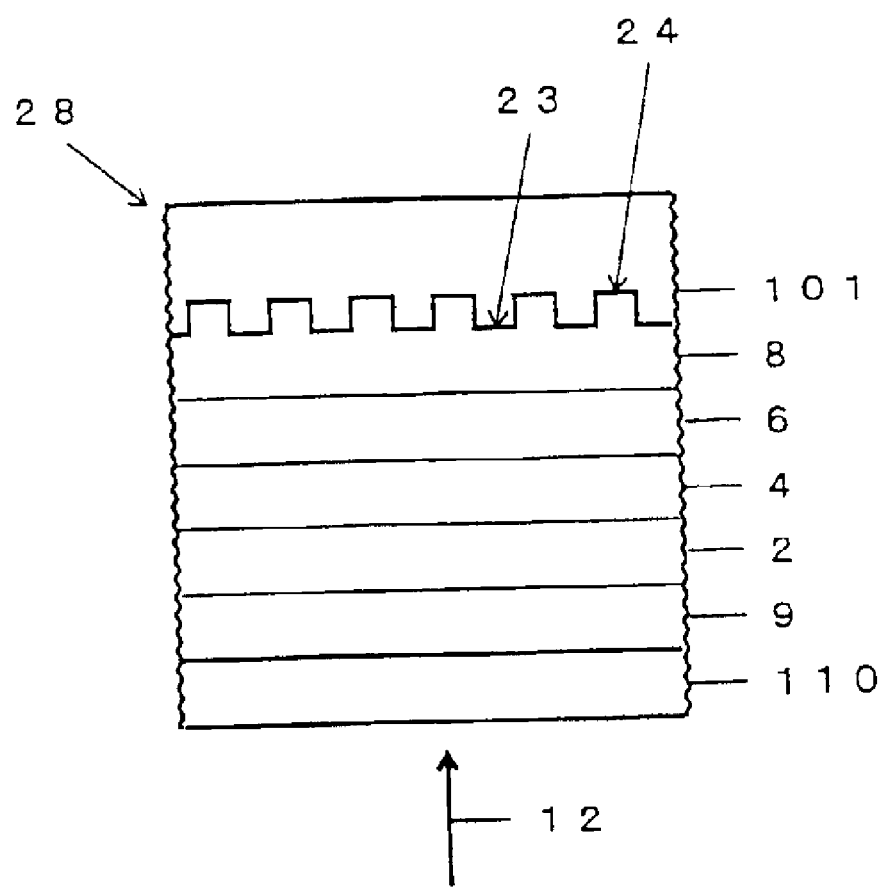
FIG. 4 is a fragmentary sectional view which shows further another example of the optical information recording medium of the invention.

As Embodiment 4 of the present invention, another example of the optical information recording medium on or from which information is recorded or reproduced by using a laser beam, is described. FIG. 4 shows the partial cross section of the optical information recording medium.

The information recording medium 28 shown in FIG. 4 has a constitution in which a reflective layer 8, a second dielectric layer 6, a recording layer 4, and a first dielectric layer 2 are formed on one surface of a substrate 101 in this order, and further a dummy substrate 110 is bonded to the first dielectric layer 2 with an adhesive layer 9. This information recording medium 28 is different from the prior art information recording medium 31 shown in FIG. 10 in that it does not have the first interface layer 103 and the second interface layer 105. Moreover, the information recording medium of this constitution is different from the information recording medium 25 which has the constitution shown in FIG. 1 in that it does not have the optical compensation layer 7.

A laser beam 12 is applied to the information recording medium 28 of this constitution from the dummy substrate 110 side, and thereby, information is recorded or reproduced. In order to make the recording density of the information recording medium high, it is necessary to form small record marks in the recording layer by narrowing a laser beam as well as using a laser beam of short wavelength. In order to narrow the beam, it is necessary to make the numerical aperture NA of an objective lens larger. However, a focal position becomes shallow when NA becomes large. Therefore, the substrate to which a laser beam is applied needs to be made thin. In the information recording medium 28 shown in FIG. 4, the thickness of the dummy substrate 110 can be made small, since the substrate 110 to which the laser beam is applied does not need to have a function as a support at the time of forming the recording layer and so on. Therefore, by employing this constitution, it is possible to obtain a large capacity information recording medium 28 on which information can be recorded with a higher density. Specifically, by employing this constitution, it is possible to obtain a 25 GB information recording medium on or from which information is recorded or reproduced by using a laser beam with a wavelength of about 405 nm in a bluish-violet wavelength region.

Also in this information recording medium, the first and the second dielectric layers 2 and 6 are a Zr/Hf—Cr—O-based material layer or a Zr/Hf—Cr—Zn—O-based material layer like Embodiment 1. A Zr/Hf—Cr—O-based material layer and a Zr/Hf—Cr—Zn—O-based material layer are used as the dielectric layer irrespective of the formation order of the reflective layer and so on, and recording capacity. Since the material contained in the Zr/Hf—Cr—O-based material layer and the Zr/Hf—Cr—Zn—O-based material layer is as described in relation to Embodiment 1, detailed description thereof is omitted.

As mentioned above, this information recording medium 28 is suitable for recording and reproducing by a laser beam of a short wavelength. Therefore, the thickness of each of the first and the second dielectric layers 2 and 6 is determined from a preferable optical path length on the assumption that $\lambda$ is, for example, 405 nm. In order to improve signal quality by increasing the reproduced signal amplitude of the record mark on the information recording medium 28, the optical path length "nd" of each of the first dielectric layer 2 and the second dielectric layer 6 is strictly determined by calculation based on the matrix method so as to satisfy, for example, $20\% \leq Rc$, and $Ra \leq 5\%$. As a result, when the Zr/Hf—Cr—O-based material layer or the Zr/Hf—Cr—Zn—O-based material layer having the above refractive index is made into the first and the second dielectric layers 2 and 6, it was found that the thickness of the first dielectric layer 2 is preferably in the range of 30 nm to 100 nm, and more preferably from 50 nm to 80 nm. Moreover, It was found that the thickness of the second dielectric layer 6 is preferably in the range of 3 nm to 50 nm, and more preferably from 10 nm to 30 nm.

The substrate 101 is a transparent disc-shaped plate like the substrate 1 of Embodiment 1. The guide groove for guiding a laser beam may be formed in the surface of substrate 101 where the reflective layer and so on are formed. When forming the guide groove, as described in connection with Embodiment 1, the surface 23 which is closer to the laser beam 12 is referred to as the "groove surface", whereas the surface 24 which is located away is referred to as the "land surface" for convenience. In the substrate 101, the distance in the thickness direction between the groove surface 23 and the land surface 24 (i.e. the depth of groove) is preferably in the range of 10 nm to 30 nm, and more preferably from 15 nm to 25 nm. Moreover, it is desirable that the surface where a layer is not formed is flat. The material for the substrate 1 of Embodiment 1 can be used as the material for the substrate 101. Preferably, the thickness of the substrate 101 is in the range of about 1.0 to 1.2 mm. The preferable thickness of the substrate 101 is larger than that of the substrate 1 of Embodiment 1. This is because, as mentioned below, the thickness of the dummy substrate 110 is thin, and therefore, the substrate 101 needs to ensure the strength of the information recording medium.

The dummy substrate 110 is a transparent disc-shaped plate like the substrate 101. As mentioned above, by employing the constitution shown in FIG. 4, it is possible to record information with the laser beam of a short wavelength by making the thickness of the dummy substrate 110 small. Therefore, the thickness of the dummy substrate 110 is preferably in the range of 40 μm to 110 μm. More preferably, the thickness of the adhesive layer 9 and the dummy substrate 110 in total is in the range of 50 μm to 120 μm.

Since the dummy substrate 110 is thin, the substrate is preferably formed from a resin like a polycarbonate, an amorphous polyolefin, or PMMA. The polycarbonate is particularly preferable. Moreover, since the dummy substrate 110 is located so that the laser-beam 12 reaches it first, it is preferable that the substrate has an optical characteristic of small birefringence with respect to a light in a short wavelength region.

Preferably, the adhesive layer 9 is formed from a transparent ultraviolet-curing resin. The thickness of the adhesive layer 9 is preferably in the range of 5 to 15 μm. The dummy substrate 110 can be omitted, when the adhesive layer 9 also provides the function of the dummy substrate 110 and is formed so as to have a thickness in the range of 50 μm to 120 μm.

In addition, the components identified with the reference numeral which is identical to those used in Embodiment 1 are as already described in relation to Embodiment 1, and therefore the description thereof is omitted.

In a variation of the information recording medium of this embodiment, for example, only the first dielectric layer is formed from a Zr/Hf—Cr—O-based material layer or a Zr/Hf—Cr—Zn—O-based material layer, and the second dielectric layer is formed from ZnS-20 mol % $SiO_2$, and the second interface layer is formed between the second dielectric layer and the recording layer. Moreover, in another variation of the information recording medium of this embodiment, only the second dielectric layer is formed from a Zr/Hf—Cr—O-based material or a Zr/Hf—Cr—Zn—O-based material layer, and the first dielectric layer is formed from ZnS-20 mol % $SiO_2$, and the first interface layer is formed between the first dielectric layer and the recording layer.

Next, the method for producing the information recording medium 28 of Embodiment 4 is described. The information recording medium 28 is produced by carrying out the process in which the substrate 101 where the guide groove (the groove surface 23 and the land surface 24) is formed is set in a film-forming device, and the reflective layer 8 is formed on the surface of the substrate 101 on which the guide groove is formed (Process e), the process in which the second dielectric layer 6 is formed (Process c), the process in which the recording layer 4 is formed (Process b), and the process in which the first dielectric layer 2 is formed (Process a) in this order, and further carrying out the process in which the adhesive layer 9 is formed on the surface of the first dielectric layer 2, and the process in which the dummy substrate 110 is bonded.

First, Process e is carried out in order to form the reflective layer 8 on the surface of the substrate 101 where the guide groove is formed. The method for carrying out Process e is as described in relation to Embodiment 1. Next, Process c, Process b, and Process a are carried out in this order. The method for carrying out Processes c, b, and a is as described in relation to Embodiment 1. As in the production of the information recording medium of Embodiment 1, in the production of this embodiment, the sputtering target used in Process c may be different from that used in Process a. In the producing method of the information recording medium of this embodiment, the order of carrying out each process differs from that in the producing method of the information recording medium of Embodiment 1.

After forming the first dielectric layer 2, the substrate 101 on which the layers from the reflective layer 8 to the first dielectric layer 2 are stacked in order is picked out from the sputtering device. Then, an ultraviolet-curing resin is applied on the first dielectric layer 2, for example, by a spin coat method. The dummy substrate 110 is stuck to the applied ultraviolet-curing resin. An ultraviolet ray is applied from the dummy substrate 110 side to cure the resin, whereby the bonding process is finished. The process for bonding the dummy substrate 110 can be omitted by forming the adhesive layer 9 into thickness of 60 μm to 120 μm and applying an ultraviolet ray thereto.

After finishing the bonding process, the initialization process is conducted if necessary. The method of the initialization process is as described in relation to Embodiment 1.

(Embodiment 5)

Figure 5:
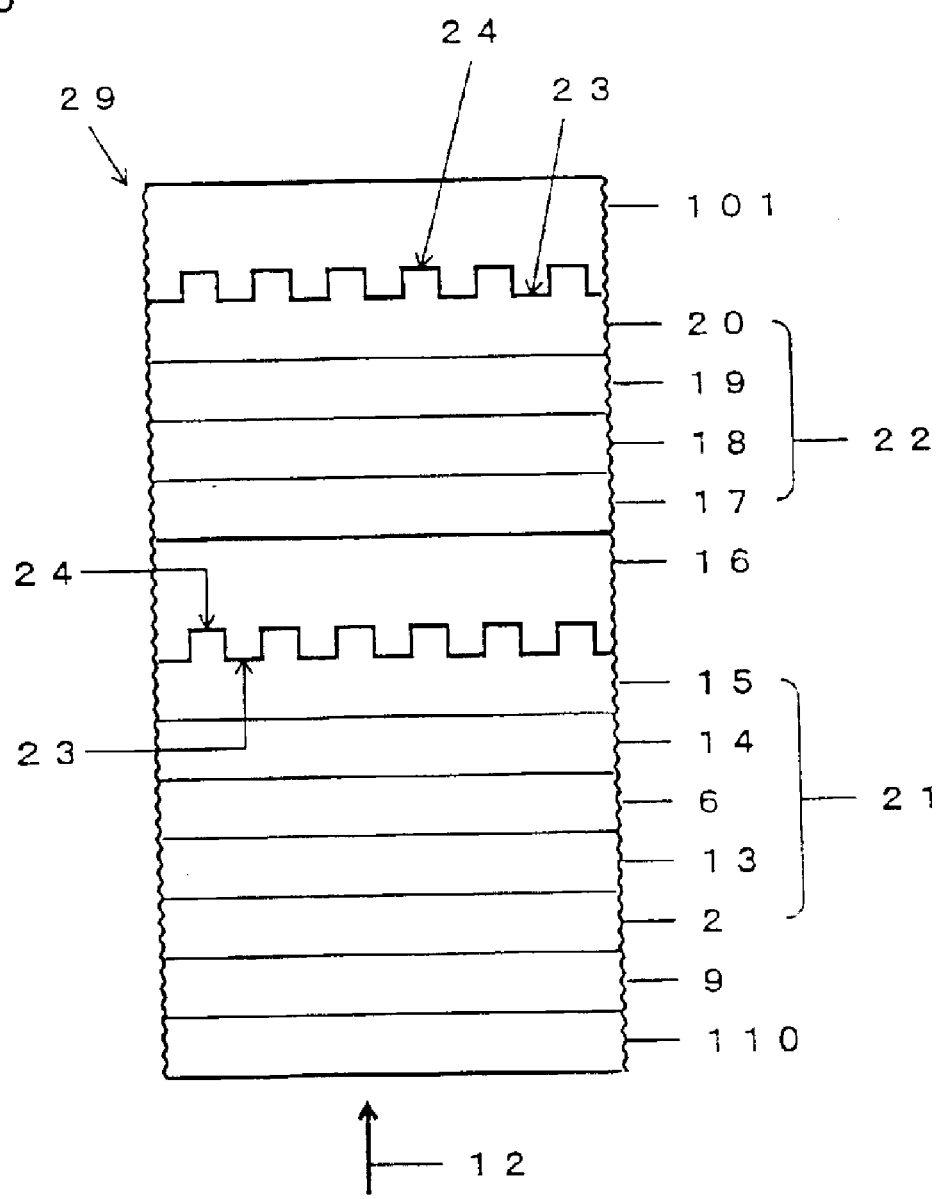
FIG. 5 is a fragmentary sectional view which shows further another example of the optical information recording medium of the invention.

As Embodiment 5, another example of the optical information recording medium on or from which information is recorded or reproduced by using a laser beam, is described. FIG. 5 shows the partial cross section of the optical information recording medium.

The information recording medium 29 shown in FIG. 5 has a constitution in which a second information layer 22, an intermediate layer 16, and a first information layer 21 are formed on one surface of a substrate 101 in this order, and furthermore a dummy substrate 110 is bonded to the first information layer 21 with an adhesive layer 9. In detail, the second information layer 22 is formed by stacking a second reflective layer 20, a fifth dielectric layer 19, a second recording layer 18, and a fourth dielectric layer 17 on one surface of the substrate 101 in this order. The intermediate layer 16 is formed on the surface of the fourth dielectric layer 17. The first information layer 21 is formed by stacking a third dielectric layer 15, a first reflective layer 14, a second dielectric layer 6, a first recording layer 13, and a first dielectric layer 2 on the surface of the intermediate layer 16 in this order. Also in this embodiment, a laser beam 12 is applied from the dummy substrate 110 side. Moreover, in the information recording medium of this embodiment, information can be recorded in each of the two recording layers. Therefore, by employing this constitution, the information recording medium which has about double the capacity of Embodiment 4, can be obtained. Specifically, by employing this constitution, it is possible to obtain a 50 GB information recording medium in which information is recorded by a laser beam with a wavelength of about 405 nm in a bluish-violet wavelength region.

The recording in and reproducing from the first information layer 21 is conducted by the laser beam 12 which has passed through the dummy substrate 110. The recording in and reproducing from the second information layer 22 is conducted by the laser beam 12 which has passed through the dummy substrate 110, the first information layer 21, and the intermediate layer 16.

Also in the information recording medium 29 of the embodiment shown in FIG. 5, the fifth dielectric layer 19, the fourth dielectric layer 17, the second dielectric layer 6, and the first dielectric layer 2 are preferably all a Zr/Hf—Cr—O-based material layer or a Zr/Hf—Cr—Zn—O-based material layer. If those material layers are used, it is not necessary to form an interface layer between the first recording layer 13 and the first dielectric layer 2, between the first recording layer 13 and the second dielectric layer 6, between the second recording layer 18 and the fourth dielectric layer 17, and between the second recording layer 18 and the fifth dielectric layer 19. Since the material for the Zr/Hf—Cr—

O-based material layer or the Zr/Hf—Cr—Zn—O-based material layer is as described in relation to Embodiment 1, the detailed description thereof is omitted.

Each of the fifth dielectric layer 19 and the second dielectric layer 6 serves as a thermal insulating layer between the reflective layer and the recording layer. Therefore, each of the fifth and the second dielectric layers 19 and 6 is preferably the layer which substantially consists of a material expressed with the formula $(MO_2)_X(Cr_2O_3)_Y(SiO_2)_{100-X-Y}$ (i.e. the formula (21)), or the material expressed with the formula $(MO_2)_C(Cr_2O_3)_E(D)_F(SiO_2)_{100-C-E-F}$ (i.e. the formula (3)). Moreover, the film thickness of each of the fifth and the second dielectric layers 19 and 6 is preferably in the range of 3 nm to 50 nm, and more preferably from 10 nm to 30 nm.

The laser beam 12 passes through the fourth dielectric layer 17 and the first dielectric layer 2 before reaching the second recording layers 18 and the first recording layers 13 in the second information layer 22 and the first information layer 21, respectively. Therefore, it is desirable that the fourth and the first dielectric layers 17 and 2 consist of a transparent material with low thermal conductivity. Such material is the material expressed with the above-mentioned formulae (21) or (3). Preferably, the film thickness of each of fourth and the first dielectric layers 17 and 2 is in the range of 30 nm to 100 nm, and more preferably from 50 nm to 80 nm.

Thus, also in the information recording medium of the single-sided dual-layer structure shown in FIG. 5, the Zr/Hf—Cr—O-based material layer or the Zr/Hf—Cr—Zn—O-based material layer makes it possible to form the dielectric layer located on both sides of the recording layer in direct contact with the recording layer without the interface layer. Therefore, according to this invention, the number of the layers which compose the whole medium can be reduced, also as to the information recording medium of the single-sided dual-layer structure. Moreover, by forming the dielectric layer from the above specific material layers, the refractive index and the recording sensitivity of the medium are adjusted so as to be optimized depending on the kind of information recording medium.

The third dielectric layer 15 is located between the intermediate layer 16 and the first reflective layer 14. The third dielectric layer 15 is preferably transparent and has a high refractive index so that it may serve to enhance the transmissivity of the first information layer 21. Moreover, the third dielectric layer 15 preferably consists of the material with higher thermal conductivity so that it serves to diffuse the heat of the first recording layer 13 quickly, like the reflective layer. The material which satisfies these conditions is $TiO_2$-containing material or $Cr_2O_3$-containing material (that is, $TiO_2$-based material or $Cr_2O_3$-based material). Specifically, $TiO_2$-based material (or $Cr_2O_3$-based material) is a material which contains 50 mol % or more $TiO_2$ (or $Cr_2O_3$). $TiO_2$-based material (or $Cr_2O_3$-based material) preferably contains 80 mol % or more $TiO_2$ (or $Cr_2O_3$), and more preferably 90 mol % or more $TiO_2$ (or $Cr_2O_3$). Further, the material expressed with $(MO_2)_N(Cr_2O_3)_{100-N}$ (i.e. the above-mentioned formula (11)) is also preferably used. In the case of forming the third dielectric layer 15 from the material expressed with the formula (11), it is preferable to adjust thermal conductivity by varying the composition on the condition where the ratio of $Cr_2O_3$ is 40 mol % or more. When $TiO_2$-based material or $Cr_2O_3$-based material, or $(MO_2)_N(Cr_2O_3)_{100-N}$ is used, an layer with a large refractive index of 2.4 to 2.8 is obtained. The film thickness of the third dielectric layer 15 is preferably in the range of 10 nm to 30 nm.

The substrate 101 is the same as the substrate 101 of Embodiment 4. Therefore, the detailed description about the substrate 101 is omitted here.

The second reflective layer 20 is the same as the reflective layer 8 of Embodiment 1. Further, the second recording layer 18 is the same as the recording layer 4 of Embodiment 1. Therefore, the detailed description about the second reflective layer 20 and the second recording layer 18 is omitted here.

The intermediate layer 16 is provided in order to make the focal position of the laser beam in the first information layer 21 significantly differ from the focal position in the second information layer 22. In the intermediate layer 16, the guide groove is optionally formed on the first information layer 21 side. The intermediate layer 16 can be formed from an ultraviolet-curing resin. It is desirable that the intermediate layer 16 is transparent with respect to the light of the wavelength λ used for recording and reproducing information so that the laser beam 12 can reach the second information layer 22 efficiently. The thickness of the intermediate layer 16 needs to be equal to or more than the focal depth ΔZ determined by the numerical aperture NA of an objective lens and the laser beam wavelength λ. ΔZ can be approximated to be $\Delta Z=\lambda/\{2(NA)^2\}$. When λ is 405 nm, and NA is 0.85, ΔZ becomes ΔZ=0.28 μm. Further, since the range within ±0.3 μm of this value is included in the range of focal depth, the intermediate layer 16 needs to have a thickness of 0.8 μm or more. Furthermore, the total thickness of the intermediate layer 16 and the dummy substrate 110 is preferably set within a tolerance of substrate thickness acceptable to the objective lens to be used, so that the distance between the first recording layer 13 of the first information layer 21 and second recording layer 18 of the second information layer 22 may be within the range where the objective lens can concentrate light. Therefore, the thickness of the intermediate layer is preferably in the range of 10 μm to 40 μm.

If necessary, the intermediate layer 16 may be constituted by stacking a plurality of resin layers. Specifically, it may have a two-layer structure consisting of a layer which protects the fourth dielectric layer 17, and a layer which has a guide groove.

The first reflective layer 14 serves to diffuse the heat of the first recording layer 13 quickly. When information is recorded in or reproduced from the second information layer 22, the laser beam 12 which has passed through the first information layer 21 is used. For this reason, the first information layer 21 needs to have a high transmissivity as a whole, and preferably has a transmissivity of 45% or more. Therefore, the first reflective layer 14 is limited in the material and the thickness, compared with the second reflective layer 20. In order to decrease optical absorption by the first reflective layer 14, it is desirable that the first reflective layer 14 has a small thickness, a low extinction coefficient, and high thermal conductivity. Specifically, it is preferable that the first reflective layer 14 is made of an alloy containing Ag, and is formed into a film whose thickness is in the range of 5 nm to 15 nm.

In order to ensure the high transmissivity of the first information layer 21, the first recording layer 13 is also limited in the material and film thickness, compared with the second recording layer 18. The first recording layer 13 is preferably formed so that the average of the transmittance of the crystal phase and the transmittance of the amorphous phase becomes 45% or more. Therefore, the film thickness of the first recording layer 13 is preferably 7 nm or less. The material which constitutes the first recording layer 13 is selected so that even if the layer is such a thin film, it is ensured that good record marks are formed by melting and quenching, and thereby the signal with high quality is reproduced, and that record marks are erased by temperature rising and gradual cooling. Specifically, it is preferable to form the first recording layer 13 from a reversible phase change material, for example, Ge—Sb—Te such as GeTe—$Sb_2Te_3$-based material or Ge—Sn—Sb—Te obtained by substituting Sn for part of Ge of GeTe—$Sb_2Te_3$-based material. Ge—Bi—Te such as GeTe—$Bi_2Te_3$-based material, or Ge—Sn—Bi—Te obtained by substituting Sn for part of Ge of Ge—Bi—Te may be used.

The adhesive layer 9 is preferably formed from a transparent ultraviolet-curing resin like the adhesive layer 9 of Embodiment 4. The thickness of the adhesive layer is preferably in the range of 5 to 15 μm.

The dummy substrate 110 is the same as the dummy substrate 110 of Embodiment 4. Therefore, the detailed description about the dummy substrate is omitted here. Also in this embodiment, the dummy substrate 110 can also be omitted, when the adhesive layer 9 also serves as the dummy substrate 110 and can be formed so as to have a thickness of 50 μm to 120 μm.

In the information recording medium of this embodiment, only one dielectric layer of the first, second, fourth and fifth dielectric layers 2, 6, 17, and 19 may be the Zr/Hf—Cr—O-based material layer or the Zr/Hf—Cr—Zn—O-based material layer. Alternatively, two or three dielectric layers may be the Zr/Hf—Cr—O-based material layer or the Zr/Hf—Cr—Zn—O-based material layer. When only one dielectric layer is any one of these material layers, at least one interface layer becomes unnecessary. When two dielectric layers are the Zr/Hf—Cr—O-based material layer or the Zr/Hf—Cr—Zn—O-based material layer, at least two interface layers become unnecessary. Therefore, in the information recording medium of this embodiment, it is possible to eliminate up to four interface layers. The interface layer may be provided between the recording layer and the dielectric layer which is not the Zr/Hf—Cr—O-based material layer nor the Zr/Hf—Cr—Zn—O-based material layer, if necessary.

The information recording medium of a constitution having two information layers each of which has a recording layer is described above. The information recording medium which has a plurality of recording layers is not limited to this constitution. The medium can also have a constitution including three or more information layers. Further, in a variation of the illustrated embodiment, for example, one of the two information layers has one recording layer in which a reversible phase change is generated, and the other has one recording layer in which an irreversible phase change is generated.

Moreover, in a variation of the information recording medium which has three information layers, one is made into the read-only information layer, another has a recording layer in which a reversible phase change is generated, and the other has a recording layer in which an irreversible phase change is generated. Thus, there are many variations of the information recording medium which has two or more information layers. Also in any form, by forming a dielectric layer from a Zr/Hf—Cr—O-based material layer or a Zr/Hf—Cr—Zn—O-based material layer, the need of providing an interface layer between the recording layer and the dielectric layer can be eliminated.

Next, the method for producing the information recording medium 29 of Embodiment 5 is described. The information recording medium 29 is produced by carrying out the process in which the second reflective layer 20 is formed on the substrate 101 (Process j), the process in which the fifth dielectric layer 19 is formed (Process k), the process in which the second recording layer 18 is formed (Process l), and the process in which the fourth dielectric layer 17 is formed (Process m) in this order, and then carrying out the process in which the intermediate layer 16 is formed on the surface of the fourth dielectric layer 17, and further carrying out the process in which the third dielectric layer 15 is formed on the surface of the intermediate layer 16 (Process n), the process in which the first reflective layer 14 is formed (Process o), the process in which the second dielectric layer 6 is formed (Process p), the process in which the first recording layer 13 is formed (Process q), and the process in which the first dielectric layer 2 is formed (Process r) in this order, and furthermore carrying out the process in which the adhesive layer 9 is formed on the surface of the first dielectric layer 2, and the process in which the dummy substrate 110 is bonded.

Processes j to m correspond to the processes for forming the second information layer 22. Process j is a process in which the second reflective layer 20 is formed on the surface of the substrate 101 where the guide groove is formed. Process j is carried out in the same manner as Process e in the production of Embodiment 1. Next, Process k is carried out in order to form the fifth dielectric layer 19 on the surface of the second reflective layer 20. Process k is carried out in the same manner as Process c in the production of Embodiment 1. Next, Process l is carried out to form the second recording layer 18 on the surface of the fifth dielectric layer 19. Process l is carried out in the same manner as Process b in the production of Embodiment 1. Finally, Process m is carried out in order to form the fourth dielectric layer 17 on the surface of the second recording layer 18. Process m is carried out in the same manner as Process a in the production of Embodiment 1.

The substrate 101 on which the second information layer 22 is formed according to Processes j to m is picked out from the sputtering device, and then the intermediate layer 16 is formed. The intermediate layer 16 is formed according to the following procedures. Firstly, an ultraviolet-curing resin is applied to the surface of the fourth dielectric layer 17 by, for example, a spin coat method. Next, a polycarbonate substrate which has on its surface concavities and convexities which are complementary to the guide groove to be formed on the intermediate layer is stuck to the ultraviolet-curing resin with the concavo-convex side in contact with the resin. After applying an ultraviolet ray and curing the resin, the polycarbonate substrate with concavities and convexities is peeled. Thereby, the guide groove which is complementary to the concavities and convexities is formed in the ultraviolet-curing resin, and the intermediate layer 16 which has the illustrated guide groove is formed. Alternatively, the intermediate layer 16 may be formed by forming a layer from an ultraviolet-curing resin which protects the fourth dielectric layer 17, and then forming a layer having a guide groove thereon. In this case, the intermediate layer to be obtained has a two-layer structure. Alternatively, the intermediate layer is formed by stacking three or more layers.

The substrate 101 on which the layers up to the intermediate layer 16 are formed is again placed in a sputtering device, and then the first information layer 21 is formed on the surface of the intermediate layer 16. The processes for forming the first information layer 21 correspond to Processes n to r.

Process n is a process in which the third dielectric layer 15 is formed on the surface of the intermediate layer 16 on which the guide groove is formed. In process n, the sputtering is conducted in an Ar gas atmosphere or in a mixed-gas atmosphere of Ar gas and $O_2$ gas, using a high frequency electric power unit and a sputtering target consisting of $TiO_2$-based material or $Cr_2O_3$-based material. Alternatively, in Process n, the sputtering may be carried out in an Ar gas atmosphere using a sputtering target consisting of a mixture of $MO_2$ (i.e. $ZrO_2$ and/or $HfO_2$) and $Cr_2O_3$. Alternatively, in Process n, a reactive sputtering may be carried out in a mixed-gas atmosphere of Ar gas and $O_2$ gas using a sputtering target consisting of Ti or Cr.

Next, Process o is carried out in order to form the first reflective layer 14 on the surface of the third dielectric layer 15. In Process o, the sputtering is conducted in an Ar gas atmosphere, using a direct current power source and a sputtering target of the alloy containing Ag.

Then, Process p is carried out in order to form the second dielectric layer 6 on the surface of 14 of the first reflective layer 14. Process p is carried out in the same manner as Process k.

Next, Process q is carried out in order to form the first recording layer 13 on the surface of the second dielectric layer 6. In Process q, the sputtering is conducted in an Ar gas atmosphere or in a mixed-gas atmosphere of Ar gas and $N_2$ gas, using a direct current power source and a sputtering target consisting of a material selected from Ge—Sb—Te, Ge—Sn—Sb—Te, Ge—Bi—Te, Ge—Sn—Bi—Te, Ge—Sb—Bi—Te, and Ge—Sn—Sb—Bi—Te.

Next, Process r is carried out in order to form the first dielectric layer 2 on the surface of the first recording layer 13. Process r is carried out in the same manner as Process m. Thus, the first information layer 21 is formed by carrying out Processes n to r in this order.

The substrate 101 on which the first information layer 21 are formed is picked out from the sputtering device. Then, an ultraviolet-curing resin is applied to the surface of the first dielectric layer 2, for example, by a spin coat method. The dummy substrate 110 is stuck to the applied ultraviolet-curing resin. An ultraviolet ray is applied from the dummy substrate 110 side to cure the resin, whereby the bonding process is finished. Also in the producing method of the information recording medium of Embodiment 5, the process of bonding the dummy substrate 110 can also be omitted in the same manner as the producing method of the information recording medium of Embodiment 4.

After finishing the bonding process, the initialization processes of the second information layer 22 and the first information layer 21 is carried out if necessary. The Initialization process of the second information layer 22 may be carried out before or after forming the intermediate layer, and the initialization process of the first information layer 21 may be carried out before or after the bonding process of the dummy substrate 110. The method for carrying out the initialization process is as described in relation to Embodiment 1.

(Embodiment 6)

Figure 6:
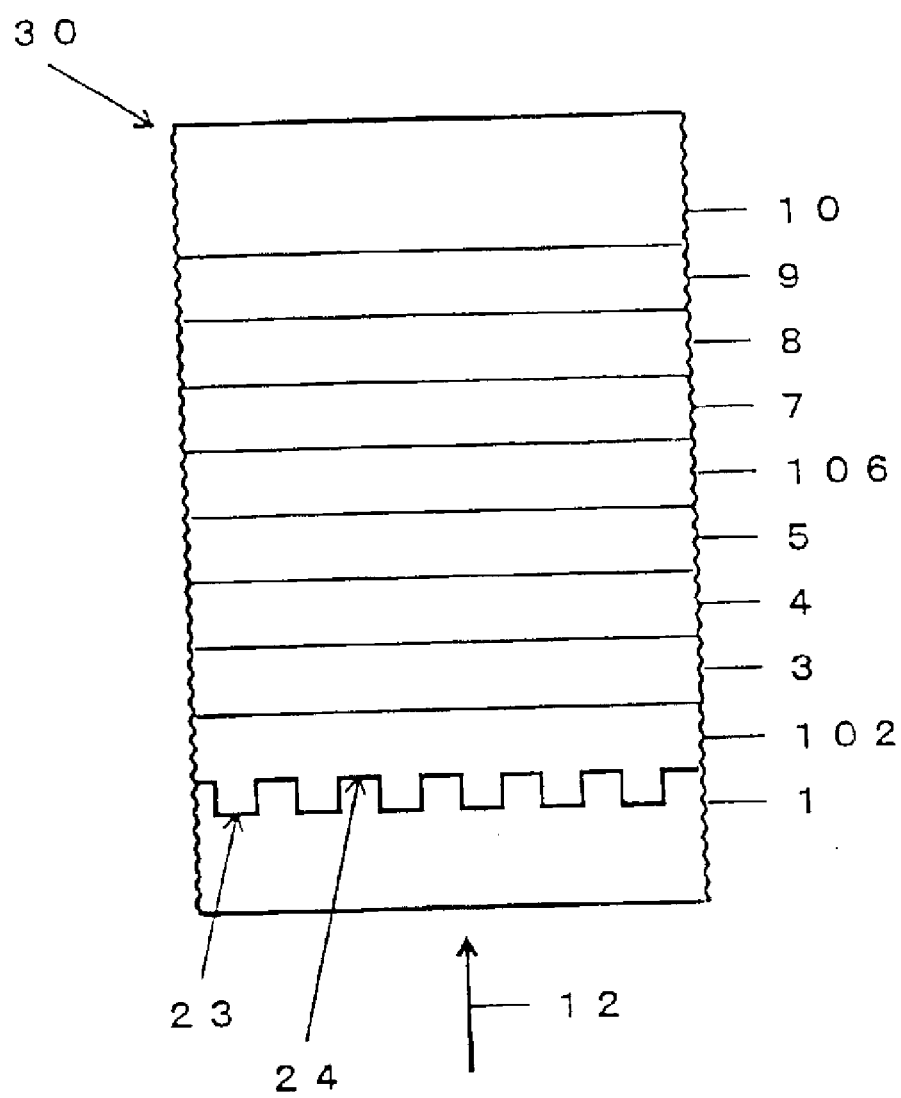
FIG. 6 is a fragmentary sectional view which shows further another example of the optical information recording medium of the invention.

As Embodiment 6, another example of the information recording medium on or from which information is recorded or reproduced by using a laser beam, is described. FIG. 6 shows the partial cross section of the optical information recording medium.

The information recording medium 30 shown in FIG. 6 has a constitution in which a first dielectric layer 102, a first interface layer 3, a recording layer 4, a second interface layer 5, a second dielectric layer 106, an optical compensation layer 7, and a reflective layer 8 are formed on one surface of a substrate 1 in this order, and furthermore a dummy substrate 10 is bonded to the reflective layer 8 with an adhesive layer 9. In the information recording medium 30 shown in FIG. 6, the first and the second interface layers 3 and 5 are a Zr/Hf—Cr—O-based material layer or a Zr/Hf—Cr—Zn—O-based material layer. In addition, in FIG. 6, the reference numerals which are identical to those used in FIG. 1 denote identical components which are formed from the material and by the method described with reference to FIG. 1. Therefore, the detailed description is omitted as to the components already described with reference to FIG. 1.

The information recording medium of this embodiment has a constitution in which the first and the second dielectric layers 102 and 106 are formed from ZnS-20 mol % $SiO_2$ used for the prior art information recording medium. In such constitution, a Zr/Hf—Cr—O-based material layer or a Zr/Hf—Cr—Zn—O-based material layer can be used as the first and second interface layers 3 and 5. The preferable materials for the first and the second interface layers 3 and 5 are the same as that for the first and the second dielectric layers 2 and 6 of Embodiment 1. Therefore, the detailed description about them is omitted. The thickness of each of the first and the second interface layers 3 and 5 is preferably in the range of 1 to 10 nm, and more preferably in the range of about 2 to 7 nm so that recording and erasing characteristic may not be affected. The interface layer which is the Zr/Hf—Cr—O-based material layer or the Zr/Hf—Cr—Zn—O-based material layer has the advantages that cost for the material is inexpensive, the extinction coefficient is low (i.e. transparency is high), and its melting point is high and then it is thermally stable, compared with the prior art interface layer consisting of the nitride containing Ge.

Next, the method for producing the information recording medium 30 of Embodiment 6 is described. The information recording medium 30 is produced by carrying out the process in which the first dielectric layer 102 is formed on the surface of the substrate 1 where the guide groove is formed (Process h), the process in which the first interface layer 3 is formed (Process s), the process in which the recording layer 4 is formed (Process b), the process in which the second interface layer 5 is formed (Process t), the process in which the second dielectric layer 106 is formed (Process g), the process in which the optical compensation layer 7 is formed (Process d), and the process in which the reflective layer 8 is formed (Process e) in this order, and further by carrying out the process in which the adhesive layer 9 is formed on the surface of the reflective layer 8, and the process in which the dummy substrate 10 is bonded. Processes b, d, and e are as described in relation to Embodiment 1, Process g is as described in relation to Embodiment 2, and Process h is as described in relation to Embodiment 3. Therefore, the description of these processes is omitted here.

Process s is a process in which the first interface layer 3 is formed on the surface of the first dielectric layer 102. Process s is carried out in the same manner as Process a in the production of Embodiment 1. Process t is a process in which the second interface layer 5 is formed on the surface of the recording layer 4. Process t is carried out in the same manner as Process c in the production of Embodiment 1.

In the above, the optical information recording media on or from which information is recorded or reproduced by a laser beam are described as embodiments of this invention with reference to FIGS. 1 to 6. The optical information recording medium of this invention is not limited to these embodiments. As long as a Zr/Hf—Cr—O-based material layer or a Zr/Hf—Cr—Zn—O-based material layer is provided, preferably in contact with a recording layer, as one of constitutive layers, the optical information recording medium of this invention may be embodied in other forms. Moreover, the optical information recording medium of this invention is suitable for recording with a laser beam of various wavelengths. Therefore, the optical information recording medium of this invention may be, for example, DVD-RAM or DVD-R on or from which information is recorded or reproduced by a laser beam with a wavelength between 630 and 680 nm, or a large capacity optical disk on or from which information is recorded or reproduced by a laser beam with a wavelength between 400 and 450 nm.

(Embodiment 7)

Figure 8:
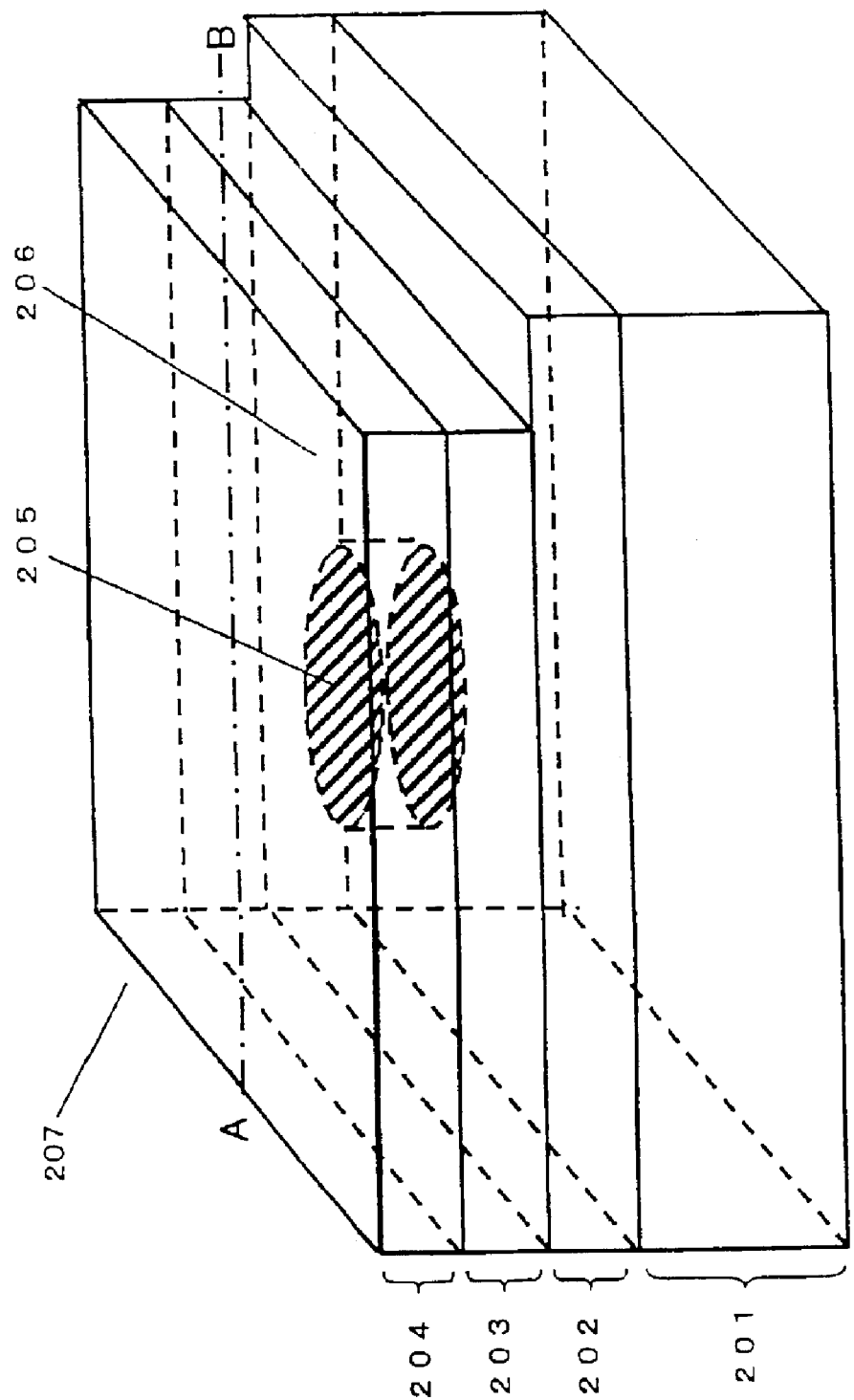
FIG. 8 is a schematic view which shows an example of the information recording medium of the invention on which information is recorded by application of an electric energy.

As Embodiment 7, an example of the information recording medium on or from which information is recorded or reproduced by applying an electric energy, is described. FIG. 8 shows the partial cross section of the information recording medium.

FIG. 8 shows a memory 207 in which a lower electrode 202, a recording part 203, and an upper electrode 204 are formed on the surface of a substrate 201 in this order. The recording part 203 of the memory 207 has a constitution including a column-shaped recording layer 205 and a dielectric layer 206 which encloses the recording layer 205. It differs from the optical information recording media described with reference to FIGS. 1 to 6. In the memory 207 of this embodiment, the recording layer 205 and the dielectric layer 206 are formed on the same surface, and they are not in the laminated relationship. However, since the recording layer 205 and the dielectric layer 206 both constitute part of the multilayered body including the substrate 201, the lower and the upper electrodes 202 and 204 in the memory 207, they can be each referred to as a "layer." Therefore, the information recording medium of this invention also includes an embodiment which has a recording layer and a dielectric layer on the same surface.

As the substrate 201, a semiconductor substrate, such as Si substrate, a polycarbonate substrate, or an insulating substrate such as a $SiO_2$ substrate and an $Al_2O_3$ substrate can be used. The lower electrode 202 and the upper electrode 204 are formed from a suitable electrically conductive material. The lower electrode 202 and the upper electrode 204 are formed by, for example, sputtering a metal such as Au, Ag, Pt, Al, Ti, W, Cr, or a mixture thereof.

The recording layer 205 which constitutes the recording part 203 consists of a material in which the phase change is generated by applying an electric energy. Therefore, the recording layer 205 can be referred to as a "phase-change part." The recording layer 205 is formed from the material in which the phase change between a crystal phase and an amorphous phase is caused by the Joule heat generated by applying an electric energy. As the material for the recording layer 205, for example, Ge—Sb—Te, Ge—Sn—Sb—Te, Ge—Bi—Te, Ge—Sn—Bi—Te, Ge—Sb—Bi—Te and Ge—Sn—Sb—Bi—Te-based material is used, and more specifically, a GeTe—$Sb_2Te_3$-based material or a GeTe—$Bi_2Te_3$-based material is used.

The dielectric layer 206 which constitutes the recording part 203 serves to prevent the current which flows the recording layer 205 by applying a voltage between the upper electrode 204 and the lower electrode 202, from escaping to the periphery part, and to insulate the recording layer 205 electrically and thermally. Therefore, the dielectric layer 206 can be also referred to as a "thermal insulating part." The dielectric layer 206 is a Zr/Hf—Cr—O-based material layer or a Zr/Hf—Cr—Zn—O-based material layer. Specifically, the layer is one which substantially consists of the material expressed with the above-mentioned formula (1), (11), (2), (21), (22), (3), or (31). The Zr/Hf—Cr—O-based material layer or the Zr/Hf—Cr—Zn—O-based material layer is preferably used because it has a high melting point, atoms in the material layer are difficult to diffuse even when the material is heated, and it has low thermal conductivity.

This memory 207 is further explained together with the operation method in the below-mentioned Examples.

EXAMPLES (Test 1)

First, the relationship of nominal composition among a Zr/Hf—Cr—O-based sputtering target used in the producing method of the information recording medium of this invention (in other words, the composition which a target manufacturer indicates in public when they provide it), its analyzed composition, and the analyzed composition of the Zr/Hf—Cr—O-based material layer formed by using this target, was examined. In Test 1, sputtering targets made of $ZrO_2$—$Cr_2O_3$-based material and sputtering targets made of $HfO_2$—$Cr_2O_3$-based material were subjected to the test.

(Test 1-1)

In this test, the composition of sputtering targets consisting of $ZrO_2$—$Cr_2O_3$-based material which was one of Zr/Hf—Cr—O-based materials was analyzed in order to investigate the difference between the nominal composition and the analyzed composition. More specifically, two kinds of sputtering targets of which nominal composition was indicated with the formula:

$$(ZrO_2)_n(Cr_2O_3)_{100-n}(\text{mol \%}) \tag{110}$$

were analyzed by a X-ray-microanalyser method. In this test, the sputtering targets which contains $ZrO_2$ as $MO_2$ was used. The values of "n" of the two targets were different from each other, one being n=20 and the other being n=80. The targets were powdered for the analysis. As a result, the analyzed composition of the sputtering targets was obtained not as the compound (i.e. oxide)-based composition formula that is expressed with the ratio of compounds, but as the elementary composition formula (10):

$$Zr_JCr_KO_{100-J-K}(\text{atomic \%}) \tag{10}.$$

The analyzed composition of each target is shown in Table 1-1. Further, by theoretical calculation, the converted elementary composition was calculated from the nominal composition (mol %). The reduced composition (atomic %) is also shown in Table 1-1.

TABLE 1-1

| Sputtering Target | | Dielectric Layer |
|---|---|---|
| Nominal Composition $(ZrO_2)_n(Cr_2O_3)_{100-n}$ (mol %) (= Reduced Composition (at. %)) | Analyzed Composition $Zr_JCr_KO_{100-J-K}$ (at. %) | Analyzed Composition $Zr_QCr_RO_{100-Q-R}$ (at. %) |
| $(ZrO_2)_{20}(Cr_2O_3)_{80}$ (= $Zr_{4.3}Cr_{34.8}O_{60.9}$) | $Zr_4Cr_{35}O_{61}$ | $Zr_{4.5}Cr_{34.5}O_{61}$ |
| $(ZrO_2)_{80}(Cr_2O_3)_{20}$ (= $Zr_{23.5}Cr_{11.8}O_{64.7}$) | $Zr_{23}Cr_{12}O_{65}$ | $Zr_{23.4}Cr_{11.8}O_{64.8}$ |

(Test 1-2)

In this test, the composition of sputtering targets consisting of $HfO_2$—$Cr_2O_3$-based material which is one of Zr/Hf—Cr—O-based materials was analyzed. This test was conducted in the same manner as Test 1-1 using two kinds of sputtering targets of which nominal composition was indicated with the formula:

$$(HfO_2)_n(Cr_2O_3)_{100-n}(\text{mol \%}) \tag{110}.$$

The analyzed composition and the reduced composition of each target are shown in Table 1-2

TABLE 1-2

| | Sputtering Target | Dielectric Layer |
|---|---|---|
| Nominal Composition $(HfO_2)_n(Cr_2O_3)_{100-n}$ (mol %) (= Reduced Composition (at. %)) | Analyzed Composition $Hf_JCr_KO_{100-J-K}$ (at. %) | Analyzed Composition $Hf_QCr_RO_{100-Q-R}$ (at. %) |
| $(HfO_2)_{20}(Cr_2O_3)_{80}$ (= $Hf_{4.3}Cr_{34.8}O_{60.9}$) | $Hf_{3.9}Cr_{35.1}O_{61}$ | $Hf_4Cr_{34.5}O_{61.5}$ |
| $(HfO_2)_{80}(Cr_2O_3)_{20}$ (= $Hf_{23.5}Cr_{11.8}O_{64.7}$) | $Hf_{23.7}Cr_{12}O_{64.3}$ | $Hf_{23.8}Cr_{12}O_{64.2}$ |

As shown in Table 1-1, as a result of analysis of the powder of the sputtering target of which nominal composition is indicated by the formula (110) wherein M is Zr i.e. $(ZrO_2)_n(Cr_2O_3)_{100-n}$ (mol %), analyzed composition of $Zr_4Cr_{35}O_{61}$ (atomic %) was obtained as to the target of n=20, and analyzed composition of $Zr_{23}Cr_{12}O_{65}$ (atomic %) was obtained as to the target of n=80. As shown in Table 1-2, as a result of analysis of the powder of the sputtering target of which nominal composition is indicated by the formula (110) wherein M is Hf i.e. $(HfO_2)_n(Cr_2O_3)_{100-n}$ (mol %), analyzed composition of $Hf_{3.9}Cr_{35.1}O_{61}$ (atomic %) was obtained as to the target of n=20, and analyzed composition of $Zr_{23.7}Cr_{12}O_{64.3}$ (atomic %) was obtained as to the target of n=80. Each of these analyzed compositions was substantially equal to the reduced composition (atomic %) of the nominal composition (mol %). Therefore, it was found that when the target composition is indicated with the formula (110) i.e. $(MO_2)_n(Cr_2O_3)_{100-n}$ (mol %) wherein M represents at least one element selected from Zr and Hf and "n" satisfies $20 \leq n \leq 80$, its elementary composition is expressed with the formula (10), i.e. $M_JCr_KO_{100-J-K}$ (atomic %) wherein M represents at least one element selected from Zr and Hf, j and K satisfy $3 \leq J \leq 24$, $11 \leq K \leq 36$, and $34 \leq J+K \leq 40$.

Next, a Zr/Hf—Cr—O-based material layer was formed as a dielectric layer by a sputtering method using each sputtering target of which nominal composition (mol %) was as the above, and then, analyzed by a X-ray microanalyser method. Consequently, the analyzed composition of each dielectric layers was obtained as not the oxide-based composition formula (11):

$$(MO_2)_N(Cr_2O_3)_{100-N} (mol\ \%) \qquad (11)$$

but as the elementary composition formula (1):

$$M_QCr_RO_{100-Q-R} (atomic\ \%) \qquad (1).$$

The analyzed composition of each dielectric layer (Zr/Hf—Cr—O-based material layer) is shown in Tables 1-1 and 1-2.

In this test, the dielectric layer was formed into 500 nm thick on a Si substrate by sputtering. In the sputtering process, the sputtering target (of 100 mm diameter and 6 mm thickness) of which nominal composition was as shown in Tables 1-1 and 1-2 was set in a conventional film-forming device (sputtering device). The sputtering is carried out in an atmosphere of Ar gas (100%) under conditions of a power of 500 W and a pressure of 0.13 Pa using a high frequency electric power unit.

The analyzed composition of the dielectric layer formed by sputtering using the sputtering target which was indicated by the formula (110), i.e. $(MO_2)_n(Cr_2O_3)_{100-n}$ (mol %) was very close to both of the reduced composition and the analyzed composition of the sputtering target.

Therefore, it is desirable that Q and R in the formula (1) of the analyzed composition of a dielectric layer satisfy $3 \leq Q \leq 24$, $11 \leq R \leq 36$, and $34 \leq Q+R \leq 40$ like J and K in the formula (10) of the analyzed composition of a sputtering target. However, the composition of a dielectric layer may vary from another even when the same sputtering target is used, depending on the structure of a film-forming device, film-forming conditions, the size of a sputtering target, the composition of an atmosphere gas and so on. Considering such possibility of such variation, Q and R in the above-mentioned formula (1) preferably satisfy $0<Q \leq 30$, $7<R \leq 37$, and $20 \leq Q+R \leq 60$, and more preferably $3 \leq Q \leq 24$, $11 \leq R \leq 36$, and $34 \leq Q+R \leq 40$.

Generally, it is considered that M (i.e. one of Zr and Hf) and Cr detected by the analysis of the dielectric layer each exist stably in the dielectric layer in the form of $MO_2$ (i.e. $ZrO_2$ or $HfO_2$) and $Cr_2O_3$. Therefore, as shown in this test, when contents of M and Cr detected by the analysis of a sputtering target are substantially equal to the contents of M and Cr detected by the analysis of a dielectric layer, it is considered that the nominal composition (mol %) of a sputtering target is the same as that of the composition (mol %) of a dielectric layer formed by a sputtering method using this sputtering target. Consequently, it is considered that a dielectric layer (a Zr/Hf—Cr—O-based material layer) formed by a sputtering method using a sputtering target of which nominal composition is indicated by the formula (110), i.e. $(MO_2)_n(Cr_2O_3)_{100-n}$ (mol %), is expressed with the formula (11), i.e. $(MO_2)_N(Cr_2O_3)_{100-N}$ (mol %), and that "N" here is substantially the same as "n" in formula (110).

(Test 2)

In this test, the composition of each sputtering target consisting of one of the $ZrO_2$—$Cr_2O_3$—$SiO_2$-based material and $HfO_2$—$Cr_2O_3$—$SiO_2$-based material each of which was one of Zr/Hf—Cr—O-based material was analyzed, and the difference between the nominal composition and the analyzed composition was investigated like Test 1.

(Test 2-1)

Three kinds of sputtering targets of which nominal composition was indicated with the formula (210):

$$(ZrO_2)_x(Cr_2O_3)_y(SiO_2)_{100-x-y} (mol\ \%) \qquad (210).$$

were analyzed. The three kinds of sputtering targets have different values of x and y (x=20 and y=60; x=70 and y=20; x=30 and y=30). The target were powdered for the analysis. As a result, the analyzed composition of each sputtering target was not obtained as the oxide-based composition formula (210), but as the elementary composition formula (20):

$$Zr_GCr_HSi_LO_{100-G-H-L} (atomic\ \%) \qquad (20).$$

The analyzed composition of each target is shown in Table 2-1. Moreover, the reduced elementary composition (atomic %) calculated from the nominal composition of the sputtering targets is also shown in Table 2-1. In the reduced composition shown in Table 2-1, the total of the ratios of all elements is not 100% for every target. This is because the reduced composition was obtained by rounding calculation.

TABLE 2-1

| Sputtering Target | | Dielectric Layer |
|---|---|---|
| Nominal Composition $(ZrO_2)_x(Cr_2O_3)_y(SiO_2)_{100-x-y}$ (mol %) (= Reduced Composition (at. %)) | Analyzed Composition $Zr_G Cr_H Si_L O_{100-G-H-L}$ (at. %) | Analyzed Composition $Zr_U Cr_V Si_T O_{100-U-V-T}$ (at. %) |
| $(ZrO_2)_{20}(Cr_2O_3)_{60}(SiO_2)_{20}$ (= $Zr_{4.8}Cr_{28.6}Si_{4.8}O_{61.9}$) | $Zr_{4.8}Cr_{29}Si_{4.5}O_{61.7}$ | $Zr_{5.1}Cr_{28.5}Si_{4.8}O_{61.6}$ |
| $(ZrO_2)_{70}(Cr_2O_3)_{20}(SiO_2)_{10}$ (= $Zr_{20.6}Cr_{11.8}Si_{2.9}O_{64.7}$) | $Zr_{20.6}Cr_{11.8}Si_{2.5}O_{65.1}$ | $Zr_{21}Cr_{11.4}Si_{2.8}O_{64.8}$ |
| $(ZrO_2)_{30}(Cr_2O_3)_{30}(SiO_2)_{40}$ (= $Zr_{8.3}Cr_{16.7}Si_{11.1}O_{63.9}$) | $Zr_8Cr_{17}Si_{11}O_{64}$ | $Zr_{8.3}Cr_{16.5}Si_{11.3}O_{63.9}$ |

(Test 2-2)

Three kinds of sputtering targets of which nominal composition was indicated with the formula (210):

$$(HfO_2)_x(Cr_2O_3)_y(SiO_2)_{100-x-y} \text{ (mol \%)} \quad (210).$$

were analyzed. The three kinds of sputtering targets have different values of x and y (x=20 and y=60; x=70 and y=20; x=30 and y=30). The test was conducted in the same manner as Test 2-1. The analyzed composition and the reduced composition of each target are shown in Table 2-2

TABLE 2-2

| Sputtering Target | | Dielectric Layer |
|---|---|---|
| Nominal Composition $(HfO_2)_x(Cr_2O_3)_y(SiO_2)_{100-x-y}$ (mol %) (= Reduced Composition (at. %)) | Analyzed Composition $Hf_G Cr_H Si_L O_{100-G-H-L}$ (at. %) | Analyzed Composition $Hf_U Cr_V Si_T O_{100-U-V-T}$ (at. %) |
| $(HfO_2)_{20}(Cr_2O_3)_{60}(SiO_2)_{20}$ (= $Hf_{4.8}Cr_{28.6}Si_{4.8}O_{61.9}$) | $Hf_{5.0}Cr_{28.3}Si_{5.1}O_{61.6}$ | $Hf_{4.8}Cr_{29.0}Si_{4.8}O_{61.4}$ |
| $(HfO_2)_{70}(Cr_2O_3)_{20}(SiO_2)_{10}$ (= $Hf_{20.6}Cr_{11.8}Si_{2.9}O_{64.7}$) | $Hf_{20.9}Cr_{12.0}Si_{2.4}O_{64.7}$ | $Hf_{20.9}Cr_{11.4}Si_{3.0}O_{64.7}$ |
| $(HfO_2)_{30}(Cr_2O_3)_{30}(SiO_2)_{40}$ (= $Hf_{8.3}Cr_{16.7}Si_{11.1}O_{63.9}$) | $Hf_{7.9}Cr_{16.5}Si_{11.3}O_{64.3}$ | $Hf_{8.6}Cr_{17.0}Si_{10.6}O_{63.8}$ |

As shown in Table 2-1, as a result of analysis of the powder of the sputtering target of which nominal composition indicated by the formula (210) wherein M is Zr, i.e. $(ZrO_2)_x(Cr_2O_3)_y(SiO_2)_{100-x-y}$ (mol %), analyzed composition of $Zr_{4.8}Cr_{29}Si_{4.5}O_{61.7}$ (atomic %) was obtained as to the target of x=20 and y=60, and analyzed composition of $Zr_{20.6}Cr_{11.8}Si_{2.5}O_{65.1}$ (atomic %) was obtained as to the target of x=70 and y=20, and analyzed composition of $Zr_8Cr_{17}Si_{11}O_{64}$ (atomic %) was obtained as to the target of x=30 and y=30. As shown in Table 2-2, as a result of analysis of the powder of the sputtering target of which nominal composition indicated by the formula (210) wherein M is Hf, i.e. $(HfO_2)_x(Cr_2O_3)_y(SiO_2)_{100-x-y}$ (mol %), analyzed composition of $Hf_{5.0}Cr_{28.3}Si_{5.1}O_{61.6}$ (atomic %) was obtained as to the target of x=20 and y=60, and analyzed composition of $Hf_{20.9}Cr_{12.0}Si_{2.4}O_{64.7}$ (atomic %) was obtained as to the target of x=70 and y=20, and analyzed composition of $Hf_{7.9}Cr_{16.5}Si_{11.3}O_{64.3}$ (atomic %) was obtained as to the target of x=30 and y=30. Each of these analyzed compositions was substantially equal to the reduced composition (atomic %) of the nominal composition (mol %). Therefore, it was found that when the target is indicated with the formula (210), i.e. $(MO_2)_x(Cr_2O_3)_y(SiO_2)_{100-x-y}$ (mol %) and x and y satisfy $60 \leq x+y \leq 90$, $20 \leq x \leq 70$, and $20 \leq y \leq 60$, its elementary composition is expressed with the formula (20), i.e. $M_G Cr_H Si_L O_{100-G-H-L}$ (atomic %) in which M represents at least one element selected from Zr and Hf, G, H and L satisfy $4 \leq G \leq 21$, and $11 \leq H \leq 30$, $2 \leq L \leq 12$, and $34 \leq G+H+L \leq 40$.

Next, a Zr/Hf—Cr—O-based material layer was formed as a dielectric layer by a sputtering method using each of six sputtering targets of which nominal composition was shown in Tables 2-1 and 2-2. The analysis is carried out in the same manner as Test 1. Consequently, the analyzed composition of the dielectric was obtained as not the oxide-based composition formula (21):

$$(MO_2)_X(Cr_2O_3)_Y(SiO_2)_{100-X-Y} \text{(mol \%)} \quad (21).$$

but as the elementary composition formula (2):

$$M_U Cr_V Si_T O_{100-U-V-T} \text{(atomic \%)} \quad (2).$$

The analyzed composition of the dielectric layers (Zr/Hf—Cr—O-based material layers) is shown in Tables 2-1 and 2-2.

In this test, the dielectric layer was formed into 500 nm thick on a carbon (C) substrate by sputtering using the target with the nominal composition shown in Tables 2-1 and 2-2 under the sputtering conditions which were the same as those employed in Test 1.

The analyzed composition of the dielectric layer formed by a sputtering method using the sputtering target which was indicated by the formula (210), i.e. $(MO_2)_x(Cr_2O_3)_y(SiO_2)_{100-x-y}$ (mol %), was very close to both the reduced composition of the sputtering target, and the analyzed composition similarly to Test 1.

Therefore, it is desirable that U, V and T in the formula (2) of the analyzed composition of a dielectric layer satisfy $4 \leq U \leq 21$, $11 \leq V \leq 30$, $2 \leq T \leq 12$, and $34 \leq U+V+T \leq 40$ like G, H and L in the formula (20) of the analyzed composition of a sputtering target. However, considering the possibility mentioned in relation to Test 1, U, V and T in above-mentioned formula (2) preferably satisfy $0 \leq U \leq 30$, $7 < V \leq 37$, $0 < T \leq 14$, and $20 \leq U+V+T \leq 60$, and more preferably $4 \leq U \leq 21$, $11 \leq V \leq 30$, $2 \leq T \leq 12$, and $34 \leq U+V+T \leq 40$.

Generally, it is considered that M (i.e. one of Zr and Hf), Cr and Si detected by the analysis of the dielectric layer exist stably in a dielectric layer in the form of $MO_2$ (i.e. $ZrO_2$ or $HfO_2$), $Cr_2O_3$, and $SiO_2$ respectively. Therefore, from the same consideration as that in Test 1, it is considered that a dielectric layer (a Zr/Hf—Cr—O-based material layer) formed by a sputtering method using a sputtering target of which nominal composition is indicated by the formula (210), i.e. $(MO_2)_x(Cr_2O_3)_y(SiO_2)_{100-x-y}$ (mol %) is expressed with the formula (21) of $(MO_2)_X(Cr_2O_3)_Y(SiO_2)_{100-X-Y}$ (mol %), and that X and Y are substantially the same as x and y in the formula (210).

According to the result of Tests 1 and 2, the reduced composition obtained from the nominal composition of a sputtering target was very close to an analyzed composition of the sputtering target. Moreover, the reduced composition was close to the analyzed composition of a dielectric layer as long as the Zr/Hf—Cr—O-based material layer is formed under the conditions employed by the inventors. Therefore, the reduced composition of a sputtering target (atomic %) can be substantially regarded as the composition (atomic %) of a dielectric layer which is formed by sputtering using the target. Further, as long as the Zr/Hf—Cr—O-based material layer is formed under the conditions employed by the inventors, the nominal composition of the sputtering target (mol %) can be substantially regarded as the composition (mol %) of the dielectric layer.

Tests 1 and 2 were conducted as to the Zr—Cr—O-based material layer and Hf—Cr—O-based material layer. It is considered that the same results will be obtained as to a Zr—Hf—Cr—O-based material layer, Zr—Cr—Zn—O-based material layer, Hf—Cr—Zn—O-based material layer and Zr—Hf—Cr—Zn—O-based material layer.

Therefore, in the following examples, the composition of a sputtering target is expressed with the nominal composition (mol %). Further, unless otherwise indicated, the composition (mol %) of a Zr/Hf—Cr—O-based material layer or a Zr/Hf—Cr—Zn—O-based material layer formed by a sputtering method using a sputtering target is regarded as that of the sputtering target. In the following examples, the compositions of a sputtering target, a Zr/Hf—Cr—O-based material layer and a Zr/Hf—Cr—Zn—O-based material layer are indicated only by compound-based composition formula (mol %), respectively. However, one skilled in the art will easily convert such composition (mol %) to the elementary composition (atomic %).

Example 1

In Example 1, as a preliminary test leading to this invention, information recording mediums, which each had a constitution similar to the information recording medium 25 described in Embodiment 1 with reference to FIG. 1, were produced while varying a material for a first and a second dielectric layers as shown in Table 3. In each medium, the first dielectric layer and the second dielectric layer were made of a material having the same composition.

Hereafter, the producing method of the information recording medium is explained. For ease in understanding, each of the elements is identified by the same reference number as that which identifies each element constituting the information recording medium 25 as shown in FIG. 1. Similarly, with respect to information recording mediums of the following examples, each element is identified by the same reference number as that which identifies each of the elements composing the corresponding information recording medium.

Firstly, a disc-shaped polycarbonate substrate having a diameter of 120 mm and a thickness of 0.6 mm was prepared as a substrate 1. A guide groove was previously provided on one side of the polycarbonate substrate with a depth of 56 nm and a track pitch (i.e. a distance between centers of a groove surface 23 and a land surface 24 in a plane parallel to the principal surface of the substrate) of 0.615 µm.

On this substrate 1, the first dielectric layer 2 of $(ZnS)_{80}(SiO_2)_{20}$ (mol %) with a thickness of 150 nm, a recording layer 4 of $Ge_{27}Sn_8Sb_{12}Te_{53}$ (atomic %) with a thickness of 9 nm, the second dielectric layer 6 of $(ZnS)_{80}(SiO_2)_{20}$ (mol %) with a thickness of 50 nm, an optical compensation layer 7 of $Ge_{80}Cr_{20}$ (atomic %) with a thickness of 40 nm, and a reflective layer 8 of Ag—Pd—Cu with a thickness of 80 nm were formed into films in order by a sputtering method as follows.

In a process for forming the first dielectric layer 2, a sputtering target (a diameter of 100 mm and a thickness of 6 mm) which had a composition of $(ZnS)_{80}(SiO_2)_{20}$ (mol %) was attached to a film-forming device, and then a high frequency sputtering was carried out with a power of 400 W while introducing a mixed gas of Ar gas (97%) and $O_2$ gas (3%). A pressure during the sputtering was set at about 0.13 Pa.

In a process for forming the recording layer 4, a sputtering target (a diameter of 100 mm, a thickness of 6 mm) made of a Ge—Sn—Sb—Te-based material obtained by substituting Sn for a part of Ge in a $GeTe$—$Sb_2Te_3$ pseudo-binary system composition was attached to the film-forming device, and then a DC (direct current) sputtering was carried out with a power of 100 W while introducing a mixed gas of Ar gas (97%) and $N_2$ gas (3%). A pressure during the sputtering was set at about 0.13 Pa.

A process for forming the second dielectric layer 6 was carried out in the same manner as the process for forming the first dielectric layer except for its thickness. As a result, the first dielectric layer 2 and the second dielectric layer 6 had substantially the same composition.

In a process for forming the optical compensation layer 7, a sputtering target (a diameter of 100 mm, a thickness of 6 mm) made of a material having a composition of $Ge_{80}Cr_{20}$ (atomic %) was attached to the film-forming device, and then a DC sputtering was carried out with a power of 300 W while introducing Ar gas (100%). The pressure during the sputtering was set at about 0.4 Pa.

In a process for forming the reflective layer 8, a sputtering target (a diameter of 100 mm, a thickness of 6 mm) made of a material having a composition of Ag—Pd—Cu was attached to the film-forming device and then a DC sputtering was carried out with a power of 200 W while introducing Ar gas (100%). The pressure during the sputtering was set at about 0.4 Pa.

After the first dielectric layer 2, the recording layer 4, the second dielectric layer 6, the optical compensation layer 7, and the reflective layer 8 were formed into films in order on the substrate 1 as described above to obtain a multilayered structure, an ultraviolet-curing resin was applied to the reflective layer 8. A disc-shaped polycarbonate substrate of a diameter of 120 mm and a thickness of 0.6 mm as a dummy substrate 10 was stuck on the applied ultraviolet-curing resin. Then, an ultraviolet ray was applied from the dummy substrate 10 side to cure the resin. Thereby, an adhesive layer 9 consisting of the cured resin with a thickness of 30 µm was formed, while the dummy substrate 10 was laminated to the multilayered structure with the adhesive layer 9.

After laminating the dummy substrate 10, an initialization process was carried out. In the initialization process, a semiconductor laser with a wavelength of 810 nm was used and the recording layer 4 in a substantially whole annular area ranging from 22 to 60 mm in a radial direction of the information recording medium 25 was crystallized. In this manner, the initialization process was completed, and thereby the production of information recording medium 25 of Sample No. 1-1 was finished.

Furthermore, information recording mediums 25 of Sample Nos. 1-2 to 1-19, which each had a constitution similar to the information recording medium 25 of Sample No. 1-1, except that a material for the first dielectric layer 2 and the second dielectric layer 6 was a material shown in Table 3, were produced. These information recording mediums 25 were produced in the same manner the information recording medium 25 of Sample No. 1-1 described above except for a process for forming the first dielectric layer and the second dielectric layer.

In order to produce the information recording mediums 25 of Sample Nos. 1-2 to 1-19, sputtering targets (a diameter of 100 mm and a thickness of 6 mm for each) which material had a composition of $SiO_2$, ZnS, $(ZnSe)_{80}(SiO_2)_{20}$ (mol %), ZnSe, $(ZnO)_{80}(SiO_2)_{20}$ (mol %), ZnO, $Cr_2O_3$, $(Cr_2O_3)_{50}(SiO_2)_{50}$ (mol %), $ZrO_2$, $ZrSiO_4$, $(ZrO_2)_{80}(SiO_2)_{20}$ (mol %), $Ge_{90}Cr_{10}$ (atomic %), $(Bi_2O_3)_{80}(SiO_2)_{20}$ (mol %), $TeO_2$, $(TeO_2)_{80}(SiO_2)_{20}$, $HfO_2$, $HfSiO_4$, or $(HfO_2)_{80}(SiO_2)_{20}$ (mol %) were respectively used in the processes for forming the first dielectric layer 2 and the second dielectric layer 6.

In addition, a power was adjusted depending on the melting point of a material used as the sputtering target. More specifically, it was set at 1 kW for Sample No. 1-2. For Sample Nos. 1-3 to 1-7, it was set at 400 W like in the case of Sample No. 1-1. It was set at 500 W for Sample Nos. 1-8 to 1-12 and Nos. 1-17 to 1-19. It was set at 300 W for Sample No. 1-13. It was set at 200 W for Sample Nos. 1-14 to 1-16. A pressure during the sputtering was set at about 1.33 Pa for Sample No. 1-13, and it was set at about 0.13 Pa for other samples like in the case of Sample No. 1-1. As a gas which was introduced into the film-forming device, a mixed gas of Ar gas (97%) and $O_2$ gas (3%) was used for Sample Nos. 1-2 and 1-14 to 1-16 like in the case of Sample No. 1-1, and Ar gas (100%) was used for Sample Nos. 1-3 to 1-12 and Sample Nos. 1-17 to 1-19, and a mixed gas of Ar gas (60%) and $N_2$ gas (40%) was used for Sample No. 1-13.

In the case of the information recording medium of Sample No. 1-13, the dielectric layer of Ge—Cr—N was formed in the processes for forming the first and the second dielectric layers by reacting $N_2$ in the mixed gas with Ge and Cr which were sputtered from the sputtering target. In the case of other samples, the formed dielectric layer was considered to have substantially the same composition as that of the used sputtering target.

Figure 10:
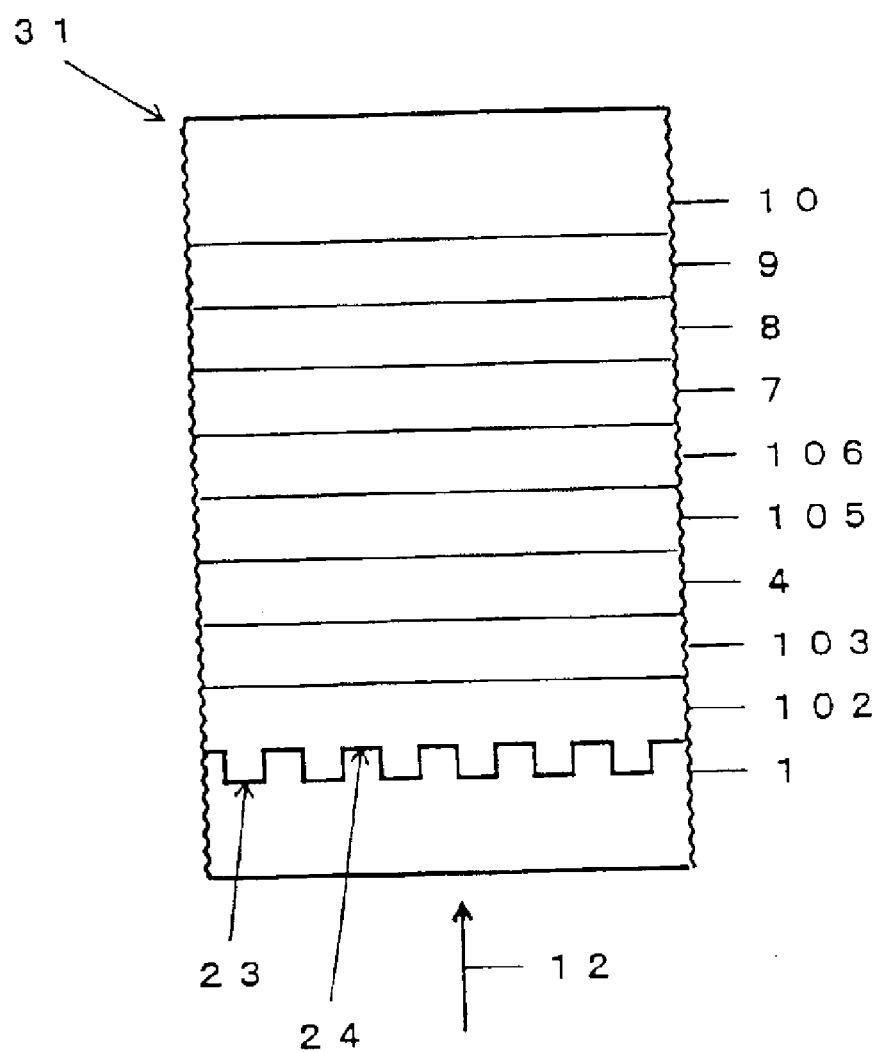
FIG. 10 is a fragmentary sectional view which shows an example of the prior art information recording medium.

For the purpose of comparison, an information recording medium 31 having the structure in the prior art as shown in FIG. 10, which has a first interface layer 103 and a second interface layer 105 respectively between a first dielectric layer 102 and a recording layer 4, and between a second dielectric layer 106 and the recording layer 4, was produced. Each of the first interface layer 103 and the second interface layer 105 was a layer with a thickness of 5 nm which consisted of Ge—Cr—N.

The information recording medium 31 having the structure in the prior art was produced under a condition similar to that employed in the production of the information recording medium of Sample No. 1-1 except that the first interface layer 103 and the second interface layer 105 were formed. In a process for forming the first interface layer 103, a sputtering target (a diameter of 100 mm, a thickness of 6 mm) which material had a composition of $Ge_{90}Cr_{10}$ (atomic %) was attached to the film-forming device, and then a high frequency sputtering was carried out with a power of 300 W under a pressure of about 1.33 Pa while introducing a mixed gas of Ar gas (60%) and $N_2$ gas (40%). As a result, $N_2$ in the mixed gas was reacted with Ge and Cr which were sputtered from the sputtering target, and thereby a Ge—Cr—N layer was formed as the first interface layer 103. A process for forming the second interface layer 105 was also conducted under a condition similar to this.

As to the information recording mediums 25 of Sample Nos. 1-1 to 1-19 and the information recording medium 31 of Comparative Sample (prior art) thus obtained, adhesiveness of the dielectric layer and overwrite cycle-ability of the information recording medium were evaluated. As mentioned below, adhesiveness was evaluated based on the occurrence of delamination. Overwrite cycle-ability was evaluated based on the number of overwrite cycles. These results are shown in Table 3. Please note that neither the information recording mediums 25 of Sample Nos. 1-1 to 1-19, nor the information recording medium 31 of Comparative Sample were in the scope of this invention.

The evaluation of adhesiveness of the dielectric layer in the case of the information recording medium 25 was based on the delamination under a condition of a high humidity and a high temperature. Specifically, the information recording medium 25 after the initialization process was located for 100 hours in a high humidity/high temperature-tank where a relative humidity was 80% and a temperature was 90° C. Then, the medium 25 was investigated by observation using a light microscope whether the delamination occurred between the recording layer and the adjacent dielectric layer, more specifically, between the recording layer 4 and at least one of the first dielectric layer 2 and the second dielectric layer 6. Of course, adhesiveness was high when no peeling occurred; on the other hand, adhesiveness was low when peeling occurred.

The evaluation of overwrite cycle-ability of the information recording medium 25 was based on the number of overwrite cycles as an index. The number of overwrite cycles was determined as described below.

In order to record information to the information recording medium 25, an information recording system having a general constitution was used. The system was provided with a spindle motor for rotating the information recording medium 25, an optical head including a semiconductor laser which can emit a laser beam 12, and an objective lens for condensing the laser beam 12 on the recording layer 4 of the information recording medium 25. On evaluating the information recording medium 25, recording which was equivalent to a capacity of 4.7 GB was conducted by using the semiconductor laser with a wavelength of 660 nm and the objective lens with a numerical aperture of 0.6. A linear velocity of rotation of the information recording medium 25 was set at 8.2 m/second. A time interval analyzer was used for measuring a jitter in order to obtain an average of jitters as mentioned below.

Firstly, in order to determine a measurement condition for obtaining the number of overwrite cycles, a peak power (Pp) and a bias power (Pb) were determined according to a following procedure. Using the system described above, the information recording medium 25 was irradiated with a laser beam 12 while modulating its power between a peak power (mW) in a high power level and a bias power (mW) in a low power level to record a random signal with a mark length of 0.42 μm (3T) to 1.96 μm (14T) ten times on the same groove surface of the recording layer 4 (by groove recording). Then, a jitter between front ends and a jitter between rear ends were measured. A jitter-average was calculated as the mean values of these jitters. Such jitter-average was measured on each recording condition with the bias power being fixed while the peak power was varied by being gradually increased. A power that was 1.3 times as large as a peak power at which the jitter-average for the random signal became 13% was determined as Pp1 temporarily. Next, a jitter-average was measured on each recording condition with the peak power being fixed at Pp1 while the bias power was varied. The mean value of upper and lower limits of bias powers at which the jitter-average for the random signal became 13% or less was determined as Pb. Then, the jitter-average was measured on each recording condition with the bias power being fixed at Pb while the peak power was varied by being gradually increased. A power that was 1.3 times as large as a peak power at which the jitter-average for the random signal became 13% was determined Pp. When the recording was conducted under the condition of thus determined Pp and Pb, 8 to 9% of the average of the jitters was obtained in the case of, for example, 10 times of overwrite. Considering the upper limit of the laser power of the system, it is desirable to satisfy Pp≦14 mW and Pb≦8 mW.

The number of overwrite cycles used as the index of overwrite cycle-ability was determined in this example based on a jitter-average. The information recording medium 25 was irradiated with the laser beam while modulating its power between Pp and Pb thus determined to continuously record a random signal with a mark length of 0.42 μm (3T) to 1.96 μm (14T) in the same groove surface while repeating this predetermined times (by groove recording). After that, jitter-average was measured. The jitter-average was measured when the repetition times, i.e. the number of overwrite cycles, was 1, 2, 3, 5, 10, 100, 200, and 500 times, every 1000 times in a range from 1000 to 10000 times, and every 10000 times in a range from 20000 to 100000 times. The limit of overwrite was defined when the jitter-average became 13%. Overwrite cycle-ability was evaluated based on the number of overwrite cycles at this limit. Of course, the larger number of overwrite cycles is, the higher overwrite cycle-ability is. When an information recording medium is used as an external memory of a computer, the number of overwrite cycles is preferably not less than 100000 times. When an information recording medium is used as a medium for an audio-visual recorder, it is preferably not less than 10000 times.

TABLE 3

| Sample No. | Material of First and Second Dielectric Layers (mol %) | De-lamination | Number of Overwrite Cycles |
|---|---|---|---|
| 1-1 | $(ZnS)_{80}(SiO_2)_{20}$ | No | 1000 |
| 1-2 | $SiO_2$ | Yes | ≧100000 |
| 1-3 | ZnS | No | 1000 |
| 1-4 | $(ZnSe)_{80}(SiO_2)_{20}$ | No | 1000 |
| 1-5 | ZnSe | No | 1000 |
| 1-6 | $(ZnO)_{80}(SiO_2)_{20}$ | No | 1000 |
| 1-7 | ZnO | No | 1000 |
| 1-8 | $Cr_2O_3$ | No | 10000 |
| 1-9 | $(Cr_2O_3)_{50}(SiO_2)_{50}$ | No | 20000 |
| 1-10 | $ZrO_2$ | Yes | ≧100000 |
| 1-11 | $ZrSiO_4$ | Yes | ≧100000 |
| 1-12 | $(ZrO_2)_{80}(SiO_2)_{20}$ | Yes | ≧100000 |
| 1-13 | Ge-Cr-N | No | Not Appreciable* |
| 1-14 | $(Bi_2O_3)_{80}(SiO_2)_{20}$ | Yes | Not Appreciable* |
| 1-15 | $TeO_2$ | Yes | Not Appreciable** |
| 1-16 | $(TeO_2)_{80}(SiO_2)_{20}$ | Yes | Not Appreciable** |
| 1-17 | $HfO_2$ | Yes | ≧100000 |
| 1-18 | $HfSiO_4$ | Yes | ≧100000 |
| 1-19 | $(HfO_2)_{80}(SiO_2)_{20}$ | Yes | ≧100000 |
| Comparative Sample | $(ZnS)_{80}(SiO_2)_{20}$ (Prior Art) | No | ≧100000 |

*Not Writable at Pp ≦ 14 mW
**Not Overwritable

As shown in Table 3, tendency described below can be observed. Of the information recording mediums of Sample Nos. 1-1 to 1-12, as to the information recording mediums without delamination (that is, having a high adhesiveness) (Sample Nos. 1-1 and 1-3 to 1-9), the number of overwrite cycles did not reach 100000 times at all.(That is, overwrite cycle-ability thereof was low.) As to the information recording mediums with delamination occurred (that is, having a low adhesiveness) (Sample Nos. 1-2, 1-10 to 1-12, and 1-17 to 1-19) on the other hand, the number of overwrite cycles exceeded 100000 times. (That is, overwrite cycle-ability thereof was high.)

Moreover, as to the information recording mediums of Sample Nos. 1-13 and 1-14, a sufficient recorded mark could not be formed when the peak power was not larger than 14 mW. Thus, they showed a low recording sensitivity. As the cause for this, it was expected that the thermal conductivity of the material for the dielectric layers in these samples was higher than that of other samples.

Moreover, the overwriting could not be conducted in the information recording mediums of Sample Nos. 1-15 and 1-16. The material constituting the dielectric layers melted and thereby contaminated the recording layer during the recording. The reason for this was considered that the melting point of the material for the dielectric layers in these samples was lower than that of other materials.

On the other hand, with the prior art information recording medium of Comparative Example (which had the interface layers), there was no delamination, and the number of overwrite cycles was not less than 100000 times. That is, both adhesiveness and overwrite cycle-ability were high.

According to the result of the preliminary tests described above, there was no information recording medium satisfying a high adhesiveness and a high overwrite cycle-ability at the same time among the information recording mediums of Sample Nos. 1-1 to 1-19 in which oxide, nitride, selenide, sulfide, or a mixture of one of them and $SiO_2$ was used as the material for the dielectric layers adjacent to the recording layer. However, what was found in this example was that the information recording mediums (Sample Nos. 1-10 to 1-12 and 1-17 to 1-19) in which a material containing $ZrO_2$ or $HfO_2$ was used as the material for the dielectric layers showed an excellent overwrite cycle-ability, and that the information recording mediums (Sample Nos. 1-1 and 1-3 to 1-9) in which a material containing ZnS, ZnO, ZnSe, or $Cr_2O_3$ was used as the material for the dielectric layers showed an excellent adhesiveness to the recording layer. Particularly in the case of the information recording medium (Sample No. 1-8) which a material consisting of $Cr_2O_3$ was used as the material for the dielectric layers, the number of overwrite cycles of 10000 times was obtained with respect to overwrite cycle-ability. Thus, it was expected that a high adhesiveness and a high overwrite cycle-ability could be accomplished at the same time by using a mixture of $Cr_2O_3$ and either or both of $ZrO_2$ and $HfO_2$ as a material for a dielectric layer.

Example 2

In Example 2, for the purpose of accomplishing a high adhesiveness and a high overwrite cycle-ability at the same time, information recording mediums were produced. In these mediums, a mixture of a material with an excellent adhesiveness and a material contributing to an excellent overwrite cycle-ability was used as a material for dielectric layers. More specifically, the mixture of two in any combination selected from the oxide, selenide, and sulfide of Example 1 (see Table 4) was used as the material for the dielectric layers. Also in this example, the information recording medium 25 of which the first dielectric layer and the second dielectric layer were made of a material having the same composition was produced similarly to Example 1 while varying the material for these dielectric layers as shown in Table 4.

The information recording mediums of this example, each had a constitution which was similar to the information recording medium 25 of Example 1 except that the material for the first and the second dielectric layers was made of the material shown in Table 4. The mediums were produced in the same manner as in Example 1 except that the processes for forming the first and the second dielectric layers were changed. In order to produce the information recording mediums of Sample Nos. 2-1 to 2-16, in the processes for forming the first dielectric layer and the second dielectric layer, sputtering targets (a diameter of 100 mm, a thickness of 6 mm) which material had a certain composition shown in Table 4 were respectively used. Additionally, in the processes for forming the first dielectric layer and the second dielectric layer, a power was set at 500 W for Sample Nos. 2-1, 2-2, 2-9 and 2-10, and at 400 W for Sample Nos. 2-3 to 2-8, and 2-11 to 16. A pressure was set at about 0.13 Pa for all samples. A gas to be introduced into a film-forming device was Ar gas (100%) for all samples.

Each of the dielectric layers formed into films by the sputtering method was regarded to have substantially the same composition as the sputtering target used in the sputtering process. Please note that this is applicable to the following examples unless otherwise indicated.

With respect to the information recording mediums of Sample Nos. 2-1 to 2-16 thus obtained, adhesiveness of the dielectric layers and overwrite cycle-ability of the information recording medium were evaluated similarly to Example 1. These results are shown in Table 4. Please note that the information recording mediums of Sample Nos. 2-1, 2-2, 2-9 and 2-10 were in the scope of this invention among the information recording mediums of Sample Nos. 2-1 to 2-16.

TABLE 4-1

| Sample No. | Material of First and Second Dielectric Layers (mol %) | De-lamination | Number of Overwrite Cycles |
|---|---|---|---|
| 2-1 | $(ZrO_2)_{80}(Cr_2O_3)_{20}$ | No | $\geq 100000$ |
| 2-2 | $(ZrO_2)_{50}(Cr_2O_3)_{50}$ | No | $\geq 100000$ |
| 2-3 | $(ZrO_2)_{80}(ZnS)_{20}$ | No | 50000 |
| 2-4 | $(ZrO_2)_{50}(ZnS)_{50}$ | No | 10000 |
| 2-5 | $(ZrO_2)_{80}(ZnO)_{20}$ | No | 30000 |
| 2-6 | $(ZrO_2)_{50}(ZnO)_{50}$ | No | 10000 |
| 2-7 | $(ZrO_2)_{80}(ZnSe)_{20}$ | No | 50000 |
| 2-8 | $(ZrO_2)_{50}(ZnSe)_{50}$ | No | 10000 |
| 2-9 | $(HfO_2)_{80}(Cr_2O_3)_{20}$ | No | $\geq 100000$ |
| 2-10 | $(HfO_2)_{50}(Cr_2O_3)_{50}$ | No | $\geq 100000$ |
| 2-11 | $(HfO_2)_{80}(ZnS)_{20}$ | No | 50000 |
| 2-12 | $(HfO_2)_{50}(ZnS)_{50}$ | No | 10000 |
| 2-13 | $(HfO_2)_{80}(ZnO)_{20}$ | No | 30000 |
| 2-14 | $(HfO_2)_{50}(ZnO)_{50}$ | No | 10000 |
| 2-15 | $(HfO_2)_{80}(ZnSe)_{20}$ | No | 50000 |
| 2-16 | $(HfO_2)_{50}(ZnSe)_{50}$ | No | 10000 |

As shown in Table 4, delamination did not occur in all of the information recording mediums of Sample Nos. 2-1 to 2-16, and therefore adhesiveness was improved. Of these information recording mediums, as to the mediums in which a $ZrO_2$—$Cr_2O_3$-based material and a $HfO_2$—$Cr_2O_3$-based material was used as the material for the dielectric layers (Sample Nos. 2-1, 2-2, 2-9 and 2-10), the number of overwrite cycles was large, and overwrite cycle-ability was very excellent. According to this result, when a layer consisting of a material of mixture of $Cr_2O_3$ and either of $ZrO_2$ and $HfO_2$ (a Zr/Hf—Cr—O-based material layer) was used as the dielectric layers adjacent to the recording layer, a high adhesiveness and a high overwrite cycle-ability were accomplished at the same time in the information recording medium having a constitution which was not provided with a interface layer(s) between the recording layer and the dielectric layer.

In addition, in order to quickly diffuse heat from the recording layer to the reflective layer in a direction along its thickness, it is preferable that the dielectric layer shows a low thermal conductivity. In Example 2, the information recording mediums (Sample Nos. 2-1, 2-2, 2-9 and 2-10) in which a $ZrO_2$—$Cr_2O_3$-based or a $HfO_2$—$Cr_2$—$O_3$-based material was used as the material for the dielectric layer showed a very excellent overwrite cycle-ability. When comparing peak powers (Pp) of these information recording mediums, the higher Pp is, the larger content ratio of $Cr_2O_3$ (an oxide basis) is, since Pp of each information recording medium of Sample Nos. 2-1 and 2-9 was 13 mW and each information recording medium of Sample Nos. 2-2 and 2-10 was 13.5 mW. On the other hand, as to the information recording mediums (Sample Nos. 2-3 to 2-8 and 2-11 to 2-16) in which $ZrO_2$—ZnS, $ZrO_2$—ZnO, $ZrO_2$—ZnSe, $HfO_2$—ZnS, $HfO_2$—ZnO and $HfO_2$—ZnSe-based materials were used as the material for the dielectric layers, though these showed a less overwrite cycle-ability, these showed a high recording sensitivity, since each Pp was within the range of 11 mW to 12 mW. It was expected that the $ZrO_2$—ZnS, $ZrO_2$—ZnO, $ZrO_2$—ZnSe, $HfO_2$—ZnS, $HfO_2$—ZnO and $HfO_2$—ZnSe-based materials had a lower thermal conductivity than that of the $ZrO_2$—$Cr_2O_3$ and $HfO_2$—$Cr_2O_3$-based material. From this result, a high recording sensitivity in addition to a high adhesiveness and a high overwrite cycle-ability can be accomplished at the same time by using a mixture of $ZrO_2$—$Cr_2O_3$-based material and any of $ZrO_2$—ZnS, $ZrO_2$—ZnO and $ZrO_2$—ZnSe-based materials, or a mixture of $HfO_2$—$Cr_2$—$O_3$-based material and any of $HfO_2$—ZnS, $HfO_2$—ZnO and $HfO_2$—ZnSe-based materials as the material for a dielectric layer. Moreover, in order to reduce or restrain a crystal growth of ZnS and ZnSe which are highly crystalline, mixing of these material and $SiO_2$ which is amorphous was also examined.

Example 3

In Example 3, for the purpose of realizing an information recording medium having a high recording sensitivity, information recording mediums were produced. In these mediums, a mixture in which any of $ZrO_2$—ZnS, $ZrO_2$—ZnO and $ZrO_2$—ZnSe-based materials was mixed with a $ZrO_2$—$Cr_2O_3$-based material, or a mixture in which any of $HfO_2$—ZnS, $HfO_2$—ZnO and $HfO_2$—ZnSe-based materials was mixed with a $HfO_2$—$Cr_2O_3$-based material was used as a material for dielectric layers, or a mixture in which amorphous $SiO_2$ is further mixed in order to reduce or restrain a crystal growth of ZnS and ZnSe being high crystalline was used as a material for dielectric layers. Also in this example, the information recording medium 25 of which the first dielectric layer and the second dielectric layer were made of a material having the same composition was produced similarly to Example 1 while varying the material for these dielectric layers as shown in Table 5.

The information recording mediums of this example, similarly to Example 2, each had a constitution which was similar to the information recording medium 25 of Example 1 except that the first and the second dielectric layers were made of the material shown in Table 5. The mediums were produced in the same manner as in Example 2 except that processes for forming the first and the second dielectric layers were changed. In order to produce the information recording mediums of Sample Nos. 3-1 to 3-18, in the processes for forming the first dielectric layer and the second dielectric layer, sputtering targets (a diameter of 100 mm, a thickness of 6 mm) which material had a certain composition shown in Table 5 were respectively used. Additionally, in the processes for forming the first dielectric layer and the second dielectric layer, a power was set at 500 W for Sample Nos. 3-1, 3-2, 3-6, 3-10, 3-11 and 3-15 and at 400 W for Sample Nos. 3-3 to 3-5, 3-7 to 3-9, 3-12 to 3-14, and 3-16 to 3-18. A pressure was set at about 0.13 Pa for all samples. A gas to be introduced into a film-forming device was Ar gas (100%) for all samples.

With respect to the information recording mediums of Sample Nos. 3-1 to 3-18 thus obtained, adhesiveness of the dielectric layers and overwrite cycle-ability of the information recording medium were evaluated similarly to Example 1. These results are shown in Table 5 together with a peak power (Pp) obtained on evaluating overwrite cycle-ability. For the purpose of comparison, the result as to the information recording medium 31 with an existing structure shown in FIG. 10 which was produced in Example 1 is also shown in Table 5. (This result is also shown in Tables 6-1 to 10-1 and 6-2 to 10-2 relating to the following examples.) Please note that all of the information recording mediums of Sample Nos. 3-1 to 3-18 were in the scope of this invention.

TABLE 5

| Sample No. | Material of First and Second Dielectric Layers (mol %) | De-lamination | Number of Overwrite Cycles | Peak Power Pp (mW) |
|---|---|---|---|---|
| 3-1 | $(ZrO_2)_{70}(Cr_2O_3)_{30}$ | No | $\geq 100000$ | 13.2 |
| 3-2 | $(ZrO_2)_{40}(Cr_2O_3)_{30}(SiO_2)_{30}$ | No | $\geq 100000$ | 12.5 |
| 3-3 | $(ZrO_2)_{40}(Cr_2O_3)_{20}(ZnS)_{10}(SiO_2)_{30}$ | No | $\geq 100000$ | 11.5 |
| 3-4 | $(ZrO_2)_{40}(Cr_2O_3)_{20}(ZnSe)_{10}(SiO_2)_{30}$ | No | $\geq 100000$ | 11.8 |
| 3-5 | $(ZrO_2)_{40}(Cr_2O_3)_{20}(ZnO)_{10}(SiO_2)_{30}$ | No | $\geq 100000$ | 12.2 |
| 3-6 | $(ZrSiO_4)_{54}(Cr_2O_3)_{46}$ | No | $\geq 100000$ | 12.0 |
| 3-7 | $(ZrSiO_4)_{54}(Cr_2O_3)_{31}(ZnS)_{15}$ | No | $\geq 100000$ | 11.0 |
| 3-8 | $(ZrSiO_4)_{54}(Cr_2O_3)_{31}(ZnSe)_{15}$ | No | $\geq 100000$ | 11.2 |
| 3-9 | $(ZrSiO_4)_{54}(Cr_2O_3)_{31}(ZnO)_{15}$ | No | $\geq 100000$ | 11.7 |
| 3-10 | $(HfO_2)_{70}(Cr_2O_3)_{30}$ | No | $\geq 100000$ | 13.2 |
| 3-11 | $(HfO_2)_{40}(Cr_2O_3)_{30}(SiO_2)_{30}$ | No | $\geq 100000$ | 12.6 |
| 3-12 | $(HfO_2)_{40}(Cr_2O_3)_{20}(ZnS)_{10}(SiO_2)_{30}$ | No | $\geq 100000$ | 11.6 |
| 3-13 | $(HfO_2)_{40}(Cr_2O_3)_{20}(ZnSe)_{10}(SiO_2)_{30}$ | No | $\geq 100000$ | 11.8 |
| 3-14 | $(HfO_2)_{40}(Cr_2O_3)_{20}(ZnO)_{10}(SiO_2)_{30}$ | No | $\geq 100000$ | 12.3 |
| 3-15 | $(HfSiO_4)_{54}(Cr_2O_3)_{46}$ | No | $\geq 100000$ | 12.1 |
| 3-16 | $(HfSiO_4)_{54}(Cr_2O_3)_{31}(ZnS)_{15}$ | No | $\geq 100000$ | 11.1 |
| 3-17 | $(HfSiO_4)_{54}(Cr_2O_3)_{31}(ZnSe)_{15}$ | No | $\geq 100000$ | 11.2 |
| 3-18 | $(HfSiO_4)_{54}(Cr_2O_3)_{31}(ZnO)_{15}$ | No | $\geq 100000$ | 11.8 |
| Comparative Sample | $(ZnS)_{80}(SiO_2)_{20}$ (Prior Art) | No | $\geq 100000$ | 11.0 |

As shown in Table 5, delamination did not occur and the number of overwrite cycles was not less than 100000 times in the information recording mediums of Sample Nos. 3-1, 3-2, 3-10 and 3-11. As to the information recording medium of Sample No. 3-1 in which a $ZrO_2$—$Cr_2O_3$-based material was used as the material for the dielectric layers, Pp was 13.2 mW. On the other hand, as to the information recording medium of Sample No. 3-2 in which a mixture of a $ZrO_2$—$Cr_2O_3$-based material and $SiO_2$ was used as the material for the dielectric layers, Pp was able to be lowered to 12.5 mW. Similarly, as to Sample No. 3-10 wherein $HfO_2$—$Cr_2O_3$-based material was used, Pp was 13.2 mW, while as to Sample No. 3-11 wherein $HfO_2$—$Cr_2O_3$—$SiO_2$-based material was used, Pp was 12.6 mW. As to the information recording mediums of Sample Nos. 3-3 to 3-5 and 3-12 to 3-14 in which a material obtained by substituting ZnS, ZnSe, or ZnO for a 10 mol % portion of $Cr_2O_3$ contained in the material for the dielectric layers of Sample No. 3-2 was used as the material for the dielectric layers, Pp was able to further lowered. Pp was as low as 11.5 mW in the information recording medium of Sample No. 3-3, and 11.6 mW in the information recording medium of Sample No. 3-12.

Moreover in the information recording mediums of Sample Nos. 3-6 to 3-9, a material for the dielectric layer was a $ZrSiO_4$-based material which contains $ZrO_2$ and $SiO_2$ at a substantially equal ratio. The composition of the material for the dielectric layers was expressed on the basis of an oxide by a unit of mol %. For example, $(ZrO_2)_{35}(Cr_2O_3)_{30}(SiO_2)_{35}$ (mol %) corresponds to $(ZrSiO_4)_{35}(Cr_2O_3)_{30}$ (molar ratio) and is reduced into $(ZrSiO_4)_{54}(Cr_2O_3)_{46}$ (mol %) (a material for the dielectric layers of Sample No. 3-6) with a percentage expression. Also in these information recording mediums of Sample No. 3-6 to 3-9, Pp was as low as 11-12 mW. Especially in the information recording medium of Sample No. 3-7 in which a material obtained by substituting ZnS for a part of $Cr_2O_3$ was used as the material for the dielectric layers, adhesiveness (delamination), overwrite cycle-ability (the number of overwrite cycles), and Pp was substantially equal to those of the prior art information recording medium 31 of Comparative Sample. This is the case as to the information recording mediums of Sample Nos. 3-15 to 3-18 wherein a material for the dielectric layer was a $HfSiO_4$-based material which contains $HfO_2$ and $SiO_2$ at a substantially equal ratio. In the information recording mediums of Sample Nos. 3-1 to 3-18 produced in this example, measured Rc values were in the range of 15% to 17%, and measured Ra values were not larger than 2% (at an unrelieved flat surface thereof).

As described above, when the layer consisting of the $ZrO_2$—$Cr_2O_3$-based material, the $ZrO_2$—$Cr_2O_3$—$SiO_2$-based material, $HfO_2$—$Cr_2O_3$-based material, or the $HfO_2$—$Cr_2O_3$—$SiO_2$-based material (a Zr/Hf—Cr—O-based material layer) or the layer consisting of the mixture material wherein $ZrO_2$—$Cr_2O_3$—$SiO_2$ or $HfO_2$—$Cr_2O_3$—$SiO_2$ was mixed with ZnS, ZnSe or ZnO (a Zr/Hf—Cr—Zn—O-based material layer) was used as dielectric layers adjacent to the recording layer, the performance of the information recording medium 25 of FIG. 1 which did not contain the first and second interface layers (and therefore had a less number of layers in its constitution) was in a level substantially equal to the prior art information recording medium 31 with the first and the second interface layers as shown in FIG. 10.

Please note that the materials for the first and the second dielectric layers had the same composition in this example. However, the compositions of the materials for the first and the second dielectric layers, which are selected from the Zr/Hf—Cr—O-based material and the Zr/Hf—Cr—Zn—O-based material, can be different from each other. Also in such a case, an acceptable performance of a medium as high as this example was obtained.

Example 4

In Example 4, a composition range of $MO_2$—$Cr_2O_3$-based material which was suitable for a dielectric layer was determined. In Example 4-1, a material which contained $ZrO_2$ as $MO_2$ was used, and in Example 4-2, a material which contained $HfO_2$ as $MO_2$ was used.

Example 4-1

In Example 4-1, for the purpose of studying a composition range of a $ZrO_2$—$Cr_2O_3$-based material which was suitable for a dielectric layer, information recording mediums were produced while varying the content ratios (mol %) of $ZrO_2$ and $Cr_2O_3$ in a material for the second dielectric layer as shown in Table 6-1. The information recording mediums of this example each had a constitution similar to the information recording medium 27 described in Embodiment 3 with reference to FIG. 3. In the mediums, the first dielectric layer and the second dielectric layer were made of materials having compositions different from each other, and the first interface layer was provided between the first dielectric layer and a recording layer.

The information recording medium 27 of this example was produced as follows. Firstly, a substrate 1 which was the same as that used in Example 1 was prepared. On this substrate 1, the first dielectric layer 102 of $(ZnS)_{80}(SiO_2)_{20}$ (mol %) with a thickness of 150 nm, the first interface layer 103 of Ge—Cr—N with a thickness of 5 nm, the recording layer 4 of $Ge_{27}Sn_8Sb_{12}Te_{53}$ (atomic %) with a thickness of 9 nm, and the second dielectric layer 6 of a composition shown in Table 6-1 with a thickness of 50 nm, an optical compensation layer 7 of $Ge_{80}Cr_{20}$ (atomic %) with a thickness of 40 nm, a reflective layer 8 of Ag—Pd—Cu with a thickness of 80 nm were formed into films in order by a sputtering method. Each material for the first dielectric layer 102 and the first interface layer 103 was substantially the same as that in the information recording medium 31 described above while referring to FIG. 10.

The information recording medium 27 of this example was produced in the same manner as the information recording medium of Sample No. 1-1 of Example 1 except that a process for forming the first interface layer 103 was added between the process for forming the first dielectric layer 102 and the process for forming the recording layer 4, and that the process for forming the second dielectric layer 6 was changed. The process for forming the first interface layer 103 was conducted in the same manner as the process for forming the first interface layer in the production method of the the prior art information recording medium 31 of Comparative Sample described in Example 1. The process for forming the second dielectric layer 6 was conducted as follows. In order to produce the information recording mediums of Sample Nos. 4-1a to 4-11a, sputtering targets (a diameter of 100 mm, a thickness of 6 mm) which material had a certain composition shown in Table 6-1 were respectively used. For all samples, a gas to be introduced into a film-forming device was Ar gas (100%), a power was set at 500 W, and a pressure was set at about 0.13 Pa. Please note that the process for forming the first dielectric layer 102 was similar to the process for forming the first dielectric layer 2 in the production method of the information recording medium 25 of Sample No. 1-1 described in Example 1, and also similar to the process for forming the first dielectric layer 102 in the production method of the prior art information recording medium 31.

With respect to the information recording mediums 27 of Sample Nos. 4-1a to 4-11a thus obtained, adhesiveness of the dielectric layer and overwrite cycle-ability of the information recording medium were evaluated in almost the same manner as in Example 1. However, in this example, the evaluation of adhesiveness was conducted by investigating whether delamination occurred between the recording layer 4 and the second dielectric layer 6 adjacent to it. The results are shown in Table 6-1 together with a peak power (Pp) obtained on evaluating overwrite cycle-ability. Please note that, of the information recording mediums of Sample Nos. 4-1a to 4-11a, the information recording mediums of Sample Nos. 4-3a to 4-9a were in the scope of this invention.

TABLE 6-1

| Sample No. | Material of Second Dielectric Layer $(ZrO_2)_N(Cr_2O_3)_{100-N}$ (mol %) | De-lamination | Number of Overwrite Cycles | Peak Power Pp (mW) |
|---|---|---|---|---|
| 4-1a | $ZrO_2$ | Yes | $\geq 100000$ | 11.5 |
| 4-2a | $(ZrO_2)_{90}(Cr_2O_3)_{10}$ | Yes | $\geq 100000$ | 11.9 |
| 4-3a | $(ZrO_2)_{80}(Cr_2O_3)_{20}$ | No | $\geq 100000$ | 12.2 |
| 4-4a | $(ZrO_2)_{70}(Cr_2O_3)_{30}$ | No | $\geq 100000$ | 12.5 |
| 4-5a | $(ZrO_2)_{60}(Cr_2O_3)_{40}$ | No | $\geq 100000$ | 12.8 |
| 4-6a | $(ZrO_2)_{50}(Cr_2O_3)_{50}$ | No | $\geq 100000$ | 13.1 |
| 4-7a | $(ZrO_2)_{40}(Cr_2O_3)_{60}$ | No | $\geq 100000$ | 13.4 |
| 4-8a | $(ZrO_2)_{30}(Cr_2O_3)_{70}$ | No | $\geq 100000$ | 13.7 |
| 4-9a | $(ZrO_2)_{20}(Cr_2O_3)_{80}$ | No | $\geq 100000$ | 14.0 |
| 4-10a | $(ZrO_2)_{10}(Cr_2O_3)_{90}$ | No | 70000 | 14.4 |
| 4-11a | $Cr_2O_3$ | No | 20000 | 15.0 |
| Comparative Sample | $(ZnS)_{80}(SiO_2)_{20}$ (Prior Art) | No | $\geq 100000$ | 11.0 |

Example 4-2

In Example 4-2, for the purpose of studying a composition range of a $HfO_2$—$Cr_2O_3$-based material which was suitable for a dielectric layer, information recording mediums were produced while varying the content ratios (mol %) of $HfO_2$ and $Cr_2O_3$ in a material for the second dielectric layer as shown in Table 6-2. The methods for producing and evaluating each sample in Example 4-2 were the same as those in Example 4-1. The results are shown in Table 6-2 together with a peak power (Pp) obtained on evaluating overwrite cycle-ability. Please note that, of the information recording mediums of Sample Nos. 4-1b to 4-11b, the information recording mediums of Sample Nos. 4-3b to 4-9b were in the scope of this invention.

TABLE 6-2

| Sample No. | Material of Second Dielectric Layer $(HfO_2)_N(Cr_2O_3)_{100-N}$ (mol %) | De-lamination | Number of Overwrite Cycles | Peak Power Pp (mW) |
|---|---|---|---|---|
| 4-1b | $HfO_2$ | Yes | $\geq 100000$ | 11.4 |
| 4-2b | $(HfO_2)_{90}(Cr_2O_3)_{10}$ | Yes | $\geq 100000$ | 11.8 |
| 4-3b | $(HfO_2)_{80}(Cr_2O_3)_{20}$ | No | $\geq 100000$ | 12.1 |
| 4-4b | $(HfO_2)_{70}(Cr_2O_3)_{30}$ | No | $\geq 100000$ | 12.4 |
| 4-5b | $(HfO_2)_{60}(Cr_2O_3)_{40}$ | No | $\geq 100000$ | 12.7 |
| 4-6b | $(HfO_2)_{50}(Cr_2O_3)_{50}$ | No | $\geq 100000$ | 13.0 |
| 4-7b | $(HfO_2)_{40}(Cr_2O_3)_{60}$ | No | $\geq 100000$ | 13.3 |
| 4-8b | $(HfO_2)_{30}(Cr_2O_3)_{70}$ | No | $\geq 100000$ | 13.6 |
| 4-9b | $(HfO_2)_{20}(Cr_2O_3)_{80}$ | No | $\geq 100000$ | 13.9 |
| 4-10b | $(HfO_2)_{10}(Cr_2O_3)_{90}$ | No | 70000 | 14.4 |
| 4-11b | $Cr_2O_3$ | No | 20000 | 15.0 |
| Comparative Sample | $(ZnS)_{80}(SiO_2)_{20}$ (Prior Art) | No | $\geq 100000$ | 11.0 |

As shown in Tables 6-1 and 6-2, delamination did not occur in the information recording mediums of Sample Nos. 4-3a to 4-11a and 4-1b to 4-11b in which a material for the second dielectric layer contained $ZrO_2$ or $HfO_2$ at a ratio of 80 mol % or less. Further, in the information recording mediums of Sample Nos. 4-1a to 4-9a in which a material for the second dielectric layer contained $ZrO_2$ at a ratio of 20 mol % or more, the number of overwrite cycles of 100000 times or more was obtained, and $Pp \leq 14.0$ mW. This is the case as to Sample Nos. 4-1b to 4-9b. Therefore, a low peak power, in addition to a high adhesiveness and a high overwrite cycle-ability, was obtained for the information recording mediums of Sample Nos. 4-3a to 4-9a and 4-3b to 4-9b. From the result of this example, it was confirmed that a $MO_2$—$Cr_2O_3$-based material being in a composition range wherein the content of $MO_2$ was from 20 to 80 mol % was preferable as the material for the dielectric layer.

Example 5

In Example 5, a composition range of $MO_2$—$Cr_2O_3$—$SiO_2$-based material which was suitable for a dielectric layer was determined. In Example 5-1, a material which contained $ZrO_2$ as $MO_2$ was used, and in Example 5-2, a material which contained $HfO_2$ as $MO_2$ was used.

Example 5-1

In Example 5-1, for the purpose of studying a composition range of a $ZrO_2$—$Cr_2O_3$—$SiO_2$-based material which was suitable for a dielectric layer, information recording mediums were produced while varying the content ratios (mol %) of $ZrO_2$, $Cr_2O_3$, and $SiO_2$ in a material for the second dielectric layer as shown in Table 7-1. The information recording mediums of this example each had a constitution similar to the information recording medium of Example 4-1. The mediums were produced in the same manner as in Example 4-1 except that sputtering targets of which material had a certain composition shown in Table 7-1 were respectively used in order to produce the information recording mediums of Sample Nos. 5-1a to 5-12a. Considering the result of Example 4, the content ratio of $SiO_2$ was changed in a range so that the content ratio of $ZrO_2$ was not less than 20 mol % and the content ratio of $Cr_2O_3$ was not less than 20 mol %.

With respect to the information recording mediums of Sample Nos. 5-1a to 5-12a thus obtained, adhesiveness of the dielectric layers and overwrite cycle-ability of the information recording medium were evaluated in the same manner as in Example 4. The results are shown in Table 7-1 together with a peak power (Pp) obtained on evaluating overwrite cycle-ability. Please note that, of the information recording mediums of Sample Nos. 5-1a to 5-12a, the information recording mediums of Sample Nos. 5-1a to 5-4a and 5-7a to 5-12a were in the scope of this invention.

TABLE 7-1

| Sample No. | Material of Second Dielectric Layer $(ZrO_2)_X(Cr_2O_3)_Y(SiO_2)_{100-X-Y}$ (mol %) | De-lamination | Number of Overwrite Cycles | Peak Power Pp (mW) |
|---|---|---|---|---|
| 5-1a | $(ZrO_2)_{70}(Cr_2O_3)_{20}(SiO_2)_{10}$ | No | $\geq 100000$ | 12.3 |
| 5-2a | $(ZrO_2)_{60}(Cr_2O_3)_{20}(SiO_2)_{20}$ | No | $\geq 100000$ | 12.2 |
| 5-3a | $(ZrO_2)_{50}(Cr_2O_3)_{20}(SiO_2)_{30}$ | No | $\geq 100000$ | 12.1 |
| 5-4a | $(ZrO_2)_{40}(Cr_2O_3)_{20}(SiO_2)_{40}$ | No | $\geq 100000$ | 12.0 |
| 5-5a | $(ZrO_2)_{30}(Cr_2O_3)_{20}(SiO_2)_{50}$ | Yes | $\geq 100000$ | 11.9 |
| 5-6a | $(ZrO_2)_{20}(Cr_2O_3)_{20}(SiO_2)_{60}$ | Yes | $\geq 100000$ | 11.8 |
| 5-7a | $(ZrO_2)_{50}(Cr_2O_3)_{40}(SiO_2)_{10}$ | No | $\geq 100000$ | 12.9 |
| 5-8a | $(ZrO_2)_{40}(Cr_2O_3)_{40}(SiO_2)_{20}$ | No | $\geq 100000$ | 12.8 |
| 5-9a | $(ZrO_2)_{30}(Cr_2O_3)_{40}(SiO_2)_{30}$ | No | $\geq 100000$ | 12.7 |
| 5-10a | $(ZrO_2)_{20}(Cr_2O_3)_{40}(SiO_2)_{40}$ | No | $\geq 100000$ | 12.6 |
| 5-11a | $(ZrO_2)_{30}(Cr_2O_3)_{60}(SiO_2)_{10}$ | No | $\geq 100000$ | 13.5 |
| 5-12a | $(ZrO_2)_{20}(Cr_2O_3)_{60}(SiO_2)_{20}$ | No | $\geq 100000$ | 13.4 |
| Comparative Sample | $(ZnS)_{80}(SiO_2)_{20}$ (Prior Art) | No | $\geq 100000$ | 11.0 |

Example 5-2

In Example 5-2, for the purpose of studying a composition range of a $HfO_2$—$Cr_2O_3$—$SiO_2$-based material which was suitable for a dielectric layer, information recording mediums were produced while varying the content ratios (mol %) of $HfO_2$, $Cr_2O_3$ and $SiO_2$ in a material for the second dielectric layer as shown in Table 7-2. The methods for producing and evaluating each sample in Example 5-2 were the same as those in Example 5-1. The results are shown in Table 7-2 together with a peak power (Pp) obtained on evaluating overwrite cycle-ability. Please note that, of the information recording mediums of Sample Nos. 5-1b to 5-12b, the information recording mediums of Sample Nos. 5-1b to 5-4b and 5-7b to 5-12b were in the scope of this invention.

power together with a high adhesiveness and a high overwrite cycle-ability was obtained for these samples. From the result of this example, it was confirmed that a $MO_2$—$Cr_2O_3$—$SiO_2$-based material being in a composition range wherein the content of $MO_2$ was from 20 to 70 mol %, the content of $Cr_2O_3$ was from 20 to 60 mol %, and the content of $SiO_2$ was from 10 to 40 mol % was preferable as the material for the dielectric layer.

Example 6

In Example 6, a composition range of $MSiO_4$—$Cr_2O_3$-based material containing $MO_2$ and $SiO_2$ at a substantially equal ratio which was suitable for a dielectric layer was determined. In Example 6-1, a material which contained $ZrSiO_4$ as $MSiO_4$ was used, and in Example 6-2, a material which contained $HfSiO_4$ as $MSiO_4$ was used.

Example 6-1

In Example 6, for the purpose of studying a composition range of a $ZrSiO_4$—$Cr_2O_3$-based material containing $ZrO_2$ and $SiO_2$ at a substantially equal ratio which was suitable for a dielectric layer, information recording mediums were

TABLE 7-2

| Sample No. | Material of Second Dielectric Layer $(HfO_2)_X(Cr_2O_3)_Y(SiO_2)_{100-X-Y}$ (mol %) | De-lamination | Number of Overwrite Cycles | Peak Power Pp (mW) |
|---|---|---|---|---|
| 5-1b | $(HfO_2)_{70}(Cr_2O_3)_{20}(SiO_2)_{10}$ | No | $\geq 100000$ | 12.2 |
| 5-2b | $(HfO_2)_{60}(Cr_2O_3)_{20}(SiO_2)_{20}$ | No | $\geq 100000$ | 12.2 |
| 5-3b | $(HfO_2)_{50}(Cr_2O_3)_{20}(SiO_2)_{30}$ | No | $\geq 100000$ | 12.1 |
| 5-4b | $(HfO_2)_{40}(Cr_2O_3)_{20}(SiO_2)_{40}$ | No | $\geq 100000$ | 12.0 |
| 5-5b | $(HfO_2)_{30}(Cr_2O_3)_{20}(SiO_2)_{50}$ | Yes | $\geq 100000$ | 11.8 |
| 5-6b | $(HfO_2)_{20}(Cr_2O_3)_{20}(SiO_2)_{60}$ | Yes | $\geq 100000$ | 11.7 |
| 5-7b | $(HfO_2)_{50}(Cr_2O_3)_{40}(SiO_2)_{10}$ | No | $\geq 100000$ | 12.9 |
| 5-8b | $(HfO_2)_{40}(Cr_2O_3)_{40}(SiO_2)_{20}$ | No | $\geq 100000$ | 12.8 |
| 5-9b | $(HfO_2)_{30}(Cr_2O_3)_{40}(SiO_2)_{30}$ | No | $\geq 100000$ | 12.6 |
| 5-10b | $(HfO_2)_{20}(Cr_2O_3)_{40}(SiO_2)_{40}$ | No | $\geq 100000$ | 12.6 |
| 5-11b | $(HfO_2)_{30}(Cr_2O_3)_{60}(SiO_2)_{10}$ | No | $\geq 100000$ | 13.6 |
| 5-12b | $(HfO_2)_{20}(Cr_2O_3)_{60}(SiO_2)_{20}$ | No | $\geq 100000$ | 13.4 |
| Comparative Sample | $(ZnS)_{80}(SiO_2)_{20}$ (Prior Art) | No | $\geq 100000$ | 11.0 |

As shown to Tables 7-1 and 7-2, delamination did not occur in the information recording mediums of Sample Nos. 5-1a to 5-4a, 5-7a to 5-12a, 5-1b to 5-4b and 5-7b to 5-12b in which a material for the second dielectric layer contained $SiO_2$ at a ratio of 10 mol % to 40 mol %, and a low peak produced while varying the content ratios (mol %) of $ZrSiO_4$ and $Cr_2O_3$ in a material for the second dielectric layer as shown in Table 8-1. The information recording mediums of this example, similarly to Example 5-1, each had a constitution similar to the information recording medium of Example 4-1. The description of the production method of them is omitted in the specification since it was substantially the same as in the case of Example 5-1. The content ratio of $Cr_2O_3$ was changed in a range so that the content ratios of $ZrO_2$ and $SiO_2$ were not less than 20 mol % and not larger than 50 mol % (in other words, the content ratio of $ZrSiO_4$ was not less than 25 mol % and not larger than 100 mol %).

With reference to Table 8-1, the information recording mediums of Sample Nos. 5-4a, 5-9a and 5-12a were corresponded to the information recording mediums in Example 5-1 described above. As to the materials for the second dielectric layer of the information recording mediums of Sample Nos. 5-4a, 5-9a and 5-12a in Table 7-1, $(ZrO_2)_{40}(Cr_2O_3)_{20}(SiO_2)_{40}$ (mol %) is reduced (or converted) into $(ZrSiO_4)_{67}(Cr_2O_3)_{33}$ (mol %); $(ZrO_2)_{30}(Cr_2O_3)_{40}(SiO_2)_{30}$ (mol %) is reduced into $(ZrSiO_4)_{43}(Cr_2O_3)_{57}$ (mol %); $(ZrO_2)_{20}(Cr_2O_3)_{60}(SiO_2)_{20}$ (mol %) is reduced into $(ZrSiO_4)_{25}(Cr_2O_3)_{75}$ (mol %).

With respect to the information recording mediums of Sample Nos. 5-4a, 5-9a, 5-12a and 6-1a to 6-4a thus obtained, adhesiveness of the dielectric layers and overwrite cycle-ability of the information recording medium were evaluated in the same manner as in Example 4. The results are shown in Table 8-1 with a peak power (Pp) obtained on evaluating overwrite cycle-ability. Please note that, of the information recording mediums of Sample Nos. 5-4a, 5-9a, 5-12a and 6-1a to 6-4a, the information recording mediums of Sample Nos. 5-4a, 5-9a, 5-12a, 6-3a, and 6-4a were in the scope of this invention.

$HfSiO_4$ and $Cr_2O_3$ in a material for the second dielectric layer as shown in Table 8-2. The composition of the material of Sample Nos. 5-4b, 5-9b and 5-12b are converted in Table 8-2 in the same manner as those of Sample Nos. 5-4a, 5-9a and 5-12a. The methods for producing and evaluating each sample in Example 6-2 were the same as those in Example 6-1. The results are shown in Table 8-2 together with a peak power (Pp) obtained on evaluating overwrite cycle-ability. Please note that, of the information recording mediums of Sample Nos. 5-4b, 5-9b, 5-12b and 6-1b to 6-4b, the information recording mediums of Sample Nos. 5-4b, 5-9b, 5-12b, 6-3b, and 6-4b were in the scope of this invention.

TABLE 8-2

| Sample No. | Material of Second Dielectric Layer $(HfSiO_4)_Z(Cr_2O_3)_{100-Z}$ (mol %) | De-lamination | Number of Overwrite Cycles | Peak Power Pp (mW) |
|---|---|---|---|---|
| 6-1b | $HfSiO_4$ | Yes | $\geq 100000$ | 11.3 |
| 6-2b | $(HfSiO_4)_{82}(Cr_2O_3)_{18}$ | Yes | $\geq 100000$ | 11.6 |
| 5-4b | $(HfSiO_4)_{67}(Cr_2O_3)_{33}$ | No | $\geq 100000$ | 12.0 |
| 6-3b | $(HfSiO_4)_{54}(Cr_2O_3)_{46}$ | No | $\geq 100000$ | 12.4 |
| 5-9b | $(HfSiO_4)_{43}(Cr_2O_3)_{57}$ | No | $\geq 100000$ | 12.6 |
| 6-4b | $(HfSiO_4)_{33}(Cr_2O_3)_{67}$ | No | $\geq 100000$ | 13.1 |
| 5-12b | $(HfSiO_4)_{25}(Cr_2O_3)_{75}$ | No | $\geq 100000$ | 13.4 |
| Comparative Sample | $(ZnS)_{80}(SiO_2)_{20}$ (Prior Art) | No | $\geq 100000$ | 11.0 |

TABLE 8-1

| Sample No. | Material of Second Dielectric Layer $(ZrSiO_4)_Z(Cr_2O_3)_{100-Z}$ (mol %) | De-lamination | Number of Overwrite Cycles | Peak Power Pp (mW) |
|---|---|---|---|---|
| 6-1a | $ZrSiO_4$ | Yes | $\geq 100000$ | 11.4 |
| 6-2a | $(ZrSiO_4)_{82}(Cr_2O_3)_{18}$ | Yes | $\geq 100000$ | 11.7 |
| 5-4a | $(ZrSiO_4)_{67}(Cr_2O_3)_{33}$ | No | $\geq 100000$ | 12.0 |
| 6-3a | $(ZrSiO_4)_{54}(Cr_2O_3)_{46}$ | No | $\geq 100000$ | 12.3 |
| 5-9a | $(ZrSiO_4)_{43}(Cr_2O_3)_{57}$ | No | $\geq 100000$ | 12.7 |
| 6-4a | $(ZrSiO_4)_{33}(Cr_2O_3)_{67}$ | No | $\geq 100000$ | 13.0 |
| 5-12a | $(ZrSiO_4)_{25}(Cr_2O_3)_{75}$ | No | $\geq 100000$ | 13.4 |
| Comparative Sample | $(ZnS)_{80}(SiO_2)_{20}$ (Prior Art) | No | $\geq 100000$ | 11.0 |

Example 6-2

In Example 6-2, for the purpose of studying a composition range of a $HfSiO_4$—$Cr_2O_3$-based material containing $HfO_2$ and $SiO_2$ at a substantially equal ratio which was suitable for a dielectric layer, information recording mediums were produced while varying the content ratios (mol %) of As shown in Tables 8-1 and 8-2, delamination did not occur in the information recording mediums except for Sample Nos. 6-1a, 6-2a, 6-1b and 6-2b, and a low peak power together with a high adhesiveness and a high overwrite cycle-ability was obtained for these samples. From the result of this example, it was confirmed that a $MSiO_4$—$Cr_2O_3$-based material being in a composition range wherein the content of $MSiO_4$ was from 25 to 67 mol % was preferable as the material for the dielectric layer.

Example 7

In Example 7, a composition range of $MO_2$—$Cr_2O_3$—ZnS—$SiO_2$-based material which was suitable for a dielectric layer was determined. In Example 7-1, a material which contained $ZrO_2$ as $MO_2$ was used, and in Example 6-2, a material which contained $HfO_2$ as $MO_2$ was used.

Example 7-1

In Example 7-1, for the purpose of studying a composition range of a $ZrO_2$—$Cr_2O_3$—ZnS—$SiO_2$-based material which was suitable for a dielectric layer, information recording mediums were produced while varying the content ratios (mol %) of $ZrO_2$, $Cr_2O_3$, ZnS, and $SiO_2$ in a material for the second dielectric layer as shown in Table 9-1. The information recording mediums of this example, similarly to Example 5-1, each had a constitution similar to the information recording medium of Example 4-1. The production method of them is omitted in the specification since it was substantially the same as in the case of Example 5-1 except that a power was set at 400 W in the process for forming the second dielectric layer. Considering the result of Example 4, the content ratios of ZnS and $SiO_2$ were changed in a range so that the content ratio of $ZrO_2$ was not less than 20 mol % and the content ratio of $Cr_2O_3$ was not less than 20 mol %.

With respect to the information recording mediums of Sample Nos. 7-1a to 7-16a thus obtained, adhesiveness of the dielectric layers and overwrite cycle-ability of the information recording medium were evaluated in the same manner as in Example 4-1. These results are shown in Table 9-1 together with a peak power (Pp) obtained on evaluating overwrite cycle-ability. Please note that, of the information recording mediums of Sample Nos. 7-1a to 7-16a, the information recording mediums of Sample Nos. 7-2a to 7-4a and 7-6a to 7-16a were in the scope of this invention.

TABLE 9-1

| Sample No. | Material of Second Dielectric Layer $(ZrO_2)_C(Cr_2O_3)_E(ZnS)_F(SiO_2)_{100-C-E-F}$ (mol %) | De-lamination | Number of Overwrite Cycles | Peak Power Pp (mW) |
|---|---|---|---|---|
| 7-1a | $(ZrO_2)_{20}(Cr_2O_3)_{20}(ZnS)_{50}(SiO_2)_{10}$ | No | 1000 | 10.2 |
| 7-2a | $(ZrO_2)_{20}(Cr_2O_3)_{20}(ZnS)_{40}(SiO_2)_{20}$ | No | ≧100000 | 10.4 |
| 7-3a | $(ZrO_2)_{20}(Cr_2O_3)_{20}(ZnS)_{30}(SiO_2)_{30}$ | No | ≧100000 | 10.6 |
| 7-4a | $(ZrO_2)_{20}(Cr_2O_3)_{20}(ZnS)_{20}(SiO_2)_{40}$ | No | ≧100000 | 10.8 |
| 7-5a | $(ZrO_2)_{20}(Cr_2O_3)_{20}(ZnS)_{10}(SiO_2)_{50}$ | Yes | ≧100000 | 11.0 |
| 7-6a | $(ZrO_2)_{20}(Cr_2O_3)_{30}(ZnS)_{40}(SiO_2)_{10}$ | No | ≧100000 | 10.7 |
| 7-7a | $(ZrO_2)_{20}(Cr_2O_3)_{30}(ZnS)_{10}(SiO_2)_{40}$ | No | ≧100000 | 11.3 |
| 7-8a | $(ZrO_2)_{20}(Cr_2O_3)_{40}(ZnS)_{30}(SiO_2)_{10}$ | No | ≧100000 | 11.2 |
| 7-9a | $(ZrO_2)_{20}(Cr_2O_3)_{40}(ZnS)_{10}(SiO_2)_{30}$ | No | ≧100000 | 11.6 |
| 7-10a | $(ZrO_2)_{20}(Cr_2O_3)_{50}(ZnS)_{20}(SiO_2)_{10}$ | No | ≧100000 | 11.5 |
| 7-11a | $(ZrO_2)_{20}(Cr_2O_3)_{50}(ZnS)_{10}(SiO_2)_{20}$ | No | ≧100000 | 11.7 |
| 7-12a | $(ZrO_2)_{20}(Cr_2O_3)_{60}(ZnS)_{10}(SiO_2)_{10}$ | No | ≧100000 | 11.9 |
| 7-13a | $(ZrO_2)_{40}(Cr_2O_3)_{20}(ZnS)_{30}(SiO_2)_{10}$ | No | ≧100000 | 10.7 |
| 7-14a | $(ZrO_2)_{40}(Cr_2O_3)_{20}(ZnS)_{10}(SiO_2)_{30}$ | No | ≧100000 | 11.1 |
| 7-15a | $(ZrO_2)_{40}(Cr_2O_3)_{40}(ZnS)_{10}(SiO_2)_{10}$ | No | ≧100000 | 12.0 |
| 7-16a | $(ZrO_2)_{60}(Cr_2O_3)_{20}(ZnS)_{10}(SiO_2)_{10}$ | No | ≧100000 | 11.3 |
| Comparative Sample | $(ZnS)_{80}(SiO_2)_{20}$ (Prior Art) | No | ≧100000 | 11.0 |

Example 7-2

In Example 7-2, for the purpose of studying a composition range of a $HfO_2$—$Cr_2O_3$—ZnS—$SiO_2$-based material which was suitable for a dielectric layer, information recording mediums were produced while varying the content ratios (mol %) of $HfO_2$, $Cr_2O_3$, ZnS, and $SiO_2$ in a material for the second dielectric layer as shown in Table 9-2. The methods for producing and evaluating each sample in Example 7-2 were the same as those in Example 7-1. The results are shown in Table 8-2 together with a peak power (Pp) obtained on evaluating overwrite cycle-ability. Please note that, of the information recording mediums of Sample Nos. 7-1b to 7-16b, the information recording mediums of Sample Nos. 7-2b to 7-4b and 7-6b to 7-16b were in the scope of this invention.

TABLE 9-2

| Sample No. | Material of Second Dielectric Layer $(HfO_2)_C(Cr_2O_3)_E(ZnS)_F(SiO_2)_{100-C-E-F}$ (mol %) | De-lamination | Number of Overwrite Cycles | Peak Power Pp (mW) |
|---|---|---|---|---|
| 7-1b | $(HfO_2)_{20}(Cr_2O_3)_{20}(ZnS)_{50}(SiO_2)_{10}$ | No | 1000 | 10.2 |
| 7-2b | $(HfO_2)_{20}(Cr_2O_3)_{20}(ZnS)_{40}(SiO_2)_{20}$ | No | ≧100000 | 10.4 |

TABLE 9-2-continued

| Sample No. | Material of Second Dielectric Layer $(HfO_2)_C(Cr_2O_3)_E(ZnS)_F(SiO_2)_{100-C-E-F}$ (mol %) | De-lamination | Number of Overwrite Cycles | Peak Power Pp (mW) |
|---|---|---|---|---|
| 7-3b | $(HfO_2)_{20}(Cr_2O_3)_{20}(ZnS)_{30}(SiO_2)_{30}$ | No | $\geq 100000$ | 10.6 |
| 7-4b | $(HfO_2)_{20}(Cr_2O_3)_{20}(ZnS)_{20}(SiO_2)_{40}$ | No | $\geq 100000$ | 10.8 |
| 7-5b | $(HfO_2)_{20}(Cr_2O_3)_{20}(ZnS)_{10}(SiO_2)_{50}$ | Yes | $\geq 100000$ | 11.0 |
| 7-6b | $(HfO_2)_{20}(Cr_2O_3)_{30}(ZnS)_{40}(SiO_2)_{10}$ | No | $\geq 100000$ | 10.7 |
| 7-7b | $(HfO_2)_{20}(Cr_2O_3)_{30}(ZnS)_{10}(SiO_2)_{40}$ | No | $\geq 100000$ | 11.3 |
| 7-8b | $(HfO_2)_{20}(Cr_2O_3)_{40}(ZnS)_{30}(SiO_2)_{10}$ | No | $\geq 100000$ | 11.2 |
| 7-9b | $(HfO_2)_{20}(Cr_2O_3)_{40}(ZnS)_{10}(SiO_2)_{30}$ | No | $\geq 100000$ | 11.6 |
| 7-10b | $(HfO_2)_{20}(Cr_2O_3)_{50}(ZnS)_{20}(SiO_2)_{10}$ | No | $\geq 100000$ | 11.5 |
| 7-11b | $(HfO_2)_{20}(Cr_2O_3)_{50}(ZnS)_{10}(SiO_2)_{20}$ | No | $\geq 100000$ | 11.7 |
| 7-12b | $(HfO_2)_{20}(Cr_2O_3)_{60}(ZnS)_{10}(SiO_2)_{10}$ | No | $\geq 100000$ | 11.9 |
| 7-13b | $(HfO_2)_{40}(Cr_2O_3)_{20}(ZnS)_{30}(SiO_2)_{10}$ | No | $\geq 100000$ | 10.7 |
| 7-14b | $(HfO_2)_{40}(Cr_2O_3)_{20}(ZnS)_{10}(SiO_2)_{30}$ | No | $\geq 100000$ | 11.1 |
| 7-15b | $(HfO_2)_{40}(Cr_2O_3)_{40}(ZnS)_{10}(SiO_2)_{10}$ | No | $\geq 100000$ | 12.0 |
| 7-16b | $(HfO_2)_{60}(Cr_2O_3)_{20}(ZnS)_{10}(SiO_2)_{10}$ | No | $\geq 100000$ | 11.3 |
| Comparative Sample | $(ZnS)_{80}(SiO_2)_{20}$ (Prior Art) | No | $\geq 100000$ | 11.0 |

As shown in Tables 9-1 and 9-2, the number of overwrite cycles was 1000 times as to the information recording mediums of Sample Nos. 7-1a and 7-1b in which a material for the second dielectric layer contained ZnS at a ratio of 50 mol %. Further, delamination occurred in the information recording medium of Sample No. 7-5a and 7-5b in which a material for the second dielectric layer contained $SiO_2$ at a ratio of 50 mol %. Delamination did not occur in the information recording mediums of other samples, and a low peak power together with a high adhesiveness and a high overwrite cycle-ability was obtained for these samples. From the result of this example, it was confirmed that a $MO_2$—$Cr_2O_3$—ZnS—$SiO_2$-based material being in a composition range wherein the content of $MO_2$ was from 20 to 60 mol %, the content of $Cr_2O_3$ was from 20 to 60 mol %, the content of ZnS was from 10 to 40 mol %, and the content of $SiO_2$ was from 10 to 40 mol % was preferable as the material for the dielectric layer.

Example 8

In Example 8, for the purpose of studying a composition range of a $MO_2$—$Cr_2O_3$—ZnSe—$SiO_2$-based material which was suitable for a dielectric layer, information recording mediums were produced while varying the content ratios (mol %) of $MO_2$ (i.e. $ZrO_2$ or $HfO_2$), $Cr_2O_3$, ZnSe, and $SiO_2$ in a material for the second dielectric layer. This material contained ZnSe in place of ZnS in the material studied in Example 7. As a result of evaluation as to the information recording mediums conducted in the same manner as in Example 7, it was confirmed that a $MO_2$—$Cr_2O_3$—ZnSe—$SiO_2$-based material being in a composition range wherein the content of $MO_2$ (i.e. $ZrO_2$ or $HfO_2$) was from 20 to 60 mol %, the content of $Cr_2O_3$ was from 20 to 60 mol %, the content of ZnSe was from 10 to 40 mol %, and the content of $SiO_2$ was from 10 to 40 mol % was preferable as the material for the dielectric layer.

Example 9

In Example 9, for the purpose of studying a composition range of a $MO_2$—$Cr_2O_3$—ZnO—$SiO_2$-based material which was suitable for a dielectric layer, information recording mediums were produced while varying the content ratios (mol %) of $MO_2$ (i.e. $ZrO_2$ or $HfO_2$), $Cr_2O_3$, ZnO, and $SiO_2$ in a material for the second dielectric layer. This material contained ZnO in place of ZnS in the material studied in Example 7. As a result of evaluation as to the information recording mediums conducted in the same manner as in Example 7, it was confirmed that a $MO_2$—$Cr_2O_3$—ZnO—$SiO_2$-based material being in a composition range wherein the content of $MO_2$ (i.e. $ZrO_2$ or $HfO_2$) was from 20 to 60 mol %, the content of $Cr_2O_3$ was from 20 to 60 mol %, the content of ZnO was from 10 to 40 mol %, and the content of $SiO_2$ was from 10 to 40 mol % was preferable as the material for the dielectric layer.

Example 10

In Example 10, for the purpose of studying a composition range of a $MSiO_4$—$Cr_2O_3$—ZnS-based material which was suitable for a dielectric layer was determined. In Example 10-1, a material which contained $ZrSiO_4$ as $MSiO_4$ was used, and in Example 10-2, a material which contained $HfSiO_4$ as $MSiO_4$ was used.

Example 10-1

In Example 10-1, for the purpose of studying a composition range of a $ZrSiO_4$—$Cr_2O_3$—ZnS-based material which was suitable for a dielectric layer, information recording mediums were produced while varying the content ratios (mol %) of $ZrSiO_4$, $Cr_2O_3$, and ZnS in a material for the second dielectric layer as shown in Table 10-1. The information recording mediums of this example, similarly to Example 5-1, each had a constitution similar to the information recording medium of Example 4-1. The production method of them is omitted in the specification since it was substantially the same as in the case of Example 5-1 except that a power was set at 400 W in the process for forming the second dielectric layer. The content ratio of ZnS was changed in a range so that the content ratio of $ZrSiO_4$ was not less than 25 mol % and the content ratio of $Cr_2O_3$ was not less than 25 mol %.

With respect to the information recording mediums of Sample Nos. 8-1a to 8-10a thus obtained, adhesiveness of the dielectric layers and overwrite cycle-ability of the information recording medium were evaluated in the same manner as in Example 4. The results are shown in Table 10-1 together with a peak power (Pp) obtained on evaluating overwrite cycle-ability. Please note that all of the information recording mediums of Sample Nos. 8-1a to 8-10a were in the scope of this invention.

TABLE 10-1

| Sample No. | Material of Second Dielectric Layer $(ZrSiO_4)_A(Cr_2O_3)_B(ZnS)_{100-A-B}$ (mol %) | Delamination | Number of Overwrite Cycles | Peak Power Pp (mW) |
|---|---|---|---|---|
| 8-1a | $(ZrSiO_4)_{25}(Cr_2O_3)_{25}(ZnS)_{50}$ | No | $\geq 100000$ | 10.0 |
| 8-2a | $(ZrSiO_4)_{25}(Cr_2O_3)_{37.5}(ZnS)_{37.5}$ | No | $\geq 100000$ | 10.2 |
| 8-3a | $(ZrSiO_4)_{25}(Cr_2O_3)_{50}(ZnS)_{25}$ | No | $\geq 100000$ | 10.4 |
| 8-4a | $(ZrSiO_4)_{25}(Cr_2O_3)_{62.5}(ZnS)_{12.5}$ | No | $\geq 100000$ | 10.6 |
| 8-5a | $(ZrSiO_4)_{33}(Cr_2O_3)_{27}(ZnS)_{40}$ | No | $\geq 100000$ | 10.1 |
| 8-6a | $(ZrSiO_4)_{33}(Cr_2O_3)_{40}(ZnS)_{27}$ | No | $\geq 100000$ | 10.3 |
| 8-7a | $(ZrSiO_4)_{33.5}(Cr_2O_3)_{53.5}(ZnS)_{13}$ | No | $\geq 100000$ | 10.5 |
| 8-8a | $(ZrSiO_4)_{43}(Cr_2O_3)_{28.5}(ZnS)_{28.5}$ | No | $\geq 100000$ | 10.2 |
| 8-9a | $(ZrSiO_4)_{43}(Cr_2O_3)_{43}(ZnS)_{14}$ | No | $\geq 100000$ | 10.4 |
| 8-10a | $(ZrSiO_4)_{54}(Cr_2O_3)_{31}(ZnS)_{15}$ | No | $\geq 100000$ | 10.6 |
| Comparative Sample | $(ZnS)_{80}(SiO_2)_{20}$ (Prior Art) | No | $\geq 100000$ | 11.0 |

Example 10-2

In Example 10-2, for the purpose of studying a composition range of a $HfSiO_4$—$Cr_2O_3$—ZnS-based material which was suitable for a dielectric layer, information recording mediums were produced while varying the content ratios (mol %) of $HfSiO_4$, $Cr_2O_3$, and ZnS in a material for the second dielectric layer as shown in Table 10-2. The methods for producing and evaluating each sample in Example 10-2 were the same as those in Example 10-1. The results are shown in Table 10-2 together with a peak power (Pp) obtained on evaluating overwrite cycle-ability. Please note that all of the information recording mediums of Sample Nos. 8-1b to 8-10b were in the scope of this invention.

TABLE 10-2

| Sample No. | Material of Second Dielectric Layer $(HfSiO_4)_A(Cr_2O_3)_B(ZnS)_{100-A-B}$ (mol %) | Delamination | Number of Overwrite Cycles | Peak Power Pp (mW) |
|---|---|---|---|---|
| 8-1b | $(HfSiO_4)_{25}(Cr_2O_3)_{25}(ZnS)_{50}$ | No | $\geq 100000$ | 10.1 |
| 8-2b | $(HfSiO_4)_{25}(Cr_2O_3)_{37.5}(ZnS)_{37.5}$ | No | $\geq 100000$ | 10.3 |
| 8-3b | $(HfSiO_4)_{25}(Cr_2O_3)_{50}(ZnS)_{25}$ | No | $\geq 100000$ | 10.5 |
| 8-4b | $(HfSiO_4)_{25}(Cr_2O_3)_{62.5}(ZnS)_{12.5}$ | No | $\geq 100000$ | 10.7 |
| 8-5b | $(HfSiO_4)_{33}(Cr_2O_3)_{27}(ZnS)_{40}$ | No | $\geq 100000$ | 10.2 |
| 8-6b | $(HfSiO_4)_{33}(Cr_2O_3)_{40}(ZnS)_{27}$ | No | $\geq 100000$ | 10.4 |
| 8-7b | $(HfSiO_4)_{33.5}(Cr_2O_3)_{53.5}(ZnS)_{13}$ | No | $\geq 100000$ | 10.6 |
| 8-8b | $(HfSiO_4)_{43}(Cr_2O_3)_{28.5}(ZnS)_{28.5}$ | No | $\geq 100000$ | 10.3 |
| 8-9b | $(HfSiO_4)_{43}(Cr_2O_3)_{43}(ZnS)_{14}$ | No | $\geq 100000$ | 10.5 |
| 8-10b | $(HfSiO_4)_{54}(Cr_2O_3)_{31}(ZnS)_{15}$ | No | $\geq 100000$ | 10.7 |
| Comparative Sample | $(ZnS)_{80}(SiO_2)_{20}$ (Prior Art) | No | $\geq 100000$ | 11.0 |

As shown in Tables 10-1 and 10-2, delamination did not occur in all of the information recording mediums of Sample Nos. 8-1a to 8-10a and 8-1b to 8-1b, and a low peak power together with a high adhesiveness and a high overwrite cycle-ability was obtained for these samples. From the result of this example, it was confirmed that a $MSiO_4$—$Cr_2O_3$—ZnS-based material being in a composition range wherein the content of $MSiO_4$ was from 25 to 54 mol %, the content of $Cr_2O_3$ was from 25 to 63 mol %, the content of ZnS was from 12 to 50 mol % was preferable as the material for the dielectric layer.

Example 11

In Example 11, for the purpose of studying a composition range of a $MSiO_4$—$Cr_2O_3$—ZnSe-based material which was suitable for a dielectric layer, information recording mediums were produced while varying the content ratios (mol %) of $MSiO_4$ (i.e. $ZrSiO_4$ or $HfSiO_4$), $Cr_2O_3$, and ZnSe in a material for the second dielectric layer. This material contained ZnSe in place of ZnS in the material studied in Example 10. As a result of evaluation as to the information recording mediums conducted in the same manner as in Example 10, it was confirmed that a $MSiO_4$—$Cr_2O_3$—ZnSe-based material being in a composition range wherein the content of $MSiO_4$ (i.e. $ZrSiO_4$ or $HfSiO_4$) was from 25 to 54 mol %, the content of $Cr_2O_3$ was from 25 to 63 mol %, and the content of ZnSe was from 12 to 50 mol % was preferable as the material for the dielectric layer.

Example 12

In Example 12, for the purpose of studying a composition range of a $MSiO_4$—$Cr_2O_3$—ZnO-based material which was suitable for a dielectric layer, information recording mediums were produced while varying the content ratios (mol %) of $MSiO_4$ (i.e. $ZrSiO_4$ or $HfSiO_4$), $Cr_2O_3$, and ZnO in a material for the second dielectric layer. This material contained ZnO in place of ZnS in the material studied in Example 10. As a result of evaluation as to the information recording mediums conducted in the same manner as in Example 10, it was confirmed that a $MSiO_4$—$Cr_2O_3$—ZnO-based material being in a composition range where the content of $MSiO_4$ (i.e. $ZrSiO_4$ or $HfSiO_4$) was from 25 to 54 mol %, the content of $Cr_2O_3$ was from 25 to 63 mol %, and the content of ZnO was from 12 to 50 mol % was preferable as the material for the dielectric layer.

Example 13

In Example 13, an information recording medium which had a constitution similar to the information recording medium 26 described in Embodiment 2 with reference to FIG. 2 was produced. In the medium, the first dielectric layer and the second dielectric layer were made of materials having compositions different from each other. In this example, two samples, Sample Nos. 9-1 and 9-2 were produced.

The information recording medium 26 of Sample No. 9-1 was produced as follows. Firstly, a disc-shaped polycarbonate substrate having a diameter of 120 mm and a thickness of 0.6 mm was prepared as a substrate 1. A guide groove was previously provided on one side of the circular polycarbonate substrate with a depth of 56 nm and a track pitch (i.e. a distance between centers of a groove surface 23 and a land surface 24 in a plane parallel to the principal surface of the substrate) of 0.615 $\mu$m.

On this substrate 1, the first dielectric layer 2 of $(ZrSiO_4)_{33}(Cr_2O_3)_{40}(ZnS)_{27}$ (mol %) with a thickness of 150 nm, a recording layer 4 of $Ge_{27}Sn_8Sb_{12}Te_{53}$ (atomic %) with a thickness of 9 nm, a second interface layer 105 of Ge—Cr—N with a thickness of 3 nm, a second dielectric layer 106 of $(ZnS)_{80}(SiO_2)_{20}$ (mol %) with a thickness of 50 nm, an optical compensation layer 7 of $Ge_{80}Cr_{20}$ (atomic %) with a thickness of 40 nm, and a reflective layer 8 of Ag—Pd—Cu with a thickness of 80 nm were formed into films in order by a sputtering method. Each material for the second interface layer 105 and the second dielectric layer 106 was substantially the same as that in the information recording medium 31 described above while referring to FIG. 10.

The information recording medium 26 of Sample No. 9-1 was produced in the same manner as the information recording medium of Sample No. 1-1 of Example 1 except that a process for forming the first dielectric layer 2 was changed, and that a process for forming the second interface layer 105 was added between a process for forming the recording layer 4 and a process for forming the second dielectric layer 106. In the process for forming the first dielectric layer 2, a sputtering target (a diameter of 100 mm, a thickness of 6 mm) which had a composition of $(ZrSiO_4)_{33}(Cr_2O_3)_{40}(ZnS)_{27}$ (mol %) was attached to a film-forming device, and then a high frequency sputtering was carried out with a power of 400 W under a pressure of about 0.13 Pa while introducing Ar gas (100%). The process for forming the second interface layer 105 was conducted in the same manner as the process for forming the second interface layer 105 in the production method of the prior art information recording medium 31 of Comparative Sample described in Example 1. Please note that the process for forming the second dielectric layer 106 was similar to the process for forming the second dielectric layer 6 in the production method of the information recording medium 25 of Sample No. 1-1 described in Example 1, and also similar to the process for forming the second dielectric layer 106 in the production method of the prior art information recording medium 31.

The information recording medium 26 of Sample No. 9-2 was produced in the same manner as Sample No. 9-1 except that the first dielectric layer 2 was formed using a sputtering target which had a composition of $(HfSiO_4)_{33}(Cr_2O_3)_{40}(ZnS)_{27}$ (mol %).

With respect to the information recording medium 26 of Sample Nos. 9-1 and 9-2 thus obtained, adhesiveness of the dielectric layer and overwrite cycle-ability of the information recording medium were evaluated in the same manner as in Example 1. However, such evaluations in this example were different from those in Example 1 in the following points. The evaluation of adhesiveness was conducted by investigating whether delamination occurred between the recording layer 4 and the first dielectric layer 2 adjacent to it. The evaluation of overwrite cycle-ability was conducted by carrying out not only groove recording but also land recording (i.e. land-groove recording) and measuring numbers of overwrite as to each of the groove recording and the land recording. The results are shown in Table 11 together with a peak power (Pp) and a bias power (Pb) obtained on evaluating overwrite cycle-ability. For the purpose of comparison, the result as to the prior art information recording medium shown in FIG. 10 which was produced in Example 1 is also shown in Table 11.

TABLE 11

| Sample No. | De-lamination | Groove Recording | | | Land Recording | | |
| --- | --- | --- | --- | --- | --- | --- | --- |
| | | Number of Overwrite Cycles | Power (mW) | | Number of Overwrite Cycles | Power (mW) | |
| | | | Pp | Pb | | Pp | Pb |
| 9-1 | No | ≧100000 | 10.8 | 4.9 | ≧100000 | 11.1 | 5.0 |
| 9-2 | No | ≧100000 | 10.9 | 4.9 | ≧100000 | 11.2 | 5.1 |
| Comparative Sample | No | ≧100000 | 11.0 | 5.0 | ≧100000 | 11.3 | 5.2 |

As shown in Table 11, adhesiveness, the number of overwrite cycles, a peak power and a bias power of the information recording medium 26 of Sample No. 9-1 in which $(ZrSiO_4)_{33}(Cr_2O_3)_{40}(ZnS)_{27}$ (mol %) was used only as a material for the first dielectric layer 2 and of which total number of layers was six, were in a level substantially equal to the prior art information recording medium 31 of which total number of layers was seven. This is the case as to Sample No. 9-2. The total number of layers is referred to as the number of layers formed on the substrate by a sputtering method (that is, up to the reflective layer 8). Though a layer consisting of a material which had a composition of $(ZrSiO_4)_{33}(Cr_2O_3)_{40}(ZnS)_{27}$ (mol %) or $(HfSiO_4)_{33}(Cr_2O_3)_{40}(ZnS)_{27}$ (mol %) (a Zr/Hf—Cr—Zn—O-based material layer) was used as the first dielectric layer 2 in this example, such compositions are exemplary ones. With respect to a $ZrSiO_4$—$Cr_2O_3$—ZnS-based material and a $HfSiO_4$—$Cr_2O_3$—ZnS-based material, acceptable results were obtained as in this example over the whole composition range as shown in Example 10. Furthermore, a Zr/Hf—Cr—Zn—O-based material layer other than these material or a Zr/Hf—Cr—O-based material layer may be used as the first dielectric layer 2.

Example 14

In Example 14, an information recording medium which had a constitution similar to the information recording medium 28 described in Embodiment 4 with reference to FIG. 4 was produced. In this example, two samples, Sample Nos. 10-1 and 10-2 were produced.

The information recording medium 28 of Sample No. 10-1 was produced as follows. Firstly, a disc-shaped polycarbonate substrate having a diameter of 120 mm and a thickness of 1.1 mm was prepared as a substrate 101. A guide groove was previously provided on one side of the disc-shaped polycarbonate substrate with a depth of 21 nm and a track pitch (i.e. a distance between centers of adjacent groove surfaces 23 in a plane parallel to the principal surface of the substrate) of 0.32 μm.

On this substrate 101, a reflective layer 8 of Ag—Pd—Cu with a thickness of 80 nm, a second dielectric layer 6 of $(ZrSiO_4)_{54}(Cr_2O_3)_{46}$ (mol %) with a thickness of 16 nm, a recording layer 4 of $Ge_{37.5}Sb_{11}Te_{51.5}$ (atomic %) with a thickness of 11 nm, and a first dielectric layer 2 of $(ZrSiO_4)_{54}(Cr_2O_3)_{46}$ (mol %) with a thickness of 68 nm were formed into films in order by a sputtering method.

A process for forming the reflective layer 8 was conducted under a condition similar to that in the production method of the information recording medium of Sample No. 1-1 of Example 1.

In a process for forming the second dielectric layer 6, a sputtering target (a diameter of 100 mm, a thickness of 6 mm) made of a material having a composition of $(ZrSiO_4)_{54}(Cr_2O_3)_{46}$ (mol %) was attached to a film-forming device, and then a high frequency sputtering was carried out with a power of 500 W under a pressure of about 0.13 Pa while introducing Ar gas (100%).

In a process for forming the recording layer 4, a sputtering target (a diameter of 100 mm, a thickness of 6 mm) made of a Ge—Sb—Te-based material was attached to a film-forming device, and then a DC sputtering was carried out with a power of 100 W under a pressure of about 0.13 Pa while introducing a mixed gas of Ar gas (97%) and $N_2$ gas (3%).

A process for forming the first dielectric layer 2 was conducted in the same manner as the process for forming the second interface layer 6 described above except for its thickness. As a result, the first dielectric layer 2 and the second dielectric layer 6 had substantially the same composition.

After the reflective layer 8, the second dielectric layer 6, the recording layer 4, and the first dielectric layer 2 were formed into films in order on the substrate 101 as described above to obtain a multilayered structure, an ultraviolet-curing resin was applied to the first dielectric layer 2. A disc-shaped polycarbonate substrate of a diameter of 120 mm and a thickness of 90 μm as a dummy substrate 110 was stuck on the applied ultraviolet-curing resin. Then, an ultraviolet ray was applied from the dummy substrate 110 side to cure the resin. Thereby, an adhesive layer 9 consisting of the cured resin was formed at a thickness of 10 μm. The dummy substrate 110 was laminated to the multilayered structure with the adhesive layer 9.

After laminating the dummy substrate 10, an initialization process was carried out. In the initialization process, a semiconductor laser with a wavelength of 670 nm was used and the recording layer 4 in substantially whole annular area ranging from 22 to 60 mm in a radial direction of the information recording medium 28 was crystallized. In this manner, the initialization process was completed, the production of information recording medium 28 of Sample No. 10-1 was finished.

The information recording medium 28 of Sample No. 10-2 was produced in the same manner as Sample No. 10-1 except that the first dielectric layer 2 was formed using a sputtering target which had a composition of $(HfSiO_4)_{54}(Cr_2O_3)_{46}$ (mol %).

For the purpose of comparison, an information recording medium of Comparative Example was produced (not shown). This medium had a constitution similar to the information recording medium of this example described above except that the first interface layer 103 and the second interface layer 105 of Ge—Cr—N were provided between the first dielectric layer 2 and the recording layer 4 and between the second dielectric layer 6 and the recording layer 4 respectively, and that the first dielectric layer 102 and the second dielectric layer 106 of $(ZnS)_{80}(SiO_2)_{20}$ (mol %) were provided in place of the first dielectric layer 2 and the second dielectric layer 6. The first interface layer 103 and the second interface layer 105 were each formed at a thickness of 5 nm.

The information recording medium of this Comparative Example was produced in the same manner as the information recording medium of Sample No. 10-1 except that the processes forming the first interface layer 103 and the second interface layer 105 as well as the first dielectric layer 102 and the second dielectric layer 106 were conducted in the same manner as those employed in the production of the prior art information recording medium 31 which was produced as Comparative Example in Example 1.

As to the information recording mediums 28 of Sample Nos. 10-1 and 10-2 and the information recording medium of Comparative Sample thus obtained, adhesiveness of the dielectric layer and overwrite cycle-ability of the information recording medium were evaluated. The results are shown in Table 12 together with a peak power (Pp) obtained on evaluating overwrite cycle-ability.

In this example, adhesiveness of the dielectric layer in the information recording medium 28 was evaluated based on the occurrence of delamination in the same manner as in Example 1. On the other hand, overwrite cycle-ability was evaluated under a condition different from that in the case of Example 1, though it overlapped in the point of using the number of overwrite cycles as an index similarly to Example 1.

On evaluating overwrite cycle-ability of the information recording medium 28, recording which was equivalent to a capacity of 23 GB was conducted by using a semiconductor laser with a wavelength of 405 nm and an objective lens with a numerical aperture of 0.85 in a system as that used in Example 1. A linear velocity of rotation of the information recording medium 28 was set at 5 m/second. A spectrum analyzer was used for measurements of CNR (Carrier-to-Noise Ratio, i.e. a ratio of an amplitude of a signal to a noise) and an erase ratio.

In order to determine a measurement condition for determining the number of overwrite cycles, a peak power (Pp) and a bias power (Pb) were determined according to the following procedure. The information recording medium 28 was irradiated with a laser beam 12 while modulating its power between a peak power (mW) in a high power level and a bias power (mW) in a low power level to record a 2T signal with a mark length of 0.16 μm ten times on the same groove surface of the recording layer 4. CNR was measured after the 2T signal was recorded ten times. Such CNR was measured on each condition with the bias power being fixed at a certain value while the peak power during ten times-recording of the 2T signal was varied. A power that was 1.2 times as large as a minimum peak power at which the amplitude of the signal was saturated was determined as Pp. Next, after the 2T signal was recorded ten times as described above, the recorded signal was reproduced and the amplitude of the 2T signal was measured. Further, a 9T signal was recorded one time on the same groove surface to overwrite it. Then, the recorded signal was reproduced and the amplitude of the 2T signal was measured, and the erase ratio was obtained as a decrement of the 2T signal on the basis of the amplitude measured after ten times-recording. This erase ratio defined as above was obtained on each condition with the peak power being fixed at Pp determined above while the bias power during ten times-recording of the 2T signal and at the time of one time-recording of the 9T signal was varied. The center value of the range of the bias power at which the erase ratio was not less than 25 dB was determined as Pb. As to the information recording medium 28 which has a structure as shown in FIG. 4, it is desirable to satisfy Pp≦6 mW and Pb≦3 mW.

The number of overwrite cycles used as the index of overwrite cycle-ability was determined in this example based on CNR and the erase ratio. The information recording medium 28 was irradiated with the laser beam while modulating its power between Pp and Pb thus determined to continuously record a 2T signal in the same groove surface. After that, CNR was measured and an erase ratio was obtained. The erase ratio was obtained as a decrement of a 2T signal as described above. More specifically, the 2T signal was measured after recording the 2T signal predetermined repetition times and after overwriting the 9T signal on it, and then the erase ratio was obtained as a decrement of the measured amplitude of the 2T signal after overwriting of the 9T signal on the basis of the measured amplitude of the 2T signal after recording of the predetermined repetition times. CNR and the erase ratio were measured when the repetition times, i.e. the number of overwrite cycles, was 1, 2, 3, 5, 10, 100, 200, 500, 1000, 2000, 3000, 5000, 7000, and 10000 times. The limit of overwriting was defined when CNR dropped by 2 dB or when the erase ratio dropped by 5 dB, on the basis of CNR and the erase ratio measured when the number of overwrite cycles was ten. Overwrite cycle-ability was evaluated based on the number of overwrite cycles at this limit. Of course, the larger number of overwrite cycles is, the higher overwrite cycle-ability is. The number of overwrite cycles of the information recording medium 28 is preferably not less than 10000 times.

TABLE 12

| Sample No. | De-lamination | Groove Recording | | |
|---|---|---|---|---|
| | | Number of Overwrite Cycles | Power (mW) | |
| | | | Pp | Pb |
| 10-1 | No | ≧10000 | 5.0 | 2.3 |
| 10-2 | No | ≧10000 | 5.0 | 2.3 |
| Comparative Sample | No | ≧10000 | 5.0 | 2.4 |

The information recording medium 28 of Sample No. 10-1 of this example was different from the information recording medium 25 shown in FIG. 1 in the formation order of each layer on the substrate, the recording conditions (the wavelength of laser beam and the numerical aperture) and the recording capacity. The recording capacity of Sample No. 10-1 was five times larger than that of the information recording medium 25 shown in FIG. 1. However, it was confirmed that, irrespective of these differences, the use of the layer of a composition of $(ZrSiO_4)_{54}(Cr_2O_3)_{46}$ (mol %) (a Zr—Cr—O-based material layer) as the first dielectric layer 2 and the second dielectric layer 6 made it possible to obtain an information recording medium whose performance was good even if the interface layers were not provided. This is the case as to Sample No. 10-2. In the information recording medium 28 of Sample Nos. 10-1 and 10-2 produced in this example, a measured Rc value was 20%, and a measured Ra value was 3% (at an unrelieved flat surface thereof). From Table 12, it was confirmed that the performance of the information recording medium 28 of Sample Nos. 10-1 and 10-2 was in a level substantially equal to the information recording medium of Comparative Sample which contained the first and the second interface layers.

In the information recording mediums 28 of Sample Nos. 10-1 and 10-2 of this example, the layers consisting of the $ZrSiO_4$—$Cr_2O_3$-based material and the $HfSiO_4$—$Cr_2O_3$-based material were used for both of the first and the second dielectric layers. However, a Zr/Hf—Cr—O-based material layer other than these material or a Zr/Hf—Cr—Zn—O-based material layer may be used.

Furthermore, in the information recording medium 28 of this example, a Zr/Hf—Cr—O-based material layer (or Zr/Hf—Cr—Zn—O-based material layer) was used as both of the first and the second dielectric layers. However, this invention is not limited to this. In one variation, a Zr/Hf—Cr—O-based material layer (or a Zr/Hf—Cr—Zn—O-based material layer) may be used as one of the first and the second dielectric layers, and a material having the composition of, for example, $(ZnS)_{80}(SiO_2)_{20}$ (mol %) as described in the prior art may be used for the other dielectric layer, and an interface layer may be provided between the other dielectric layer and the recording layer. Also in such an embodiment, a result similar to that in this example was obtained. Therefore, by using a Zr/Hf—Cr—O-based material layer or a Zr/Hf—Cr—Zn—O-based material layer as a dielectric layer, at least one of, and preferably both of the two interface layers provided between the first and the second dielectric layer and the recording layer in the prior art can be omitted, and a performance equivalent to the information recording medium of Comparative Example can be ensured.

Example 15

In Example 15, an information recording medium which had a constitution similar to the information recording medium 29 described in Embodiment 5 with reference to FIG. 5 was produced. In this example, two samples, Sample Nos. 11-1 and 11-2 were produced.

The information recording medium 29 of Sample No.11-1 was produced as follows. Firstly, a substrate 101 which was the same as that used in Example 14 was prepared. On this substrate 101, a second reflective layer 20 of Ag—Pd—Cu with a thickness of 80 nm, a fifth dielectric layer 19 of $(ZrSiO_4)_{54}(Cr_2O_3)_{46}$ (mol %) with a thickness of 16 nm, a second recording layer 18 of $Ge_{45}Sb_4Te_{51}$ (atomic %) with a thickness of 11 nm, and a fourth dielectric layer 17 of $(ZrSiO_4)_{54}(Cr_2O_3)_{46}$ (mol %) with a thickness of 68 nm were formed into films in order by a sputtering method. Thereby, a second information layer 22 was formed on the substrate 101.

Processes for forming the second reflective layer 20, the fifth dielectric layer 19, and the fourth dielectric layer 17 were conducted under conditions similar to those employed in the process for forming the reflective layer 8, the second dielectric layer 6, and the first dielectric layer 2 in the production method of the information recording medium 28 of Example 14, respectively. A process for forming the second recording layer 18 was conducted under a condition similar to that employed in the process for forming the recording layer 4 in the production method of the information recording medium 28 of Example 14 except that a sputtering target (a diameter of 100 mm, a thickness of 6 mm) which material had a different composition was used.

Next, an intermediate layer 16 was formed according to the following steps. Firstly, an ultraviolet-curing resin was applied to the second information layer 22 by spin coating. A polycarbonate substrate which had on its surface concavities and convexities was placed and stuck on the applied ultraviolet-curing resin with the concavo-convex side in contact with the resin. These concavities and convexities were complementary to the guide groove which was to be formed on the intermediate layer 16. Then, an ultraviolet ray was applied from the polycarbonate substrate side to cure the resin. The polycarbonate substrate was removed from an intermediate layer 16. Thereby, the intermediate layer 16 consisted of the cured resin to which the guide groove was transferred was formed at a thickness of 30 μm.

Next, a first initialization process was conducted. In the first initialization process, a semiconductor laser with a wavelength of 670 nm was used and the second recording layer 18 of the second information layer 22 in a substantially whole annular area ranging from 22 to 60 mm in a radial direction was crystallized.

Next, on the intermediate layer 16 of a multilayered structure thus obtained, a third dielectric layer 15 of $TiO_2$ with a thickness of 15 nm, a first reflective layer 14 of Ag—Pd—Cu with a thickness of 10 nm, the second dielectric layer 6 of $(ZrSiO_4)_{43}(Cr_2O_3)_{57}$ (mol %) with a thickness of 12 nm, a first recording layer 13 of $Ge_{40}Sn_5Sb_4Te_{51}$ (atomic %) with a thickness of 6 nm, and a first dielectric layer 2 of $(ZrSiO_4)_{43}(Cr_2O_3)_{57}$ (mol %) with a thickness of 45 nm were formed into films in order by a sputtering method. Thereby, a first information layer 21 was formed.

In a process for forming the third dielectric layer 15, a sputtering target (a diameter of 100 mm and a thickness of 6 mm) which had a composition of $TiO_2$ was attached to a film-forming device, and then a high frequency sputtering was carried out with a power of 400 W under a pressure of about 0.13 Pa while introducing a mixed gas of Ar gas (97%) and $O_2$ gas (3%).

A process for forming the first reflective layer 14 was conducted in the same manner as the process for forming the second reflective layer 20 described above except for the thickness of the layer.

In a process for forming the second dielectric layer 6, a sputtering target (a diameter of 100 mm and a thickness of 6 mm) which had a composition of $(ZrSiO_4)_{43}(Cr_2O_3)_{57}$ was attached to the film-forming device, and then a high frequency sputtering was carried out with a power of 500 W under a pressure of about 0.13 Pa while introducing Ar gas (100%).

In a process for forming the first recording layer 13, a sputtering target (a diameter of 100 mm and a thickness of 6 mm) made of a Ge—Sn—Sb—Te-based material was attached to the film-forming device, and then a DC sputtering was carried out with a power of 50 W while introducing Ar gas (100%). A pressure during the sputtering was set at about 0.13 Pa.

A process for forming the first dielectric layer 2 was conducted in the same manner as the process for forming the second interface layer 6 described above except for its thickness. As a result, the first dielectric layer 2 and the second dielectric layer 6 had the substantially same composition.

After the layers up to the first dielectric layer 2 were formed into films on the substrate 101 as described above to obtain a multilayered structure, an ultraviolet-curing resin was applied to the first dielectric layer 2. A disc-shaped polycarbonate substrate of a diameter of 120 mm and a thickness of 65 μm as a dummy substrate 110 was stuck on the applied ultraviolet-curing resin. Then, an ultraviolet ray was applied from the dummy substrate 110 side to cure the resin. Thereby, an adhesive layer 9 consisting of the cured resin with a thickness of 10 μm, while the dummy substrate 110 was laminated to the multilayered structure with the adhesive layer 9.

After laminating the dummy substrate 110, an second initialization process was carried out. In the second initialization process, a semiconductor laser with a wavelength of 670 nm was used and the first recording layer 13 of the first information layer 21 in a substantially whole annular area ranging from 22 to 60 mm in a radial direction was crystallized. Thereby, the information recording medium 29 of Sample No. 11-1 was produced.

The information recording medium 29 of Sample No. 11-2 was produced in the same manner as Sample No. 11-1 except that the fifth and the fourth dielectric layers 19 and 17 were formed using a sputtering target which had a composition of $(HfSiO_4)_{54}(Cr_2O_3)_{46}$ (mol %) and the second and the first dielectric layers 6 and 2 were formed using a sputtering target which had a composition of $(HfSiO_4)_{43}(Cr_2O_3)_{57}$ (mol %).

With respect to the information recording medium 29 of Sample Nos. 11-1 and 11-2 thus obtained, adhesiveness of the dielectric layers and overwrite cycle-ability of the information recording medium were evaluated for each of the first information layer 21 and the second information layer 22. The results are shown in Table 13 together with a peak power (Pp) and a bias power (Pb) obtained on evaluating overwrite cycle-ability.

In this example, the evaluation of adhesiveness of the dielectric layers of the information recording medium 29 was conducted under a condition similar to that employed in Example 1. However, it was different from that in Example 1 in that the investigation of delamination was carried out with respect to both of the first information layer 21 and the second information layer 22. Moreover, the evaluation of overwrite cycle-ability of the information recording medium 29 was conducted under a condition similar to that employed in Example 14. However, it was different from that in Example 14 in that recording which was equivalent to a capacity of 23 GB was conducted in each of the first information layer 21 and the second information layer 22, and that the number of overwrite cycles was obtained with respect to both of the first information layer 21 and the second information layer 22. A laser beam 12 was focused on the first recording layer 13 when recording on the first information layer 21, and on the second recording layer 18 when recording on the second information layer 22. Considering the upper limit of the laser power of the system, it is desirable to satisfy Pp≦12 mW and Pb≦6 mW as to the first information layer 21.

TABLE 13

| Sample No. | First Information Layer | | | Second Information Layer | | |
|---|---|---|---|---|---|---|
| | De-lamination | Number of Overwrite Cycles | Peak Power Pp (mW) | De-lamination | Number of Overwrite Cycles | Peak Power Pp (mW) |
| 11-1 | No | $\geq 10000$ | 11.0 | No | $\geq 10000$ | 11.0 |
| 11-2 | No | $\geq 10000$ | 10.2 | No | $\geq 10000$ | 10.0 |

The information recording medium 29 of Sample No. 11-1 of this example was different from the information recording medium 25 shown in FIG. 1 in the formation order of each layer on the substrate, the number of the information layers (that is, the number of the recording layers), the recording conditions (the wavelength of laser beam and the numerical aperture). The number of the information layers of Sample No. 11-1 was two while that of the information recording medium 25 was one. Further, the recording capacity of Sample No. 11-1 is ten times larger than that of the information recording medium 25 shown in FIG. 1. However, irrespective of these differences, it was confirmed that, even if the interface layer was not formed, the use of the layer of a $ZrSiO_4$—$Cr_2O_3$-based material as the fist, second, fourth and fifth layers 2, 6, 17 and 19 made it possible to obtain an information recording medium whose performance was good. This is the case as to Sample No. 11-2. In the information recording medium 29 of Sample Nos. 11-1 and 11-2 produced in this example, a designed Rc value was 6%, and a designed Ra value was 0.7% for the first information layer 21 (at an unrelieved flat surface thereof). Further, a designed Rc value was 25%, and a designed Ra value was 3% for the second information layer 22.

In the information recording mediums 29 of Sample Nos. 11-1 and 11-2 of this example, the layers consisting of the $ZrSiO_4$—$Cr_2O_3$-based material and the $HfSiO_4$—$Cr_2O_3$-based material were used for all of the first dielectric layer 2, the second dielectric layer 6, the fourth dielectric layer 17, and the fifth dielectric layer 19. However, a Zr/Hf—Cr—O-based material layer other than this (e.g. a layer consisting of a $ZrO_2$—$Cr_2O_3$—$SiO_2$, $ZrO_2$—$Cr_2O_3$ $HfO_2$—$Cr_2O_3$—$SiO_2$, $HfO_2$—$Cr_2O_3$ $ZrO_2$—$HfO_2$—$Cr_2O_3$—$SiO_2$, or $ZrO_2$—$HfO_2$—$Cr_2O_3$-based material) or a Zr/Hf—Cr—Zn—O-based material layer (e.g. a layer consisting of a material obtained by mixing ZnS, ZnSe or ZnO with one of $ZrO_2$—$Cr_2O_3$—$SiO_2$, $HfO_2$—$Cr_2O_3$—$SiO_2$, and $ZrO_2$—$HfO_2$—$Cr_2O_3$—$SiO_2$-based materials) may be used as a dielectric layer(s). Also in such case, an acceptable performance was obtained.

Furthermore, in the information recording medium 29 of this example, a Zr/Hf—Cr—O-based material layer (or Zr/Hf—Cr—Zn—O-based material layer) was used as all of the first dielectric layer 2, the second dielectric layer 6, the fourth dielectric layer 17, and the fifth dielectric layer 19. However, this invention is not limited to this. In a variation, a Zr/Hf—Cr—O-based material layer (or a Zr/Hf—Cr—Zn—O-based material layer) can be used as at least one of these layers, and a material having the composition of, for example, $(ZnS)_{80}(SiO_2)_{20}$ (mol %) as in the prior art can be used for the remaining dielectric layers, and an interface layer can be provided between the remaining dielectric layers and the recording layer. Also in such case, a result similar to that in this example was obtained.

Moreover, in the information recording medium 29 of this example, the layer consisting of $TiO_2$ was used as the third dielectric layer 15. Alternatively, a layer consisting of $(ZrO_2)_{30}(Cr_2O_3)_{70}$ or $(HfO_2)_{30}(Cr_2O_3)_{70}$ can be used in place of it. Also in such case, the performance of first information layer 21 is similar to that of samples of this example.

Furthermore, in each sample of this example, two kinds of $MSiO_4$—$Cr_2O_3$-based materials were used, one constituting the first and the second dielectric layers 2 and 6 and the other constituting the fourth and the fifth dielectric layers 17 and 19. The present invention is not limited to this embodiment. Each material for these four layers may be the same or may be different from each other. Also in such case, a performance as high as this example was obtained.

Example 16

In Example 16, an information recording medium which had a constitution similar to the information recording medium 30 described in Embodiment 6 with reference to FIG. 6 was produced. A Zr/Hf—Cr—O-based material layer was used for the first interface layer 3 and the second interface layer 5 in the information recording medium 30 of this example, unlike the information recording medium of Examples 1-15 described above. In this example, two samples, Sample Nos. 12-1 and 12-2 were produced.

The information recording medium 30 of Sample No. 12-1 was produced as follows. Firstly, a substrate 1 which was the same as that used in Example 1 was prepared. On this substrate 1, a first dielectric layer 102 of $(ZnS)_{80}(SiO_2)_{20}$ (mol %) with a thickness of 150 nm, a first interface layer 3 of $(ZrSiO_4)_{43}(Cr_2O_3)_{57}$ (mol %) with a thickness of 5 nm, a recording layer 4 of $Ge_{27}Sn_8Sb_{12}Te_{53}$ (atomic %) with a thickness of 9 nm, a second interface layer 5 of $(ZrSiO_4)_{43}(Cr_2O_3)_{57}$ (mol %) with a thickness of 5 nm, a second dielectric layer 106 of $(ZnS)_{80}(SiO_2)_{20}$ (mol %) with a thickness of 50 nm, an optical compensation layer 7 of $Ge_{80}Cr_{20}$ (atomic %) with a thickness of 40 nm, and a reflective layer 8 of Ag—Pd—Cu with a thickness of 80 nm were formed into films in order by a sputtering method. Each material for the first dielectric layer 102 and the second dielectric layer 106 was substantially the same as that in the information recording medium 31 described above while referring to FIG. 10.

This information recording medium 30 had the same constitution as that of the prior art information recording medium 31 which was produced in Example 1 (see FIG. 10), and was produced in the same manner as this except that the first interface layer 3 and the second interface layer 5 were formed according to the following steps. In the processes for forming the first interface layer 3 and the second interface layer 5, a sputtering target (a diameter of 100 mm, a thickness of 6 mm) which material had a composition of $(ZrSiO_4)_{43}(Cr_2O_3)_{57}$ (mol %) was attached to a film-forming device, and then a high frequency sputtering was carried out with a power of 500 W under a pressure of about 0.13 Pa while introducing Ar gas (100%).

The information recording medium 30 of Sample No. 12-2 was produced in the same manner as Sample No. 12-1 except that the first and second interface layers 3 and 5 were formed using a sputtering target which had a composition of $(HfSiO_4)_{43}(Cr_2O_3)_{57}$ (mol %)

With respect to the information recording medium 30 of Sample Nos. 12-1 and 12-2 thus obtained, adhesiveness of the dielectric layer and overwrite cycle-ability of the information recording medium were evaluated in the same manner in Example 1. However, in this example, the evaluation of adhesiveness was conducted by investigating whether delamination occurred between the recording layer 4 and the adjacent interface layer, more specifically, between the recording layer 4 and at least one of the first interface layer 3 and the second interface layer 5. The evaluation of overwrite cycle-ability was conducted by carrying out not only groove recording but also land recording (i.e. land-groove recording) and measuring numbers of overwrite as to each of the groove recording and the land recording. The results are shown in Table 14. For the purpose of comparison, the result as to the prior art information recording medium 31 shown in FIG. 10 which was produced in Example 1 is also shown in Table 14.

TABLE 14

| Sample No. | De-lamination | Groove Recording | | | Land Recording | | |
|---|---|---|---|---|---|---|---|
| | | Number of Overwrite Cycles | Power (mW) Pp | Pb | Number of Overwrite Cycles | Power (mW) Pp | Pb |
| 12-1 | No | ≧100000 | 10.5 | 4.7 | ≧100000 | 11.0 | 4.9 |
| 12-2 | No | ≧100000 | 10.6 | 4.8 | ≧100000 | 10.9 | 4.8 |
| Comparative Sample | No | ≧100000 | 11.0 | 5.0 | ≧100000 | 11.3 | 5.2 |

As shown in Table 14, in the information recording medium 30 of Sample No. 12-1 of this example in which a material of $(ZrSiO_4)_{43}(Cr_2O_3)_{57}$ (mol %) was used for the interface layers, the performance thereof was in a level substantially equal to the prior art information recording medium 31 of Comparative Sample. This is the case as to Sample No. 12-2.

In this example, a Zr/Hf—Cr—O-based material layer was used as the interface layer. The number of layers of the information recording medium was the same as that of the prior art and was not reduced. However, such interface layer consisting of a Zr/Hf—Cr—O-based material can be formed by a sputtering in the atmosphere of Ar gas, without the need of a reactive sputtering which was required for forming an interface layer of, for example, Ge—Cr—N in the prior art. According to this example, therefore, the variations in composition and in thickness of the interface layer become smaller than of the interface layer of Ge—Cr—N in the prior art. Thus, the readiness and the stability of production can be improved.

In the information recording mediums 30 of Sample Nos. 12-1 and 12-2 of this example, the layer of which material had the composition of $(ZrSiO_4)_{43}(Cr_2O_3)_{57}$ (mol %) or $(HfSiO_4)_{43}(Cr_2O_3)_{57}$ (mol %) (a Zr/Hf—Cr—O-based material layer) was used for both of the first interface layer 3 and the second interface layer 5. However, such compositions are exemplary. A Zr/Hf—Cr—O-based material layer other than this or a Zr/Hf—Cr—Zn—O-based material layer can be used. Additionally, the first interface layer 3 and the second interface layer 5 can be layers having compositions different from each other which are selected from the Zr/Hf—Cr—O-based material and the Zr/Hf—Cr—Zn—O-based material.

Example 17

In Example 17, an information recording medium (Sample No. 13-1) which had a constitution similar to the information recording medium 27 described in Embodiment 3 with reference to FIG. 3 and the second dielectric layer 6 of a Zr—Hf—Cr—O-based material layer, was produced.

The information recording medium 27 of this example was produced as follows. Firstly, a substrate 1 which was the same as that used in Example 1 was prepared. On this substrate 1, a first dielectric layer 102 of $(ZnS)_{80}(SiO_2)_{20}$ (mol %) with a thickness of 150 nm, a first interface layer 103 of $(ZrO_2)_{25}(Cr_2O_3)_{50}(SiO_2)_{25}$ (mol %) with a thickness of 5 nm, the recording layer 4 of $Ge_{27}Sn_8Sb_{12}Te_{53}$ (atomic %) with a thickness of 9 nm, and a second dielectric layer 6 of $(HfO_2)_{30}(ZrO_2)_{10}(Cr_2O_3)_{30}(SiO_2)_{30}$ (mol %) with a thickness of 50 nm, an optical compensation layer 7 of $Ge_{80}Cr_{20}$ (atomic %) with a thickness of 40 nm, a reflective layer 8 of Ag—Pd—Cu with a thickness of 80 nm were formed into films in order by a sputtering method.

The information recording medium 27 of this example was produced in the same manner as the information recording medium of Sample No. 1-1 of Example 1 except that a process for forming the first interface layer 103 was added between the process for forming the first dielectric layer 102 and the process for forming the recording layer 4, and that the process for forming the second dielectric layer 6 was changed. In a process for forming the first interface layer 103, a sputtering target (a diameter of 100 mm, a thickness of 6 mm) which material had a composition of $(ZrO_2)_{25}(Cr_2O_3)_{50}(SiO_2)_{25}$ (mol %) was attached to a film-forming device, and then a high frequency sputtering was carried out with a power of 500 W under a pressure of about 0.13 Pa while introducing Ar gas (100%). In a process for forming the second dielectric layer 6, a sputtering target (a diameter of 100 mm, a thickness of 6 mm) which material had a composition of $(HfO_2)_{30}(ZrO_2)_{10}(Cr_2O_3)_{30}(SiO_2)_{30}$ (mol %) was attached to the film-forming device, and then a a high frequency sputtering was carried out with a power of 500 W under a pressure of about 0.13 Pa while introducing Ar gas (100%). Processes for forming other layers, a process for laminating a dummy substrate 10 and an initialization process were conducted in the same manner as those in Example 1.

With respect to the information recording medium 27 of Sample No. 13-1 thus obtained, adhesiveness of the dielectric layer and overwrite cycle-ability of the information recording medium were evaluated in almost the same manner as in Example 1. However, in this example, the evaluation of adhesiveness was conducted by investigating whether delamination occurred between the recording layer 4 and the second dielectric layer 6 adjacent to it. Further, The evaluation of overwrite cycle-ability was conducted by carrying out not only groove recording but also land recording (i.e. land-groove recording) and measuring numbers of overwrite as to each of the groove recording and the land recording. The results are shown in Table 15 together with a peak power (Pp) and a bias power (Pb) obtained on evaluating overwrite cycle-ability. For the purpose of comparison, the result as to the information prior art recording medium shown in FIG. 10 which was produced in Example 1 is also shown in Table 15.

TABLE 15

| Sample No. | De-lamination | Groove Recording | | | Land Recording | | |
|---|---|---|---|---|---|---|---|
| | | Number of Overwrite Cycles | Power (mW) Pp | Pb | Number of Overwrite Cycles | Power (mW) Pp | Pb |
| 13-1 | No | ≧100000 | 11.1 | 5.1 | ≧100000 | 11.3 | 5.3 |
| Comparative Sample | No | ≧100000 | 11.0 | 5.0 | ≧100000 | 11.3 | 5.2 |

As shown in Table 15, the performance of the information recording medium 27 of Sample No. 13-1 of this example wherein $(HfO_2)_{30}(ZrO_2)_{10}(Cr_2O_3)_{30}(SiO_2)_{30}$ (mol %) was used as a material for the second dielectric layer 6 was substantially equal to that of the information recording medium 31 of Comparative Sample which had a prior art constitution.

In this example, as a Zr—Hf—Cr—O-based material layer, $(HfO_2)_{30}(ZrO_2)_{10}(Cr_2O_3)_{30}(SiO_2)_{30}$ (mol %) ($Hf_{8.3}Zr_{2.8}Cr_{16.7}Si_{8.3}O_{63.9}$ (atomic %)) was used. This composition is an example. It was found that, by using a Zr—Hf—Cr—O-based material layer in which the mixing total ratio of $HfO_2$ and $ZrO_2$ was in the range of 20 mol % to 70 mol %, the mixing ratio of $Cr_2O_3$ was in the range of 20 mol % to 60 mol %, and the mixing ratio of $SiO_2$ was in the range of 10 mol % to 40 mol %, good results were obtained like this example. Further, it was found that as to the information recording medium wherein a Zr—Hf—Cr—O-based material containing Si in which the total content of Zr and Hf was 30 atomic % or less, the content of Cr was in the range of 7 atomic % to 37 atomic %, the content of Si was 14 atomic % or less, and the content of O was in the range of 40 atomic % to 80 atomic % was used, good results were obtained like this example.

These results means that Zr and Hf are interchangeable and that the content of Zr and the content of Hf may be any one respectively as long as the total content of Zr and Hf is 30 atomic % or less. Therefore, for example, in one Zr—Hf—Cr—O-based material, the content of Zr may be 29 mol %, while the content of Hf may be 1 mol %. Further, although the Zr/Hf—Cr—O-based materials each of which includes either of Zr and Hf were used in Examples 2 to 16, of course, a Zr/Hf—Cr—O-based material wherein both of Zr and Hf are contained may be used similarly.

Example 18

In the above Examples 1-17, the information recording mediums on which information was recorded by optical means were produced. In Example 18, an information recording medium 207 shown in FIG. 8 on which information was recorded by electric means was produced. This information recording medium is what is called a memory.

The information recording medium 207 of this example was produced as follows. Firstly, a Si substrate 201 having a length of 5 mm, a width of 5 mm, and a thickness of 1 mm of which surface was subjected to a nitriding treatment was prepared. On this substrate 201, a lower electrode 202 of Au with a thickness of 0.1 μm was formed in an area of 1.0 mm×1.0 mm. On the lower electrode 202, a phase-change part 205 of $Ge_{38}Sb_{10}Te_{52}$ (which is expressed as $Ge_8Sb_2Te_{11}$ as a compound) with a thickness of 0.1 μm was formed in a circular area of a diameter of 0.2 mm, and a thermal insulating part 206 of $(ZrO_2)_{56}(Cr_2O_3)_{30}(SiO_2)_{14}$ (mol %) with the same thickness as the phase-change part 205 was formed in an area of 0.6 mm×0.6 mm (excluding the phase-change part 205). Further, an upper electrode 204 of Au with a thickness of 0.1 μm was formed in the area of 0.6 mm×0.6 mm. The lower electrode 202, the phase-change part 205, and the insulating part 206 were formed by a sputtering method respectively.

In a process for forming the phase-change part 205, a sputtering target (a diameter of 100 mm, a thickness of 6 mm) made of a Ge—Sb—Te-based material was attached to a film-forming device, and then a DC sputtering was carried out with a power of 100 W while introducing Ar gas (100%). A pressure during the sputtering was set at about 0.13 Pa. In a process for forming the thermal insulating part 206, a sputtering target (a diameter of 100 mm, a thickness of 6 mm) which material had a composition of $(ZrO_2)_{56}(Cr_2O_3)_{30}(SiO_2)_{14}$ was attached to the film-forming device, and then a high frequency sputtering was carried out with a power of 500 W under a pressure of about 0.13 Pa while introducing Ar gas (100%). Each sputtering in these processes was conducted while covering an area excluding the surface on which a film was to be formed with a mask so that the phase change part 205 and the insulating part 206 did not overlap each other. The formation order of the phase-change part 205 and the thermal insulating part 206 is not limited to a particular one, and either may be formed earlier.

The phase-change part 205 and the thermal insulating part 206 constituted a recording part 203. The phase-change part 205 corresponded to a recording layer according to this invention. The thermal insulating part 206 corresponded to a Zr/Hf—Cr—O-based material layer according to this invention.

The detailed description of processes for forming the lower electrode 202 and the upper electrode 204 is omitted since these electrode were formed by a sputtering method which is generally employed in the technical field of electrode formation.

Phase change occurred in the phase-change part 205 by applying an electric energy to the information recording medium 207 of this example thus produced. This was confirmed by means of a system shown in FIG. 9. The cross sectional view of the information recording medium 207 shown in FIG. 9 is the cross section of the information recording medium 207 taken along a line A-B in a direction of its thickness shown in FIG. 8.

Figure 9:
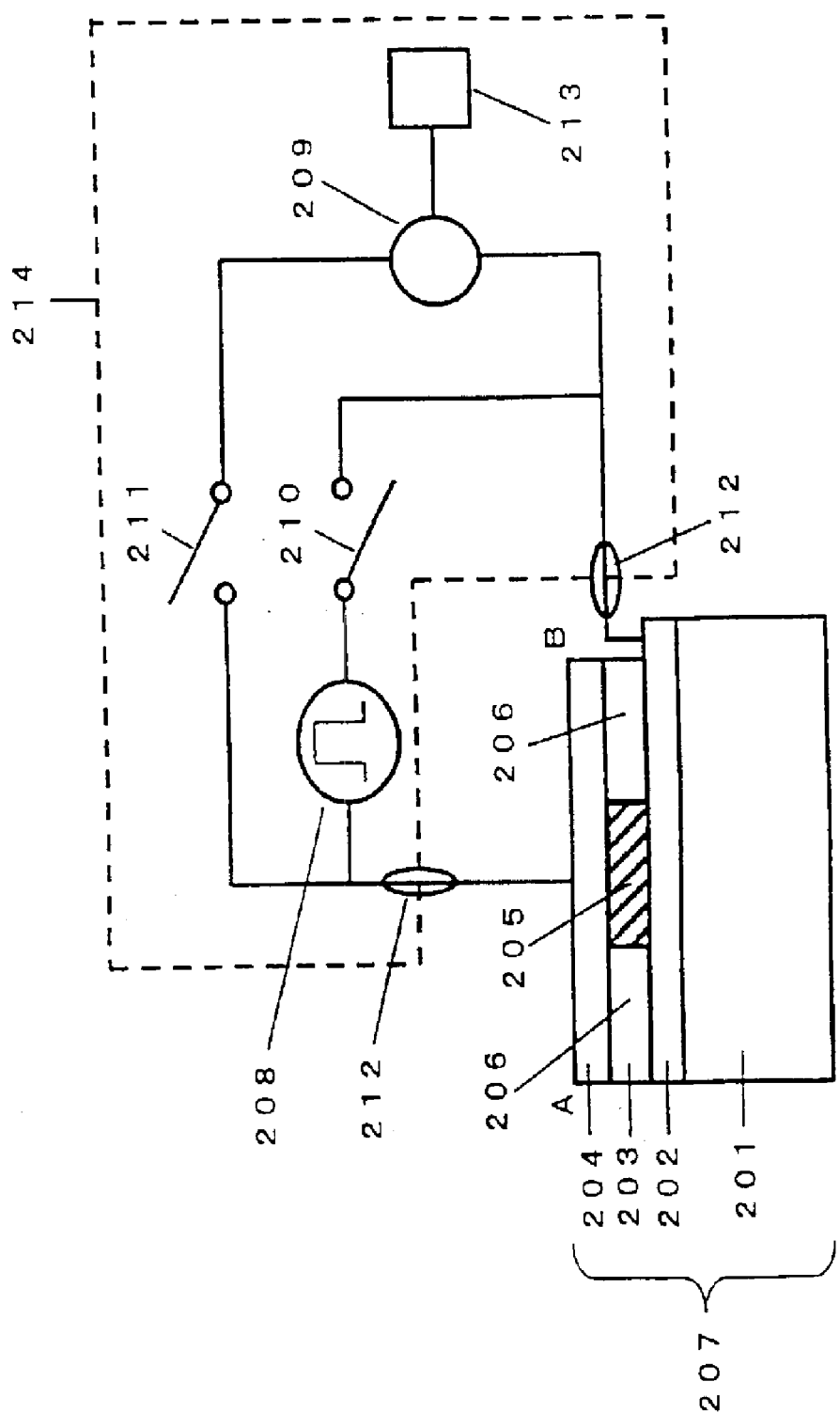
FIG. 9 is a schematic view which shows an example of a system for the information recording medium shown in FIG. 8.

As shown in FIG. 9, more specifically, two parts 212 for application were bonded to the lower electrode 202 and the upper electrode 204 respectively with a lead wire of Au. Thus, an electrically recording/reproducing device 214 was connected to the information recording medium (memory) 207 through these application parts 212. Between the application parts 212 which were respectively connected to the lower electrode 202 and the upper electrode 204 in the electrically recording/reproducing device 214, a pulse producing part 208 was connected through a switch 210, and a resistance measuring device 209 was also connected through a switch 211. The resistance measuring device 209 was connected to a judgment part 213 which judges whether a resistance value measured by the resistance measuring device 209 was high or low. A current pulse was flowed between the upper electrode 204 and the lower electrode 202 via the application parts 212 by means of the pulse producing part 208, while a resistance value between the lower electrode 202 and the upper electrode 204 was measured by the resistance measuring device 209. Thus measured resistance value was judged by the judgment part 213 whether it was high or low. Such resistance value generally changes because of the phase change of the phase-change part 205. Therefore, the state of a phase of the phase-change part 205 was able to be known based on the result of this judgment.

In the case of this example, the melting point of the phase-change part 205 was 630° C., the crystallization temperature thereof was 170° C., and the crystallization time thereof was 130 ns. The resistance value between the lower electrode 202 and the upper electrode 204 was 1000 Ω when the phase-change part 205 was in the state of amorphous phase, and was 20 Ω when it was in the state of crystalline phase. A current pulse of 20 mA and 150 ns was applied between the upper electrodes 204 and the lower electrode 202 when the phase-change part 205 was in the state of amorphous phase (i.e. in the level of high resistance). As a result, the resistance value between the lower electrode 202 and the upper electrode 204 dropped and the phase-change part 205 changed into the state of crystalline phase from the state of amorphous phase. Further, a current pulse of 200 mA and 100 ns was applied between the upper electrodes 204 and the lower electrode 202 when the phase-change part 205 was in the state of crystalline phase (i.e. in the level of low resistance). As a result, the resistance value between the lower electrode 202 and the upper electrode 204 rose and the phase-change part 205 changed into the state of amorphous phase from the state of crystalline phase.

From the result described above, it was confirmed that a phase change occurred in the phase-change part (a recording layer) by using the layer made of a material having a composition of $(ZrO_2)_{56}(Cr_2O_3)_{30}(SiO_2)_{14}$ as the thermal insulating part 206 around the phase-change part 205 and by applying an electric energy to it. Therefore, it was also confirmed that the information recording medium 207 had a function of recording an information.

In the case where the thermal insulating part 206 of $(ZrO_2)_{56}(Cr_2O_3)_{30}(SiO_2)_{14}$ which is a dielectric is provided for the periphery of the phase-change part 205 in a cylindrical shape as in this example, it effectively prevents a current, which flows into the phase-change part 205 by applying a voltage between the upper electrode 204 and the lower electrode 202, from escaping to the periphery of the phase-change part 205. As a result, a temperature of the phase-change part 205 can be efficiently raised by the Joule heat generated by the current. Particularly, in order to change the phase-change part 205 into the state of amorphous phase, a process of melting the phase-change part 205 of $Ge_{38}Sb_{10}Te_{52}$ followed by quenching it is required. By providing the thermal insulating part 206 around the phase-change part 205, the phase-change part melting can be occurred with a smaller current.

A material of $(ZrO_2)_{56}(Cr_2O_3)_{30}(SiO_2)_{14}$ for the thermal insulating part 206 has a high melting point. Moreover, an atomic diffusion caused by heat hardly takes place in this material. Thus, the material is applicable to an electric memory such as the information recording medium 207. Additionally, in the case where the thermal insulating part 206 is located along the periphery of the phase-change part 205, the thermal insulating part 206 serves to substantially isolate the phase-change part 205 electrically and thermally in the plane of the recording part 203. By utilizing this and providing a plurality of phase-change parts 205 in the information recording medium 207 so that the phase-change parts 205 are isolated from each other by the thermal insulating part 206, the memory capacity of the information recording medium 207 can be made larger and accessing function and/or switching function can be improved. In addition, a plurality of information recording mediums 207 themselves can also be connected to each other. Further, a memory which has the same characteristics, function and performance of this example can be obtained by the thermal insulating part 206 from a material with a composition of $(HfO_2)_{56}(Cr_2O_3)_{30}(SiO_2)_{14}$.

An information recording medium of this invention has been demonstrated through various examples thereinbefore. One or more layers selected from Zr/Hf—Cr—O-based material layers and Zr/Hf—Cr—Zn—O-based material layers can be used for both an information recording medium recorded with optical means and an information recording medium recorded with electric means. According to an information recording medium which includes such a layer (s), a constitution which has not been realized can be realized, and/or higher performance is obtained compared with the prior art information recording medium.

What is claimed is:

1. An information recording medium comprising:
   a substrate;
   a recording layer wherein a phase change between a crystal phase and an amorphous phase is generated by irradiation of light or application of an electric energy; and
   a Zr/Hf—Cr—O-based material layer comprising at least one of Zr and Hf, Cr, and O wherein the total content of Zr and Hf is 30 atomic % or less and the content of Cr is in the range of 7 atomic % to 37 atomic %.

2. The information recording medium according to claim 1, wherein the Zr/Hf—Cr—O-based material layer consists essentially of a material expressed with a formula:

$$M_Q Cr_R O_{100-Q-R} \text{(atomic \%)}$$

wherein M represents at least one element selected from Zr and Hf, and Q and R are respectively within the range of $0<Q\leq30$, and $7\leq R\leq37$, and satisfy $20\leq Q+R\leq60$.

3. The information recording medium according to claim 1, wherein the Zr/Hf—Cr—O-based material layer further contains Si and consists essentially of a material expressed with a formula:

$$M_U Cr_V Si_T O_{100-U-V-T} \text{(atomic \%)}$$

wherein M represents at least one element selected from Zr and Hf, U, V, and T are respectively in the range of $0<U\leq30$, $7\leq V\leq37$, and $0<T\leq14$, and satisfy $20\leq U+V+T\leq60$.

4. The information recording medium according to claim 1, wherein the Zr/Hf—Cr—O-based material layer consists essentially of a material expressed with a formula:

$$(MO_2)_N(Cr_2O_3)_{100-N} \text{(mol \%)}$$

wherein M represents at least one element selected from Zr and Hf, and N is in the range of $20 \leq N \leq 80$.

5. The information recording medium according to claim 2, wherein the Zr/Hf—Cr—O-based material containing Si consists essentially of a material expressed with a formula:

$$(MO_2)_X(Cr_2O_3)_Y(SiO_2)_{100-X-Y} \text{(mol \%)}$$

wherein M represents at least one element selected from Zr and Hf, and X and Y are respectively within the range of $20 \leq X \leq 70$, and $20 \leq Y \leq 60$, and satisfy $60 \leq X+Y \leq 90$.

6. The information recording medium according to claim 5, wherein the material expressed with the formula contains $MO_2$ and $SiO_2$ at a substantially equal ratio and is expressed with a formula:

$$(MSiO_4)_Z(Cr_2O_3)_{100-Z} \text{(mol \%)}$$

wherein M represents at least one element selected from Zr and Hf, and Z is within the range of $25 \leq Z \leq 67$.

7. An information recording medium comprising:
a substrate;
a recording layer wherein a phase change between a crystal phase and an amorphous phase is generated by irradiation of light or application of an electric energy; and
a layer which consists essentially of a Zr/Hf—Cr—Zn—O-based material expressed with a formula:

$$(MO_2)_C(Cr_2O_3)_E(D)_F(SiO_2)_{100-C-E-F} \text{(mol \%)}$$

wherein M represents at least one element selected from Zr and Hf, D is ZnS, ZnSe or ZnO, and C, E and F are respectively in the range of $20 \leq C \leq 60$, $20 \leq E \leq 60$, and $10 \leq F \leq 40$, and satisfy $60 \leq C+E+F \leq 90$.

8. The information recording medium according to claim 7, wherein the material expressed with the formula contains $MO_2$ and $SiO_2$ at a substantially equal ratio and is expressed with a formula:

$$(MSiO_4)_A(Cr_2O_3)_B(D)_{100-A-B} \text{(mol \%)}$$

wherein M represents at least one element selected from Zr and Hf, D is ZnS, ZnSe or ZnO, and A and B are respectively in the range of $25 \leq A \leq 54$, and $25 \leq B \leq 63$, and satisfy $50 \leq A+B \leq 88$.

9. The information recording medium according to claim 1, wherein the phase change is generated reversibly in the recording layer.

10. The information recording medium according to claim 7, wherein the phase change is generated reversibly in the recording layer.

11. The information recording medium according to claim 9, wherein the recording layer comprises a material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te.

12. The information recording medium according to claim 10, wherein the recording layer comprises a material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te.

13. The information recording medium according to claim 9, wherein the thickness of the recording layer is 15 nm or less.

14. The information recording medium according to claim 10, wherein the thickness of the recording layer is 15 nm or less.

15. The information recording medium according to claim 1, wherein two or more recording layers are provided.

16. The information recording medium according to claim 7, wherein two or more recording layers are provided.

17. The information recording medium according to claim 1, wherein a first dielectric layer, the recording layer, a second dielectric layer, and a reflective layer are formed in this order on one surface of the substrate, and at least one of the first dielectric layer and the second dielectric layer is the Zr/Hf—Cr—O-based material layer which contacts the recording layer.

18. The information recording medium according to claim 7, wherein a first dielectric layer, the recording layer, a second dielectric layer, and a reflective layer are formed in this order on one surface of the substrate, and at least one of the first dielectric layer and the second dielectric layer is the layer consisting essentially of the Zr/Hf—Cr—Zn—O-based material expressed with the formula which contacts with the recording layer.

19. The information recording medium according to claim 1, wherein a reflective layer, a second dielectric layer, the recording layer and a first dielectric layer are formed in this order on one surface of the substrate, and at least one of the first dielectric layer and the second dielectric layer is the Zr/Hf—Cr—O-based material layer which contacts the recording layer.

20. The information recording medium according to claim 7, wherein a reflective layer, a second dielectric layer, the recording layer and a first dielectric layer are formed in this order on one surface of the substrate, and at least one of the first dielectric layer and the second dielectric layer is the layer consisting essentially of the Zr/Hf—Cr—Zn—O-based material expressed with the formula which contacts the recording layer.

21. A method for producing an information recording medium which comprises a substrate, a recording layer, and a Zr/Hf—Cr—O-based material layer comprising at least one of Zr and Hf, Cr, and O wherein the total content of Zr and Hf is 30 atomic % or less and the content of Cr is in the range of 7 atomic % to 37 atomic %, the method comprising a process of forming the Zr/Hf—Cr—O-based material layer by a sputtering method.

22. The method according to claim 21, wherein a sputtering target consisting essentially of a material expressed with a formula:

$$M_J Cr_K O_{100-J-K} \text{(atomic \%)}$$

wherein M represents at least one element selected from Zr and Hf, and J and K are respectively within the range of $3 \leq J \leq 24$, and $11 \leq K \leq 36$, and satisfy $34 \leq J+K \leq 40$, is used in the process of forming the Zr/Hf—Cr—O-based material layer by the sputtering method.

23. The method according to claim 21, wherein a sputtering target consisting essentially of a material expressed with a formula:

$$M_G Cr_H Si_L O_{100-G-H-L} \text{(atomic \%)}$$

wherein M represents at least one element selected from Zr and Hf, and G, H, and L are respectively within the range of $4 \leq G \leq 21$, $11 \leq H \leq 30$, and $2 \leq L \leq 12$, and satisfy $34 \leq G+H+L \leq 40$, is used to form a Zr/Hf—Cr—O-based material layer containing Si in the process of forming the Zr/Hf—Cr—O-based material layer by the sputtering method.

24. The method according to claim 21, wherein a sputtering target consisting essentially of a material expressed with a formula:

$$(MO_2)_n(Cr_2O_3)_{100-n}(\text{mol }\%)$$

wherein M represents at least one element selected from Zr and Hf, and n is within the range of $20 \leq n \leq 80$, is used in the process of forming the Zr/Hf—Cr—O-based material layer by the sputtering method.

25. The method according to claim 21, wherein a sputtering target consisting essentially of a material expressed with the formula:

$$(MO_2)_x(Cr_2O_3)_y(SiO_2)_{100-x-y}(\text{mol }\%)$$

wherein M represents at least one element selected from Zr and Hf, and x and y are respectively within the range of $20 \leq x \leq 70$, and $20 \leq y \leq 60$, and satisfy $60 \leq x+y \leq 90$, is used to form a Zr/Hf—Cr—O-based material layer containing Si in the process of forming the Zr/Hf—Cr—O-based material layer by the sputtering method.

26. The method according to claim 25, wherein the material expressed with the formula contains $MO_2$ and $SiO_2$ at a substantially equal ratio and is expressed with a formula:

$$(MSiO_4)_z(Cr_2O_3)_{100-z}(\text{mol }\%)$$

wherein M represents at least one element selected from Zr and Hf, and z is within the range of $25 \leq z \leq 67$.

27. A method for producing an information recording medium which comprises a substrate, a recording layer, and a layer consisting essentially of a Zr/Hf—Cr—Zn—O-based material, the method comprising a process of forming the layer consisting essentially of the Zr/Hf—Cr—Zn—O-based material by a sputtering method using a sputtering target consisting essentially of a material expressed with a formula:

$$(MO_2)_c(Cr_2O_3)_e(D)_f(SiO_2)_{100-c-e-f}(\text{mol }\%)$$

wherein, M represents at least one element selected from Zr and Hf, D is ZnS, ZnSe, or ZnO, and c, e, and f are respectively within the range of $20 \leq c \leq 60$, $20 \leq e \leq 60$, and $10 \leq f \leq 40$, and satisfy $60 \leq c+e+f \leq 90$.

28. The method according to claim 27, wherein the material expressed with the formula contains $MO_2$ and $SiO_2$ at a substantially equal ratio and is expressed with a formula:

$$(MSiO_4)_a(Cr_2O_3)_b(D)_{100-a-b}(\text{mol }\%)$$

wherein M represents at least one element selected from Zr and Hf, D is ZnS, ZnSe, or ZnO, and a and b are respectively within the range of $25 \leq a \leq 54$ and $25 \leq b \leq 63$, and satisfy $50 \leq a+b \leq 88$.

* * * * *

UNITED STATES PATENT AND TRADEMARK OFFICE
CERTIFICATE OF CORRECTION

PATENT NO.    : 6,858,278 B2
DATED         : February 22, 2005
INVENTOR(S)   : Rie Kojima et al.

It is certified that error appears in the above-identified patent and that said Letters Patent is hereby corrected as shown below:

Title page,
Item [56], References Cited, OTHER PUBLICATIONS, please replace:
"Data WPI, Section Ch, Week 199112, Derwent Publications Ltd., London, GB; AN 1991-083936 XP002235835 & JP 03 030133 A, February 8, 1991, *abstract*." with
-- Data WPI, Section Ch, Week 199112, Derwent Publications Ltd., London, GB; Class A12, AN 1991-083936 XP002235835 & JP 03 030133 A, February 8, 1991, *abstract*. --; please delete second occurrence;
please replace "Database WPI, Section Ch, Week 198745, Derwent Publications Ltd., London GB; AN 1987-316032 XP002235836 & JP 62 222454 A, Sep. 30, 1987, *abstract*." with -- Database WPI, Section Ch, Week 198745, Derwent Publications Ltd., London GB; Class A12, AN 1987-316032 XP002235836 & JP 62 222454 A, Sep. 30, 1987, *abstract*. --.

Column 37,
Table 1-2, Line 2, please replace "$(HfO_2)_n(Cr_2O_3)_{100-n}(mol\ \%)$" with -- $(HfO_2)_n(Cr_2O_3)_{100-n}(mol\ \%)$ --.

Column 55,
Table 7-1, Line 2, please replace "$(ZrO_2)_x(Cr_2O_3)_y(SiO_2)_{100-X-Y}$" with -- $(ZrO_2)_X(Cr_2O_3)_Y(SiO_2)_{100-X-Y}$ --.

Signed and Sealed this

Sixteenth Day of August, 2005

JON W. DUDAS
*Director of the United States Patent and Trademark Office*